United States Patent
Yoshii et al.

(10) Patent No.: US 11,650,497 B2
(45) Date of Patent: May 16, 2023

(54) RESIST COMPOSITION AND METHOD OF FORMING RESIST PATTERN

(71) Applicant: TOKYO OHKA KOGYO CO., LTD., Kawasaki (JP)

(72) Inventors: Yasuhiro Yoshii, Kawasaki (JP); Yoichi Hori, Kawasaki (JP)

(73) Assignee: TOKYO OHKA KOGYO CO., LTD., Kawasaki (JP)

(*) Notice: Subject to any disclaimer, the term of this patent is extended or adjusted under 35 U.S.C. 154(b) by 134 days.

(21) Appl. No.: 16/682,431

(22) Filed: Nov. 13, 2019

(65) Prior Publication Data

US 2020/0166837 A1    May 28, 2020

(30) Foreign Application Priority Data

Nov. 22, 2018 (JP) .............................. JP2018-219733

(51) Int. Cl.
| | | |
|---|---|---|
| *G03F 7/004* | (2006.01) | |
| *G03F 7/039* | (2006.01) | |
| *G03F 7/038* | (2006.01) | |
| *G03F 7/16* | (2006.01) | |
| *G03F 7/40* | (2006.01) | |
| *G03F 7/20* | (2006.01) | |
| *G03F 7/32* | (2006.01) | |
| *G03F 7/38* | (2006.01) | |

(52) U.S. Cl.
CPC .......... *G03F 7/0045* (2013.01); *G03F 7/0382* (2013.01); *G03F 7/0392* (2013.01); *G03F 7/162* (2013.01); *G03F 7/168* (2013.01); *G03F 7/2037* (2013.01); *G03F 7/322* (2013.01); *G03F 7/38* (2013.01); *G03F 7/40* (2013.01)

(58) Field of Classification Search
CPC .... G03F 7/0045; G03F 7/0382; G03F 7/0392; G03F 7/162; G03F 7/168; G03F 7/2037; G03F 7/322; G03F 7/38; G03F 7/40; G03F 7/004; G03F 7/0046; G03F 7/038; G03F 7/039; G03F 7/0397; G03F 7/2059; C07C 381/12; C07C 309/06; C07C 65/10; C07C 309/12; C07C 309/19; C07C 2603/74; C07C 2602/42; H01L 21/0274; C08F 216/10
See application file for complete search history.

(56) References Cited

U.S. PATENT DOCUMENTS

| | | | |
|---|---|---|---|
| 2012/0015299 A1 | 1/2012 | Komuro et al. | |
| 2012/0214101 A1 | 8/2012 | Shimizu et al. | |
| 2015/0072274 A1 | 3/2015 | Tsuchimura et al. | |
| 2016/0376233 A1* | 12/2016 | Yamazaki | C08F 216/10 |
| | | | 430/270.1 |

FOREIGN PATENT DOCUMENTS

| | | | |
|---|---|---|---|
| JP | 2008-273912 A | | 11/2008 |
| JP | 2012-037864 A | | 2/2012 |
| JP | 2012-173419 A | | 9/2012 |
| JP | 2014-002359 A | | 1/2014 |
| JP | 2017111206 A | * | 6/2017 |
| WO | WO 2017/130932 A1 | | 8/2017 |

OTHER PUBLICATIONS

English Translation of JP 2017-111206 A; Masahiro Shiozaki; Published: Jun. 22, 2017 (Year: 2017).*
Office Action issued in Japanese Patent Application No. 2018-219733, dated Jun. 28, 2022.

* cited by examiner

*Primary Examiner* — Duane Smith
*Assistant Examiner* — Richard David Champion
(74) *Attorney, Agent, or Firm* — Knobbe, Martens, Olson & Bear, LLP

(57) ABSTRACT

A resist composition which generates an acid upon exposure and whose solubility in a developing solution is changed due to an action of the acid, the resist composition including a base material component whose solubility in a developing solution is changed due to the action of an acid, an acid generator component which generates an acid upon exposure, and an organic acid which contains at least one carboxy group, in which the acid generator component contains a compound represented by formula (b1) in which $R^{2011}$ to $R^{2031}$ represent an aryl group, an alkyl group, or an alkenyl group. $R^{2011}$ to $R^{2031}$ have a total of four or more substituents containing fluorine atoms, $X^{n-}$ represent an n-valent anion, and n represents an integer of 1 or greater.

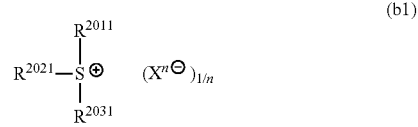

5 Claims, No Drawings

RESIST COMPOSITION AND METHOD OF FORMING RESIST PATTERN

BACKGROUND OF THE INVENTION

Field of the Invention

The present invention relates to a resist composition and a method of forming a resist pattern.

Priority is claimed on Japanese Patent Application No. 2018-219733, filed on Nov. 22, 2018, the content of which is incorporated herein by reference.

Description of Related Art

In lithography techniques, for example, a resist film formed of a resist material is formed on a substrate, and the resist film is subjected to selective exposure, followed by a development treatment, thereby forming a resist pattern having a predetermined shape on the resist film. A resist material in which the exposed portions of the resist film become soluble in a developing solution is called a positive type, and a resist material in which the exposed portions of the resist film become insoluble in a developing solution is called a negative type.

In recent years, in the production of semiconductor elements and liquid crystal display elements, advances in lithography techniques have led to rapid progress in the field of pattern miniaturization. Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are used in mass production of semiconductor elements. Furthermore, research is also being conducted into lithography techniques that use an exposure light source having a wavelength shorter (energy higher) than these excimer lasers, such as electron beams (EB), extreme ultraviolet radiation (EUV), and X rays.

Resist materials for use with these types of exposure light sources require lithography characteristics such as a high resolution capable of reproducing patterns of minute dimensions, and a high level of sensitivity to these types of exposure light sources.

As a resist material that satisfies these requirements, in the related art, a base material component whose solubility in a developing solution is changed due to an action of an acid and a chemically amplified resist composition which contains an acid generator component that generates an acid upon exposure and has been used.

For example, in a case where the developing solution is an alkali developing solution (alkali developing process), as a positive type chemically amplified resist composition, a composition which contains a base material component (base resin) whose solubility in an alkali developing solution is increased due to an action of an acid and an acid generator component has been typically used. In a case where a resist film formed using such a resist composition is selectively exposed at the time of forming a resist pattern, in exposed portions, an acid is generated from the acid generator component, and the polarity of the base resin increases by the action of the generated acid, thereby making the exposed portions of the resist film soluble in the alkali developing solution. Accordingly, by conducting alkali development, a positive type pattern in which the unexposed portions of the resist film remain as a pattern is formed.

Meanwhile, in a case where such a chemically amplified resist composition is applied to a solvent developing process using a developing solution containing an organic solvent (organic developing solution) and the polarity of the base resin increases, the solubility of the exposed portions in an organic developing solution is relatively decreased. As a result, the unexposed portions of the resist film are dissolved and removed by the organic developing solution, and a negative type resist pattern in which the exposed portions of the resist film remain as a pattern is formed. Such a solvent developing process for forming a negative type resist pattern is also referred to as a "negative type developing process"

A base resin to be used in a chemically amplified resist composition typically has a plurality of constitutional units for improving lithography characteristics.

For example, in a case of a resin component whose solubility in an alkali developing solution is increased due to an action of an acid, a constitutional unit containing an acid decomposable group which is decomposed due to the action of an acid generated from an acid generator or the like so that the polarity is increased is used. In addition, a constitutional unit containing a lactone-containing cyclic group, a constitutional unit containing a polar group such as a hydroxyl group, and the like are used in combination.

Further, in formation of a resist pattern, the behavior of an acid generated from an acid generator component upon exposure is regarded as a factor that greatly affects the lithography characteristics.

As the acid generator to be used in the chemically amplified resist composition, various acid generators have been suggested so far. For example, an onium salt-based acid generator such as an iodonium salt or a sulfonium salt, an oxime sulfonate-based acid generator, a diazomethane-based acid generator, a nitrobenzyl sulfonate-based acid generator, an iminosulfonate-based acid generator, and a disulfone-based acid generator have been known. As the onium salt-based acid generator, an agent in which a cation moiety has an onium ion such as triphenyl sulfonium has been mainly used.

Further, in order to improve the lithography characteristics at the time of forming a resist pattern, as the cation moiety of the onium salt-based acid generator, an onium salt-based acid generator that has a cation in which some hydrogen atoms in triphenyl sulfonium have been substituted with fluorine atoms has been suggested (for example, see PCT International Publication No. WO2017/130932).

SUMMARY OF THE INVENTION

With further advancement of the lithography technology and further miniaturization of resist patterns, the object of the lithography using electron beams or EUV is to form fine patterns with a size of several tens of nanometers. A resist composition is required to further improve the lithography characteristics such as reduction in the roughness as the dimension of the resist pattern decreases as described above.

However, in a case where an increase in sensitivity for an exposure light source such as EUV is attempted in the resist composition containing an onium salt-based acid generator of the related art described above, there is a problem in that a desired resist pattern shape or the like is unlikely to be obtained. As the result, it becomes difficult to satisfy all of these characteristics.

The present invention has been made in consideration of the above-described circumstances, and an object thereof is to provide a resist composition which has improved lithography characteristics such as reduction in roughness and is capable of forming a resist pattern having an excellent shape, and a method of forming a resist pattern obtained by using the resist composition.

The present invention employs the following configurations in order to solve the above-described problems.

In other words, according to a first aspect of the present invention, there is provided a resist composition which generates an acid upon exposure and whose solubility in a developing solution is changed due to an action of the acid, the resist composition including: a base material component (A) whose solubility in a developing solution is changed due to the action of an acid; an acid generator component (B) which generates an acid upon exposure; and an organic acid which contains at least one carboxy group, in which the acid generator component (B) contains a compound (B1) represented by Formula (b1).

[In the formula, $R^{2011}$ to $R^{2031}$ each independently represent an aryl group which may have a substituent, an alkyl group which may have a substituent, or an alkenyl group which may have a substituent, two or more of $R^{2011}$ to $R^{2031}$ may be mutually bonded to form a ring together with a sulfur atom in the formula, and where $R^{2011}$ to $R^{2031}$ have a total of four or more substituents containing fluorine atoms, $X^{n-}$ represent an n-valent anion, and n represents an integer of 1 or greater.]

According to a second aspect of the present invention, there is provided a method of forming a resist pattern, including: a step (i) of forming a resist film on a support using the resist composition according to the first aspect; a step (ii) of exposing the resist film; and a step (iii) of developing the exposed resist film to form a resist pattern.

According to the resist composition and the method of forming a resist pattern according to the present invention, it is possible to improve lithography characteristics such as reduction in roughness and to form a resist pattern having an excellent shape.

DETAILED DESCRIPTION OF THE INVENTION

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group in an alkoxy group.

The term "alkylene group" includes linear, branched or cyclic, divalent saturated hydrocarbon, unless otherwise specified.

A "halogenated alkyl group" is a group in which some or all hydrogen atoms of an alkyl group is substituted with halogen atoms. Examples of the halogen atom include a fluorine atom, a chlorine atom, a bromine atom and an iodine atom.

A "fluorinated alkyl group" or a "fluorinated alkylene group" is a group in which some or all hydrogen atoms of an alkyl group or an alkylene group have been substituted with fluorine atoms.

The term "constitutional unit" indicates a monomer unit that contributes to the formation of a polymer compound (a resin, a polymer, or a copolymer).

The expression "may have a substituent" indicates a case where a hydrogen atom (—H) is substituted with a monovalent group or a case where a methylene (—CH$_2$—) group is substituted with a divalent group.

The term "exposure" is used as a general concept that includes irradiation with any form of radiation.

The term "base material component" indicates an organic compound capable of forming a film, and is preferably an organic compound having a molecular weight of 500 or greater. In a case where the organic compound has a molecular weight of 500 or greater, the film-forming ability is improved, and a resist pattern at a nano level can be easily formed. The organic compound used as the base material component is broadly classified into non-polymers and polymers. In general, as a non-polymer, any of those which have a molecular weight in the range of 500 to less than 4,000 is used. Hereinafter, a "low molecular weight compound" indicates a non-polymer having a molecular weight in the range of 500 to less than 4,000. As a polymer, any of those which have a molecular weight of 1,000 or greater is generally used. Hereinafter, a "resin" or a "polymer compound" indicates a polymer having a molecular weight of 1000 or greater. As the molecular weight of the polymer, the mass average molecular weight in terms of the polystyrene equivalent value determined by gel permeation chromatography (GPC) is used.

A "constitutional unit derived from acrylic acid ester" indicates a constitutional unit that is formed by the cleavage of the ethylenic double bond of acrylic acid ester.

The "acrylic acid ester" indicates a compound in which the terminal hydrogen atom of the carboxy group of acrylic acid (CH$_2$=CH—COOH) has been substituted with an organic group.

The acrylic acid ester may have the hydrogen atom bonded to the carbon atom at the α-position substituted with a substituent. The substituent ($R^{\alpha 0}$) that substitutes the hydrogen atom bonded to the carbon atom at the α-position is an atom other than hydrogen or a group, and examples thereof include an alkyl group having 1 to 5 carbon atoms and a halogenated alkyl group having 1 to 5 carbon atoms. Further, acrylic acid ester having the hydrogen atom bonded to the carbon atom at the α-position substituted with a substituent ($R^{\alpha 0}$) in which the substituent has been substituted with a substituent containing an ester bond (itaconic acid diester), or an acrylic acid having the hydrogen atom bonded to the carbon atom at the α-position substituted with a substituent ($R^{\alpha 0}$) in which the substituent has been substituted with a hydroxyalkyl group or a group in which the hydroxyl group in a hydroxyalkyl group has been modified (α-hydroxyalkyl acrylic acid ester) can be exemplified as acrylic acid ester having the hydrogen atom bonded to the carbon atom at the α-position substituted with a substituent. A carbon atom at the α-position of acrylic acid ester indicates the carbon atom bonded to the carbonyl group, unless specified otherwise.

Hereinafter, acrylic acid ester in which the hydrogen atom bonded to the carbon atom at the α-position is substituted with a substituent is also referred to as α-substituted acrylic acid ester. Further, acrylic acid ester and α-substituted acrylic acid ester are also collectively referred to as "(α-substituted) acrylic acid ester".

A "constitutional unit derived from acrylamide" indicates a constitutional unit that is formed by the cleavage of the ethylenic double bond of acrylamide.

The acrylamide may have the hydrogen atom bonded to the carbon atom at the α-position substituted with a substituent, and may have either or both terminal hydrogen atoms on the amino group of acrylamide substituted with a substituent. A carbon atom at the α-position of an acrylamide indicates the carbon atom bonded to the carbonyl group, unless specified otherwise.

As the substituent which substitutes the hydrogen atom bonded to the carbon atom at the α-position of acrylamide, the same substituents as those described above for the substituent ($R^{α0}$) at the α-position of the above-described α-position of the above-described α-substituted acrylic acid ester are exemplary examples.

A "constitutional unit derived from hydroxystyrene" indicates a constitutional unit that is formed by the cleavage of an ethylenic double bond of hydroxystyrene. A "constitutional unit derived from a hydroxystyrene derivative" indicates a constitutional unit formed by the cleavage of an ethylenic double bond of a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxyl group has been substituted with an organic group and may have the hydrogen atom at the α-position substituted with a substituent; and hydroxystyrene which has a substituent other than a hydroxyl group bonded to the benzene ring and may have the hydrogen atom at the α-position substituted with a substituent. Here, the α-position (carbon atom at the α-position) indicates the carbon atom having the benzene ring bonded thereto, unless specified otherwise.

As the substituent which substitutes the hydrogen atom at the α-position of hydroxystyrene, the same substituents as those described above for the substituent at the α-position of the above-described α-substituted acrylic acid ester are exemplary examples.

A "constitutional unit derived from vinylbenzoic acid or a vinylbenzoic acid derivative" indicates a constitutional unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include vinylbenzoic acid in which the hydrogen atom of the carboxy group has been substituted with an organic group and may have the hydrogen atom at the α-position substituted with a substituent; and vinylbenzoic acid which has a substituent other than a hydroxyl group and a carboxy group bonded to the benzene ring and may have the hydrogen atom at the α-position substituted with a substituent. Here, the α-position (carbon atom at the α-position) indicates the carbon atom having the benzene ring bonded thereto, unless specified otherwise.

The term "styrene derivative" is a concept including those obtained by substitution of a hydrogen atom at the α-position of styrene with other substituents such as an alkyl group and a halogenated alkyl group; and these derivatives. Examples of these derivatives include those obtained by bonding a substituent to a benzene ring of hydroxystyrene in which a hydrogen atom at the α-position may be substituted with a substituent. Here, the α-position (carbon atom at the α-position) indicates the carbon atom having the benzene ring bonded thereto, unless specified otherwise.

The term "constitutional unit derived from styrene" or "constitutional unit derived from a styrene derivative" indicates a constitutional unit formed by cleavage of an ethylenic double bond of styrene or a styrene derivative.

As the alkyl group as a substituent at the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group, and a neopentyl group.

Specific examples of the halogenated alkyl group as the substituent at the α-position include groups in which some or all hydrogen atoms of the above-described "alkyl group as the substituent at the α-position" are substituted with halogen atoms. Examples of the halogen atom include a fluorine atom, a chlorine atom, a bromine atom and an iodine atom, and a fluorine atom is particularly preferable.

Specific examples of the hydroxyalkyl group as the substituent at the α-position include groups in which some or all hydrogen atoms of the above-described "alkyl group as the substituent at the α-position" are substituted with a hydroxyl group. The number of hydroxyl groups in the hydroxyalkyl group is preferably 1 to 5, and most preferably 1.

In the present specification and the scope of the appended claims, asymmetric carbons may be present or enantiomers or diastereomers may be present depending on the structures represented by the chemical formulae. In this case, these isomers are represented by one chemical formula. These isomers may be used alone or in the form of a mixture.

(Resist Composition)

A resist composition according to a first aspect of the present invention is a resin composition which generates an acid upon exposure and whose solubility in a developing solution is changed due to an action of the acid. Further, the resist composition includes a base material component (A) (hereinafter, also referred to as a "component (A)") whose solubility in a developing solution is changed due to the action of an acid, an acid generator component (B) (hereinafter, also referred to as a "component (B)") which generates an acid upon exposure, and an organic carboxylic acid component (C) (hereinafter, also referred to as a "component (C)"). The acid generator component (B) contains a compound (B1) represented by Formula (b1) and formed of an anion moiety and a cation moiety.

As an embodiment of such a resist composition, a resist composition that contains the component (A), the component (B), and the component (C) is an exemplary example. Preferably, a resin composition that further contains a base component (hereinafter, also referred to as a "component (D)") trapping (in other words, controlling diffusion of the acid) the acid generated from the component (B) upon exposure in addition to the component (A), the component (B), and the component (C) is an exemplary example.

In a case where a resist film is formed using the resist composition according to the present embodiment and the formed resist film is subjected to a selective exposure, acid is generated from the component (B) at exposed portions of the resist film, and the generated acid acts on the component (A) to change the solubility of the component (A) in a developing solution, whereas the solubility of the component (A) in a developing solution is not changed at unexposed portions of the resist film, thereby generating difference in solubility in a developing solution between exposed portions and unexposed portions. Therefore, by subjecting the resist film to development, the exposed portions of the resist film are dissolved and removed to form a positive type resist pattern in a case of a positive type resist composition, whereas the unexposed portions of the resist film are dissolved and removed to form a negative type resist pattern in a case of a negative type resist composition.

In the present specification, a resist composition which forms a positive type resist pattern by dissolving and removing the exposed portions of the resist film is called a positive type resist composition, and a resist composition which forms a negative type resist pattern by dissolving and removing the unexposed portions of the resist film is called a negative type resist composition.

The resist composition of the present embodiment may be a positive type resist composition or a negative type resist composition. Further, in the formation of a resist pattern, the resist composition according to the embodiment of the present invention can be applied to an alkali developing process using an alkali developing solution in the developing treatment, or a solvent developing process using a developing solution containing an organic solvent (organic developing solution) in the developing treatment.

The resist composition of the present embodiment has a function of generating an acid upon exposure. Further, the component (A) may generate an acid upon exposure, in addition to the component (B).

In a case where the component (A) generates an acid upon exposure, the component (A) is a "base material component which generates an acid upon exposure and whose solubility in a developing solution is changed due to an action of the acid".

In a case where the component (A) is a base material component which generates an acid upon exposure and whose solubility in a developing solution is changed due to an action of the acid, it is preferable that a component (A1) described below is a polymer compound which generates an acid upon exposure and whose solubility in a developing solution is changed due to an action of the acid. As such a polymer compound, a resin having a constitutional unit that generates an acid upon exposure is an exemplary example. A known monomer can be used as a monomer guiding a constitutional unit that generates an acid upon exposure.

<Component (A)>

In the component (A) in the resist composition of the present embodiment, the component (A) contains a resin component (A1) (hereinafter, also referred to as a "component (A1)") whose solubility in a developing solution is changed due to an action of an acid. Since the polarity of the base material component is changed before and after the exposure by using the component (A1), an excellent development contrast can be obtained in the alkali developing process and the solvent developing process.

As the component (A), at least the component (A1) is used, and other polymer compounds and/or low molecular weight compounds may be used in combination together with the component (A1).

In a case of applying an alkali developing process, the base material component containing the component (A1) is sparingly soluble in an alkali developing solution before exposure, but in a case where an acid is generated from the component (B) upon exposure, the action of the acid causes an increase in the polarity of the base material component, thereby increasing the solubility of the component (A1) in an alkali developing solution. Therefore, in the formation of a resist pattern, in a case where selective exposure is performed on a resist film obtained by coating a support with the resist composition, the unexposed portion of the resist film remains insoluble in an alkali developing solution while the exposed portion of the resist film changes from an insoluble state to a soluble state in an alkali developing solution. Accordingly, a positive type resist pattern is formed by performing alkali development.

Meanwhile, in a case of applying a solvent developing process, the base material component containing the component (A1) exhibits high solubility in an organic developing solution before exposure, and in a case where an acid is generated from the component (B) upon exposure, the polarity of the component (A1) is increased by the action of the acid, thereby decreasing the solubility of the component (A1) in an organic developing solution. Therefore, in the formation of a resist pattern, in a case where selective exposure is performed on a resist film obtained by coating a support with the resist composition, the unexposed portion of the resist film remains soluble in an organic developing solution while the exposed portion of the resist film changes from a soluble state to an insoluble state in an organic developing solution. As a result, by conducting development using an organic developing solution, a contrast between the exposed portion and the unexposed portion can be made, and a negative type resist pattern is formed.

In the resist composition of the present embodiment, the component (A) may be used alone, or two or more kinds thereof may be used in combination.

In regard to component (A1)

The component (A1) is a resin component, and it is preferable that the component (A1) contains a polymer compound which has a constitutional unit (a1) containing an acid decomposable group whose polarity is increased due to the action of an acid.

As the component (A1), a component which has a constitutional unit (a10) having a hydroxystyrene skeleton in addition to the constitutional unit (a1) is preferable.

<<Constitutional Unit (a1)>>

The constitutional unit (a1) is a constitutional unit that contains an acid decomposable group whose polarity is increased due to the action of an acid.

The term "acid decomposable group" indicates a group in which at least a part of a bond in the structure of the acid decomposable group can be cleaved due to the action of an acid.

Examples of the acid decomposable group whose polarity is increased due to the action of an acid include groups which are decomposed due to the action of an acid to generate a polar group.

Examples of the polar group include a carboxy group, a hydroxyl group, an amino group, and a sulfo group ($-SO_3H$). Among these, a polar group containing —OH in the structure thereof (hereinafter, also referred to as a "OH-containing polar group") is preferable, a carboxy group or a hydroxyl group is more preferable, and a carboxy group is particularly preferable.

More specific examples of the acid decomposable group include a group in which the above-described polar group has been protected with an acid dissociable group (such as a group in which a hydrogen atom of the OH-containing polar group has been protected with an acid dissociable group).

Here, the "acid dissociable group" indicates both (i) group in which a bond between the acid dissociable group and an atom adjacent to the acid dissociable group can be cleaved due to the action of an acid; and (ii) group in which some bonds are cleaved due to the action of an acid, and then a decarboxylation reaction occurs, thereby cleaving the bond between the acid dissociable group and the atom adjacent to the acid dissociable group.

It is necessary that the acid dissociable group that constitutes the acid decomposable group is a group which exhibits a lower polarity than the polar group generated by the dissociation of the acid dissociable group. Thus, in a case where the acid dissociable group is dissociated by the action of an acid, a polar group exhibiting a higher polarity than that of the acid dissociable group is generated, thereby increasing the polarity. As a result, the polarity of the entire component (A1) is increased. By the increase in the polarity, relatively, the solubility in a developing solution changes, and the solubility in an alkali developing solution is increased, whereas the solubility in an organic developing solution is relatively decreased.

Examples of the acid dissociable group are the same as those which have been proposed as acid dissociable groups for the base resin for a chemically amplified resist composition.

Specific examples of acid dissociable groups of the base resin for a conventional chemically amplified resist composition include an "acetal type acid dissociable group", a "tertiary alkyl ester type acid dissociable group", and a "tertiary alkyloxycarbonyl acid dissociable group" described below.

Acetal Type Acid Dissociable Group:

Examples of the acid dissociable group for protecting a carboxy group or a hydroxyl group as a polar group include the acid dissociable group represented by Formula (a1-r-1) shown below (hereinafter, also referred to as "acetal type acid dissociable group").

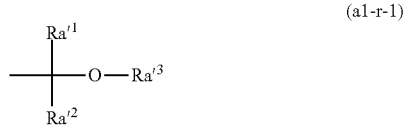

(a1-r-1)

[In the formula, $Ra'^1$ and $Ra'^2$ represent a hydrogen atom or an alkyl group. $Ra'^3$ represents a hydrocarbon group, and $Ra'^3$ may be bonded to any of $Ra'^1$ or $Ra'^2$ to form a ring.]

In Formula (a1-r-1), it is preferable that at least one of $Ra'^1$ and $Ra'^2$ represents a hydrogen atom and more preferable that both of $Ra'^1$ and $Ra'^2$ represent a hydrogen atom.

In a case where $Ra'^1$ or $Ra'^2$ represents an alkyl group, examples of the alkyl group include the same alkyl groups provided as exemplary examples of the substituent which may be bonded to the carbon atom at the α-position in the description on α-substituted acrylic acid ester. Among these, an alkyl group having 1 to 5 carbon atoms is preferable. Specific examples thereof include linear or branched alkyl groups. Specific examples of the alkyl group include a methyl group, an ethyl group, a propyl group, an isopropyl group, an n-butyl group, an isobutyl group, a tert-butyl group, a pentyl group, an isopentyl group, and a neopentyl group. Among these, a methyl group or an ethyl group is preferable, and a methyl group is particularly preferable.

In Formula (a1-r-1), examples of the hydrocarbon group as $Ra'^3$ include a linear or branched alkyl group, or a cyclic hydrocarbon group.

The linear alkyl group has preferably 1 to 5 carbon atoms, more preferably 1 to 4 carbon atoms, and still more preferably 1 or 2 carbon atoms. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group has preferably 3 to 10 carbon atoms and more preferably 3 to 5 carbon atoms. Specific examples thereof include an isopropyl group, an isobutyl group, a tert-butyl group, an isopentyl group, a neopentyl group a 1,1-diethylpropyl group, and a 2,2-dimethylbutyl group, and preferably include an isopropyl group.

In a case where $Ra'^3$ represents a cyclic hydrocarbon group, the cyclic hydrocarbon group may be an aliphatic hydrocarbon group or an aromatic hydrocarbon group, and may be polycyclic or monocyclic.

As the monocyclic aliphatic hydrocarbon group, a group in which one hydrogen atom has been removed from a monocycloalkane is preferable. The monocycloalkane has preferably 3 to 6 carbon atoms, and specific examples thereof include cyclopentane and cyclohexane.

As the aliphatic hydrocarbon group which is a polycyclic group, a group in which one hydrogen atom has been removed from a polycycloalkane is preferable, and the polycyclic group has preferably 7 to 12 carbon atoms, and specific examples of the polycycloalkane include adamantane, norbornane, isobornane, tricyclodecane, and tetracyclododecane.

In a case where the cyclic hydrocarbon group as $Ra'^3$ becomes an aromatic hydrocarbon group, the aromatic hydrocarbon group is a hydrocarbon group having at least one aromatic ring.

The aromatic ring is not particularly limited as long as it is a cyclic conjugated system having $(4n+2)\pi$ electrons, and may be monocyclic or polycyclic. The aromatic ring has preferably 5 to 30 carbon atoms, more preferably 5 to 20 carbon atoms, still more preferably 6 to 15 carbon atoms, and particularly preferably 6 to 12 carbon atoms.

Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom and a nitrogen atom. Specific examples of the aromatic hetero ring include a pyridine ring and a thiophene ring.

Specific examples of the aromatic hydrocarbon group as $Ra'^3$ include a group in which one hydrogen atom has been removed from the above-described aromatic hydrocarbon ring or aromatic hetero ring (an aryl group or a heteroaryl group); a group in which one hydrogen atom has been removed from an aromatic compound having two or more aromatic rings (biphenyl, fluorene or the like); and a group in which one hydrogen atom of the above-described aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group). The alkylene group which is bonded to the above-described aryl group or heteroaryl group has preferably 1 to 4 carbon atoms, more preferably 1 or 2 carbon atoms, and particularly preferably 1 carbon atom. Among these, an isopropyl group is preferable.

The cyclic hydrocarbon group as $Ra'^3$ may include a substituent. Examples of the substituent include —$R^{P1}$, —$R^{P2}$—O—$R^{P1}$, —$R^{P2}$—CO—$R^{P1}$, —$R^{P2}$—CO—O$R^{P1}$, —$R^{P2}$—O—CO—$R^{P1}$, —$R^{P2}$—OH, —$R^{P2}$—CN, and —$R^{P2}$—COOH (hereinafter, these substituents are also collectively referred to as "$Ra^{05}$").

Here, $R^{P1}$ represents a chain-like monovalent saturated hydrocarbon group having 1 to 10 carbon atoms, a monovalent aliphatic cyclic saturated hydrocarbon group having 3 to 20 carbon atoms, or a monovalent aromatic hydrocarbon group having 6 to 30 carbon atoms. Further, $R^{P2}$ represents a single bond, a chain-like divalent saturated hydrocarbon group having 1 to 10 carbon atoms, a divalent aliphatic cyclic saturated hydrocarbon group having 3 to 20 carbon atoms, or a divalent aromatic hydrocarbon group having 6 to 30 carbon atoms.

Here, some or all hydrogen atoms in the chain-like saturated hydrocarbon group, the aliphatic cyclic saturated hydrocarbon group, and the aromatic hydrocarbon group as $R^{P1}$ and $R^{P2}$ may be substituted with fluorine atoms. The aliphatic cyclic hydrocarbon group may have one or more of one kind of substituents or one or more of each of plurality of kinds of the substituents.

Examples of the chain-like monovalent saturated hydrocarbon group having 1 to 10 carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, or a cyclododecyl group; and a polycyclic aliphatic saturated hydrocarbon group such as a bicycle[2.2.2]octanyl group, a tricycle[5.2.1.02,6]decanyl group, a tricycle[3.3.1.13,7]decanyl group, a tetracyclo [6.2.1.13,6.02,7]dodecanyl group, or an adamantyl group.

Examples of the monovalent aromatic hydrocarbon group having 6 to 30 carbon atoms include a group formed by removing one hydrogen atom from an aromatic hydrocarbon ring, such as benzene, biphenyl, fluorene, naphthalene, anthracene, or phenanthrene.

In a case where $Ra'^3$ is bonded to $Ra'^1$ or $Ra'^2$ to form a ring, the cyclic group is preferably a 4- to 7-membered ring, and more preferably a 4- to 6-membered ring. Specific examples of the cyclic group include a tetrahydropyranyl group and a tetrahydrofuranyl group.

Tertiary alkyl ester type acid dissociable group:

Examples of the acid dissociable group for protecting the carboxy group as a polar group include the acid dissociable group represented by Formula (a1-r-2) shown below.

Among the acid dissociable groups represented by Formula (a1-r-2), for convenience, a group which is constituted of alkyl groups is referred to as "tertiary alkyl ester type acid dissociable group".

(a1-r-2)

[In the formula, $Ra'^4$ to $Ra'^6$ each independently represent a hydrocarbon group, provided that $Ra'^5$ and $Ra'^6$ may be mutually bonded to form a ring.]

Examples of the hydrocarbon group as $Ra'^4$ include a linear or branched alkyl group, a chain-like or cyclic alkenyl group, and a cyclic hydrocarbon group.

Examples of the linear or branched alkyl group and the cyclic hydrocarbon group (an aliphatic hydrocarbon group which is a monocyclic group, an aliphatic hydrocarbon group which is a polycyclic group, or an aromatic hydrocarbon group) as $Ra'^4$ are the same as those provided as exemplary examples of $Ra'^3$.

As the chain-like or cyclic alkenyl group as $Ra'^4$, an alkenyl group having 2 to 10 carbon atoms is preferable.

Examples of the hydrocarbon group as $Ra'^5$ or $Ra'^6$ are the same as those provided as exemplary examples of $Ra'^3$.

In a case where $Ra'^5$ and $Ra'^6$ are bonded to form a ring, suitable examples thereof include a group represented by Formula (a1-r2-1), a group represented by Formula (a1-r2-2), and a group represented by Formula (a1-r2-3).

Meanwhile, in a case where $Ra'^4$ to $Ra'^6$ are not bonded to one another and represent an independent hydrocarbon group, suitable examples thereof include a group represented by Formula (a1-r2-4).

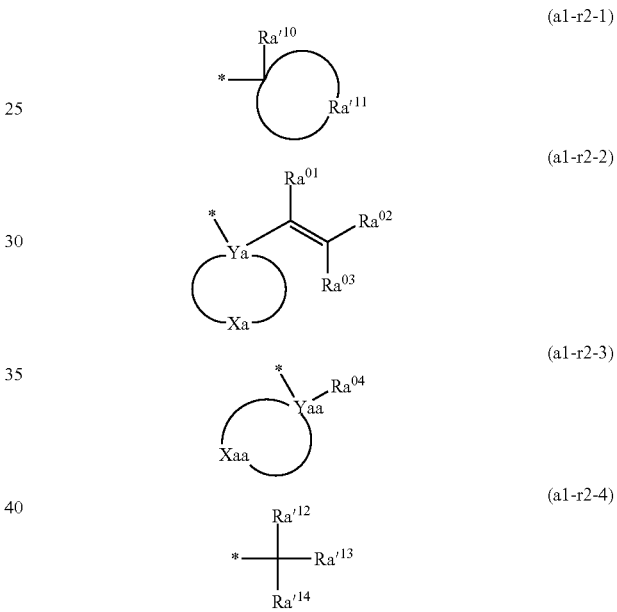

[In Formula (a1-r2-1), $Ra'^{10}$ represents an alkyl group having 1 to 10 carbon atoms or a group represented by Formula (a1-r2-r1). $Ra'^{11}$ represents a group that forms an aliphatic cyclic group together with the carbon atom to which $Ra'^{10}$ is bonded. In Formula (a1-r2-2), Ya represents a carbon atom. Xa represents a group that forms a cyclic hydrocarbon group together with Ya. Some or all hydrogen atoms in this cyclic hydrocarbon group may be substituted. $Ra^{01}$ to $Ra^{03}$ each independently represent a hydrogen atom, a chain-like monovalent saturated hydrocarbon group having 1 to 10 carbon atoms, or a monovalent aliphatic cyclic saturated hydrocarbon group having 3 to 20 carbon atoms. Some or all hydrogen atoms in this cyclic saturated hydrocarbon group and the aliphatic cyclic saturated hydrocarbon group may be substituted. Two or more of $Ra^{01}$ to $Ra^{03}$ may be bonded to one another to form a cyclic structure. In Formula (a1-r2-3), Yaa represents a carbon atom. Xaa represents a group that forms an aliphatic cyclic group together with Yaa. $Ra^{04}$ represents an aromatic hydrocarbon group which may have a substituent. In Formula (a1-r2-4), $Ra'^{12}$ and $Ra'^{13}$ each independently represent a monovalent saturated hydrocarbon having 1 to 10 carbon atoms or a hydrogen atom. Some or all hydrogen atoms in this cyclic saturated hydrocarbon group may be substituted. $Ra'^{14}$ represents a hydrocarbon group which may have a substituent. The symbol "*" represents a bonding site.]

(a1-r2-r1)

[In the formula, $Ya^0$ represents a quaternary carbon atom. $Ra^{031}$, $Ra^{032}$, and $Ra^{033}$ each independently represent a hydrocarbon group which may have a substituent. Here, one or more of $Ra^{031}$, $Ra^{032}$, and $Ra^{033}$ represent a hydrocarbon group containing at least one polar group.]

In Formula (a1-r2-1), as the alkyl group having 1 to 10 carbon atoms as $Ra'^{10}$, a group provided as exemplary examples of the linear or branched alkyl group represented by $Ra'^{3}$ in Formula (a1-r-1) is preferable. It is preferable that $Ra'^{10}$ represents an alkyl group having 1 to 5 carbon atoms.

In Formula (a1-r2-1), $Ya^0$ represents a quaternary carbon atom. In other words, the number of adjacent carbon atoms bonded to $Ya^0$ (carbon atom) is 4.

In Formula (a1-r2-1), $Ra^{031}$, $Ra^{032}$, and $Ra^{033}$ each independently represent a hydrocarbon group which may have a substituent. For example, the hydrocarbon groups as $Ra^{031}$, $Ra^{032}$, and $Ra^{033}$ each independently represent a linear or branched alkyl group, a chain-like or cyclic alkenyl group, or a cyclic hydrocarbon group.

The number of carbon atoms in the linear alkyl group as $Ra^{031}$, $Ra^{032}$, and $Ra^{033}$ is preferably in a range of 1 to 5, more preferably in a range of 1 to 4, and still more preferably 1 or 2. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The number of carbon atoms in the branched alkyl group as $Ra^{031}$, $Ra^{032}$, and $Ra^{033}$ is preferably in a range of 3 to 10 and more preferably in a range of 3 to 5. Specific examples thereof include an isopropyl group, an isobutyl group, a tert-butyl group, an isopentyl group, a neopentyl group a 1,1-diethylpropyl group, and a 2,2-dimethylbutyl group, and preferably include an isopropyl group.

As the chain-like or cyclic alkenyl group as $Ra^{031}$, $Ra^{032}$, and $Ra^{033}$, an alkenyl group having 2 to 10 carbon atoms is preferable.

The cyclic hydrocarbon group as $Ra^{031}$, $Ra^{032}$, and $Ra^{033}$ may be an aliphatic hydrocarbon group or an aromatic hydrocarbon group and may be a polycyclic group or a monocyclic group.

As the monocyclic aliphatic hydrocarbon group, a group in which one hydrogen atom has been removed from a monocycloalkane is preferable. The monocycloalkane has preferably 3 to 6 carbon atoms, and specific examples thereof include cyclopentane and cyclohexane.

As the aliphatic hydrocarbon group which is a polycyclic group, a group in which one hydrogen atom has been removed from a polycycloalkane is preferable, and the polycyclic group has preferably 7 to 12 carbon atoms, and specific examples of the polycycloalkane include adamantane, norbornane, isobornane, tricyclodecane, and tetracyclododecane.

The aromatic hydrocarbon group as $Ra^{031}$, $Ra^{032}$, and $Ra^{033}$ is a hydrocarbon group having at least one aromatic ring. The aromatic ring is not particularly limited as long as it is a cyclic conjugated system having $(4n+2)\pi$ electrons, and may be monocyclic or polycyclic. The aromatic ring has preferably 5 to 30 carbon atoms, more preferably 5 to 20 carbon atoms, still more preferably 6 to 15 carbon atoms, and most preferably 6 to 12 carbon atoms. Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom and a nitrogen atom. Specific examples of the aromatic hetero ring include a pyridine ring and a thiophene ring. Specific examples of the aromatic hydrocarbon group include a group in which one hydrogen atom has been removed from the above-described aromatic hydrocarbon ring or aromatic hetero ring (an aryl group or a heteroaryl group); a group in which one hydrogen atom has been removed from an aromatic compound having two or more aromatic rings (biphenyl, fluorene or the like); and a group in which one hydrogen atom of the above-described aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group). The alkylene group which is bonded to the above-described aromatic hydrocarbon ring or aromatic hetero ring has preferably 1 to 4 carbon atoms, more preferably 1 or 2 carbon atoms, and particularly preferably 1 carbon atom.

In a case where the hydrocarbon group represented by $Ra^{031}$, $Ra^{032}$, and $Ra^{033}$ is substituted, examples of the substituent include a hydroxy group, a carboxy group, a halogen atom (a fluorine atom, a chlorine atom, a bromine atom, or the like), an alkoxy group (a methoxy group, an ethoxy group, a propoxy group, a butoxy group, or the like), and an alkyloxycarbonyl group.

Among these, as the hydrocarbon group which may have a substituent as $Ra^{031}$, $Ra^{032}$, and $Ra^{033}$, a linear or branched alkyl group which may have a substituent is preferable, and a linear alkyl group is more preferable.

Here, one or more of $Ra^{031}$, $Ra^{032}$, and $Ra^{033}$ represent a hydrocarbon group containing at least a polar group.

The "hydrocarbon group containing a polar group" includes a group in which a methylene group ($—CH_2—$) constituting the hydrocarbon group has been substituted with a polar group and a group in which at least one hydrogen atom constituting the hydrocarbon group has been substituted with a polar group.

As such a "hydrocarbon group containing a polar group", a functional group represented by Formula (a1-p1) is preferable.

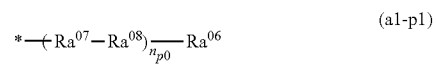
(a1-p1)

[In the formula, $Ra^{07}$ represents a divalent hydrocarbon group having 2 to 12 carbon atoms. $Ra^{08}$ represents a divalent linking group having a hetero atom. $Ra^6$ represents a monovalent hydrocarbon group having 1 to 12 carbon atoms. $n_{p0}$ represents an integer of 1 to 6.]

In Formula (a1-p1), $Ra^{07}$ represents a divalent hydrocarbon group having 2 to 12 carbon atoms.

The number of carbon atoms of $Ra^{07}$ is in a range of 2 to 12, preferably in a range of 2 to 8, more preferably in a range of 2 to 6, still more preferably in a range of 2 to 4, and particularly preferably 2.

As the hydrocarbon group as $Ra^{07}$, a chain-like or cyclic aliphatic hydrocarbon group is preferable, and a chain-like hydrocarbon group is more preferable.

Examples of the group represented by $Ra^{07}$ include a linear alkanediyl group such as an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, or a dodecane-1,12-diyl group; a branched alkanediyl group such as a propane-1,2-diyl group, a 1-methylbutane-1,3-diyl group, a 2-methylpropane-1,3-diyl group, a pentane-1,4-diyl group, or a 2-methylbutane-1,4-diyl group; a cycloalkanediyl group such as a cyclobutane-1,3-diyl group, a cyclopentane-1,3-diyl group, a cyclohexane-1,4-diyl group, or a cyclooctane-1,5-diyl group; and a polycyclic divalent alicyclic hydrocarbon group such as a norbornane-1,4-diyl group, a norbornane-2,5-diyl group, an adamantane-1,5-diyl group, or an adamantane-2,6-diyl group.

Among these, an alkanediyl group is preferable, and a linear alkanediyl group is more preferable.

In Formula (a1-p1), $Ra^{08}$ represents a divalent linking group having a hetero atom.

Examples of the group represented by Ra08 include —O—, —C(=O)—O—, —C(=O)—, —O—C(=O)—O—, —C(=O)—NH—, —NH—, —NH—C(=NH)— (H may be substituted with a substituent such as an alkyl group or an acyl group), —S—, —S(=O)$_2$—, and —S(=O)$_2$—O—.

Among these, from the viewpoint of the solubility in a developing solution, —O—, —C(=O)—O—, —C(=O)—, or —O—C(=O)—O— is preferable, and —O— or —C(=O)— is particularly preferable.

In Formula (a1-p1), $Ra^{06}$ represents a monovalent hydrocarbon group having 1 to 12 carbon atoms.

The number of carbon atoms of $Ra^{06}$ is in a range of 1 to 12. From the viewpoint of the solubility in a developing solution, the number of carbon atoms thereof is preferably in a range of 1 to 8, more preferably in a range of 1 to 5, still more preferably in a range of 1 to 3, particularly preferably 1 or 2, and most preferably 1.

Examples of the hydrocarbon group as $Ra^{06}$ include a chain-like hydrocarbon group, a cyclic hydrocarbon group, and a hydrocarbon group obtained by combining these chain and cyclic groups.

Examples of the chain-like hydrocarbon group include a methyl group, an ethyl group, an n-propyl group, an isopropyl group, an n-butyl group, a sec-butyl group, a tert-butyl group, an n-pentyl group, an n-hexyl group, an n-heptyl group, a 2-ethylhexyl group, an n-octyl group, an n-nonyl group, an n-decyl group, an n-undecyl group, and an n-dodecyl group.

The cyclic hydrocarbon group may be alicyclic hydrocarbon group or an aromatic hydrocarbon group.

The alicyclic hydrocarbon group may be any of monocyclic or polycyclic, and examples of the monocyclic alicyclic hydrocarbon group include a cycloalkyl group such as a cyclopropyl group, a cyclobutyl group, a cyclopentyl group, a cyclohexyl group, a methylcyclohexyl group, a dimethylcyclohexyl group, a cycloheptyl group, a cyclooctyl group, a cycloheptyl group, or a cyclodecyl group. Examples of the polycyclic alicyclic hydrocarbon group include a decahydronaphthyl group, an adamantyl group, a 2-alkyladamantane-2-yl group, a 1-(adamantane-1-yl)alkane-1-yl group, a norbornyl group, a methylnorbornyl group, and an isobornyl group.

Examples of the aromatic hydrocarbon group include a phenyl group, a naphthyl group, an anthryl group, a p-methylphenyl group, a p-tert-butylphenyl group, a p-adamantylphenyl group, a tolyl group, a xylyl group, a cumenyl group, a mesityl group, a biphenyl group, a phenanthryl group, a 2,6-diethylphenyl group, and a 2-methyl-6-ethylphenyl group.

From the viewpoint of the solubility in a developing solution, $Ra^{06}$ represents preferably a chain-like hydrocarbon group, more preferably an alkyl group, and still more preferably a linear alkyl group.

In Formula (a1-p1), $n_{po}$ represents an integer of 1 to 6, preferably an integer of 1 to 3, more preferably 1 or 2, and still more preferably 1.

Hereinafter, specific examples of the hydrocarbon group containing at least a polar group will be described.

In the following formulae, the symbol "*" represents a bonding site to be bonded to a quaternary carbon atom ($Ya^0$).

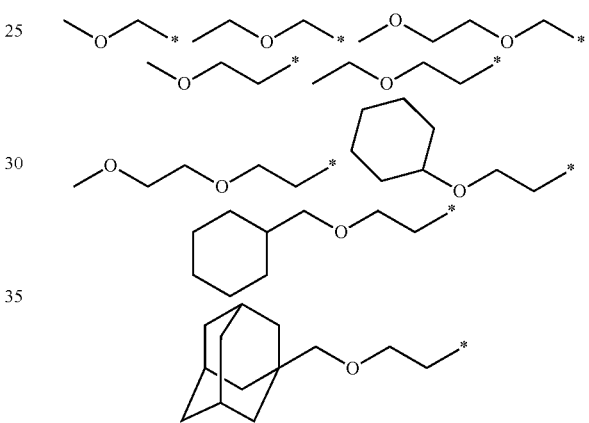

In Formula (a1-r2-r1), the number of hydrocarbon groups containing at least a polar group as $Ra^{031}$, $Ra^{32}$, and $Ra^{033}$ is 1 or greater, but may be appropriately determined in consideration of the solubility in a developing solution during the formation of a resist pattern. For example, the number of the hydrocarbon groups $Ra^{031}$, $Ra^{032}$, and $Ra^{033}$ is preferably 1 or 2 and particularly preferably 1.

The hydrocarbon group containing at least a polar group may have a substituent other than the polar group.

Examples of the substituent include a halogen atom (a fluorine atom, a chlorine atom, a bromine atom, or the like) and a halogenated alkyl group having 1 to 5 carbon atoms.

In Formula (a1-r2-1), as the aliphatic cyclic group that is formed by $Ra'^{11}$ together with the carbon atom to which $Ra'^{10}$ is bonded, a group provided as exemplary examples of the aliphatic hydrocarbon group which is a monocyclic group or a polycyclic group as $Ra^{t3}$ in Formula (a1-r-1) is preferable.

In Formula (a1-r2-2), as the cyclic hydrocarbon group that is formed by Xa together with Ya, a group formed by further removing one or more hydrogen atoms from the cyclic monovalent hydrocarbon group (an aliphatic hydrocarbon group) as $Ra^{t3}$ in Formula (a1-r-1) is an exemplary example.

The cyclic hydrocarbon group that is formed by Xa together with Ya may have a substituent. Examples of the substituent are the same as those provided as exemplary examples of the substituents which may be included in the cyclic hydrocarbon group as $Ra^{t3}$.

In Formula (a1-r2-2), examples of the cyclic monovalent hydrocarbon group having 1 to 10 carbon atoms as $Ra^{o1}$ to $Ra^{o3}$ include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms as $Ra^{o1}$ to $Ra^{o3}$ include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, or a cyclododecyl group; and a polycyclic aliphatic saturated hydrocarbon group such as a bicycle[2.2.2]octanyl group, a tricycle[5.2.1.02,6]decanyl group, a tricycle[3.3.1.13,7]decanyl group, a tetracyclo[6.2.1.13,6.02,7]dodecanyl group, or an adamantyl group.

From the viewpoint of easily synthesizing a monomer compound from which the constitutional unit (a1) is derived, it is preferable that $Ra^{o1}$ to $Ra^{o3}$ represents a hydrogen atom or a chain-like monovalent saturated hydrocarbon group having 1 to 10 carbon atoms. Among these, a hydrogen atom, a methyl group, or an ethyl group is more preferable, and a hydrogen atom is particularly preferable.

Examples of the substituent included in the cyclic saturated hydrocarbon group or the aliphatic cyclic saturated hydrocarbon group represented by $Ra^{o1}$ to $Ra^{o3}$ are the same as those provided as exemplary examples of $Ra^{o5}$.

Examples of the group having a carbon-carbon double bond generated by two or more of $Ra^{o1}$ to $Ra^{o3}$ being bonded to one another to form a cyclic structure include a cyclopentenyl group, a cyclohexenyl group, a methylcyclopentenyl group, a methylcyclohexenyl group, a cyclopentylidenethenyl group, and a cyclohexylidenethenyl group. Among these, from the viewpoint of easily synthesizing a monomer compound from which the constitutional unit (a1) is derived, a cyclopentenyl group, a cyclohexenyl group, or a cyclopentylidenethenyl group is preferable.

In Formula (a1-r2-3), as the aliphatic cyclic group that is formed by Xaa together with Yaa, a group provided as exemplary examples of the aliphatic hydrocarbon group which is a monocyclic or polycyclic group as $Ra^{t3}$ in Formula (a1-r-1) is preferable.

In Formula (a1-r2-3), examples of the aromatic hydrocarbon group as $Ra^{o4}$ include a group formed by removing one or more hydrogen atoms from an aromatic hydrocarbon group having 5 to 30 carbon atoms. Among the examples, $Ra^{o4}$ represents preferably a group formed by removing one or more hydrogen atoms from an aromatic hydrocarbon group having 6 to 15 carbon atoms, more preferably a group formed by removing one or more hydrogen atoms from benzene, naphthalene, anthracene, or phenanthrene, still more preferably a group formed by removing one or more hydrogen atoms from benzene, naphthalene, or anthracene, particularly preferably a group formed by removing one or more hydrogen atoms from benzene or naphthalene, and most preferably a group formed by removing one or more hydrogen atoms from benzene.

Examples of the substituent which may be included in $Ra^{o4}$ in Formula (a1-r2-3) include a methyl group, an ethyl group, a propyl group, a hydroxyl group, a carboxyl group, a halogen atom (such as a fluorine atom, a chlorine atom, or a bromine atom), an alkoxy group (such as a methoxy group, an ethoxy group, a propoxy group, or a butoxy group), and an alkyloxycarbonyl group.

In Formula (a1-r2-4), $Ra^{t12}$ and $Ra^{t13}$ each independently represent a monovalent saturated hydrocarbon having 1 to 10 carbon atoms or a hydrogen atom. Examples of the chain-like monovalent saturated hydrocarbon group having 1 to 10 carbon atoms as $Ra^{t12}$ and $Ra^{t13}$ are the same as those provided as exemplary examples of the chain-like monovalent saturated hydrocarbon group having 1 to 10 carbon atoms as $Ra^{o1}$ to $Ra^{o3}$. Some or all hydrogen atoms in this cyclic saturated hydrocarbon group may be substituted.

$Ra^{t12}$ and $Ra^{t13}$ represent preferably a hydrogen atom or an alkyl group having 1 to 5 carbon atoms, more preferably an alkyl group having 1 to 5 carbon atoms, still more preferably a methyl group or an ethyl group, and particularly preferably a methyl group.

In a case where the chain-like saturated hydrocarbon group represented by $Ra^{t12}$ and $Ra^{t13}$ is substituted, examples of the substituent are the same as those provided as exemplary examples of $Ra^{o5}$.

In Formula (a1-r2-4), $Ra^{t14}$ represents a hydrocarbon group which may have a substituent. Examples of the hydrocarbon group as $Ra^{t14}$ include a linear or branched alkyl group and a cyclic hydrocarbon group.

The number of carbon atoms in the linear alkyl group as $Ra^{t14}$ is preferably in a range of 1 to 5, more preferably in a range of 1 to 4, and still more preferably 1 or 2. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The number of carbon atoms in the branched alkyl group as $Ra^{t14}$ is preferably in a range of 3 to 10 and more preferably in a range of 3 to 5. Specific examples thereof include an isopropyl group, an isobutyl group, a tert-butyl group, an isopentyl group, a neopentyl group a 1,1-diethylpropyl group, and a 2,2-dimethylbutyl group, and preferably include an isopropyl group.

In a case where $Ra^{t14}$ represents a cyclic hydrocarbon group, the cyclic hydrocarbon group may be an aliphatic hydrocarbon group or an aromatic hydrocarbon group, and may be polycyclic or monocyclic.

As the monocyclic aliphatic hydrocarbon group, a group in which one hydrogen atom has been removed from a monocycloalkane is preferable. The monocycloalkane has preferably 3 to 6 carbon atoms, and specific examples thereof include cyclopentane and cyclohexane.

As the aliphatic hydrocarbon group which is a polycyclic group, a group in which one hydrogen atom has been removed from a polycycloalkane is preferable, and the polycyclic group has preferably 7 to 12 carbon atoms, and specific examples of the polycycloalkane include adamantane, norbornane, isobornane, tricyclodecane, and tetracyclododecane.

Examples of the aromatic hydrocarbon group as $Ra^{t14}$ are the same as those provided as exemplary examples of the aromatic hydrocarbon group as $Ra^{o4}$. Among these, $Ra^{t14}$ represents preferably a group formed by removing one or more hydrogen atoms from an aromatic hydrocarbon group having 6 to 15 carbon atoms, more preferably a group formed by removing one or more hydrogen atoms from benzene, naphthalene, anthracene, or phenanthrene, still more preferably a group formed by removing one or more hydrogen atoms from benzene, naphthalene, or anthracene, particularly preferably a group formed by removing one or more hydrogen atoms from naphthalene or anthracene, and most preferably a group formed by removing one or more hydrogen atoms from naphthalene.

Examples of the substituent which may be included in $Ra'^{14}$ are the same as those provided as exemplary examples of the substituent which may be included in $Ra^{o4}$.

In a case where $Ra'^{14}$ in Formula (a1-r2-4) represents a naphthyl group, the position bonded to the tertiary carbon atom in Formula (a1-r2-4) may be the 1-position or the 2-position of the naphthyl group.

In a case where $Ra'^{14}$ in Formula (a1-r2-4) represents an anthryl group, the position bonded to the tertiary carbon atom in Formula (a1-r2-4) may be the 1-position, the 2-position, or the 9-position of the anthryl group.

Specific examples of the group represented by Formula (a1-r2-1) are shown below.

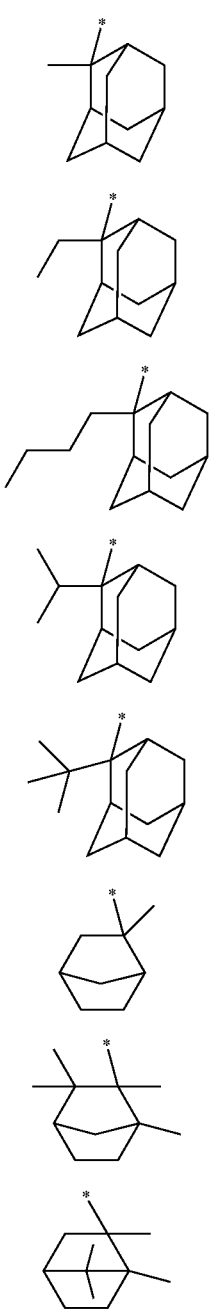

(r-pr-m1)

(r-pr-m2)

(r-pr-m3)

(r-pr-m4)

(r-pr-m5)

(r-pr-m6)

(r-pr-m7)

(r-pr-m8)

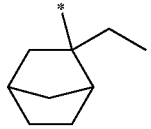

(r-pr-m9)

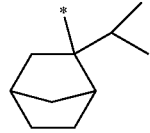

(r-pr-m10)

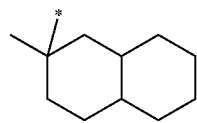

(r-pr-m11)

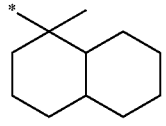

(r-pr-m12)

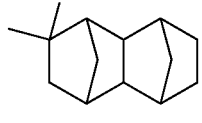

(r-pr-m13)

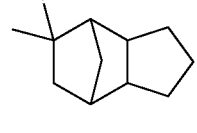

(r-pr-m14)

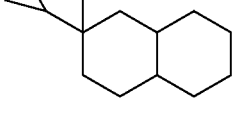

(r-pr-m15)

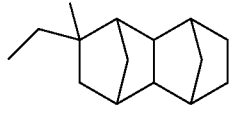

(r-pr-m16)

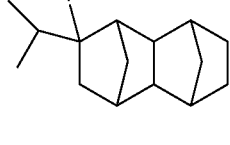

(r-pr-m17)

(r-pr-s1)

(r-pr-s2)

(r-pr-s3)
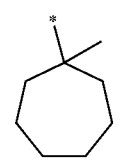
(r-pr-s4)
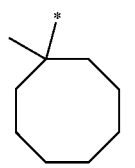
(r-pr-s5)
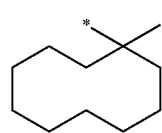
(r-pr-s6)
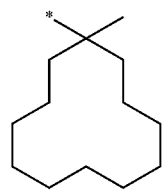
(r-pr-s7)
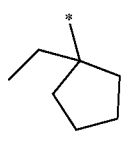
(r-pr-s8)
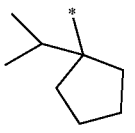
(r-pr-s9)
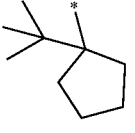
(r-pr-s10)
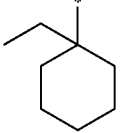
(r-pr-s11)
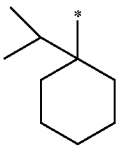
(r-pr-s12)
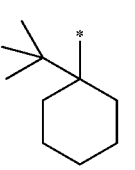
(r-pr-s13)
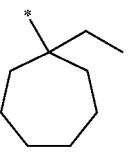
(r-pr-s14)
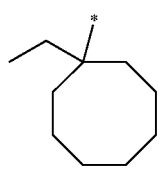
(r-pr-s15)
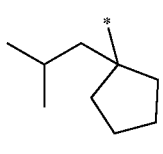
(r-pr-s16)
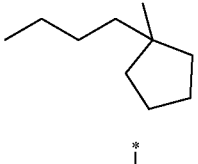
(r-pr-s17)
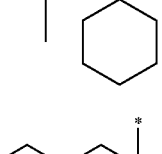
(r-pr-s18)
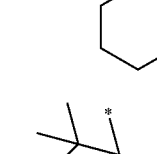
(r-pr-s19)
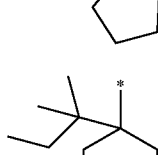
(r-pr-s20)
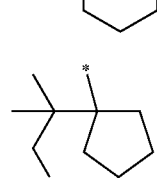
(r-pr-sp1)
(r-pr-sp2)
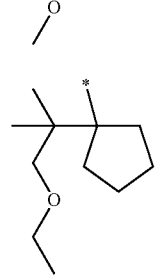

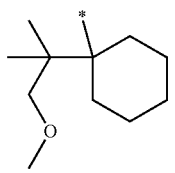 (r-pr-sp3)
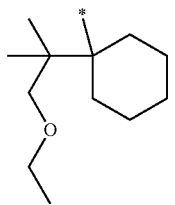 (r-pr-sp4)
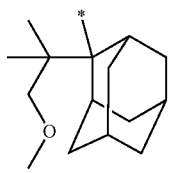 (r-pr-mp1)
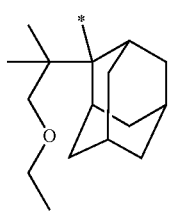 (r-pr-mp2)
Specific examples of the group represented by Formula (a1-r2-2) are shown below.
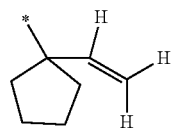 (r-pr-sv1)
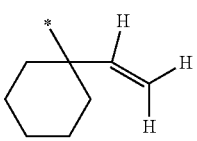 (r-pr-sv2)
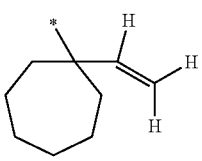 (r-pr-sv3)
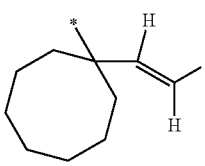 (r-pr-sv4)
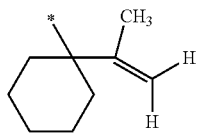 (r-pr-sv5)
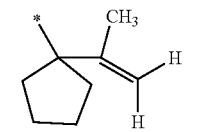 (r-pr-sv6)
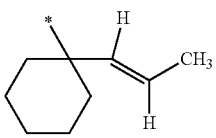 (r-pr-sv7)
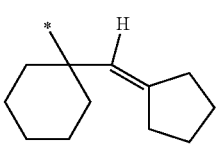 (r-pr-sv8)
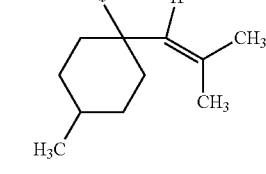 (r-pr-sv9)
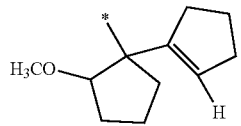 (r-pr-sv10)
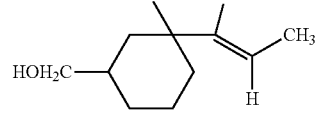 (r-pr-sv11)
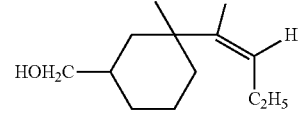 (r-pr-sv12)
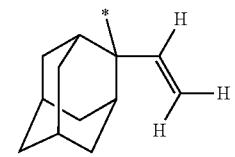 (r-pr-mv1)
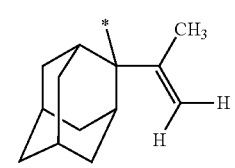 (r-pr-mv2)

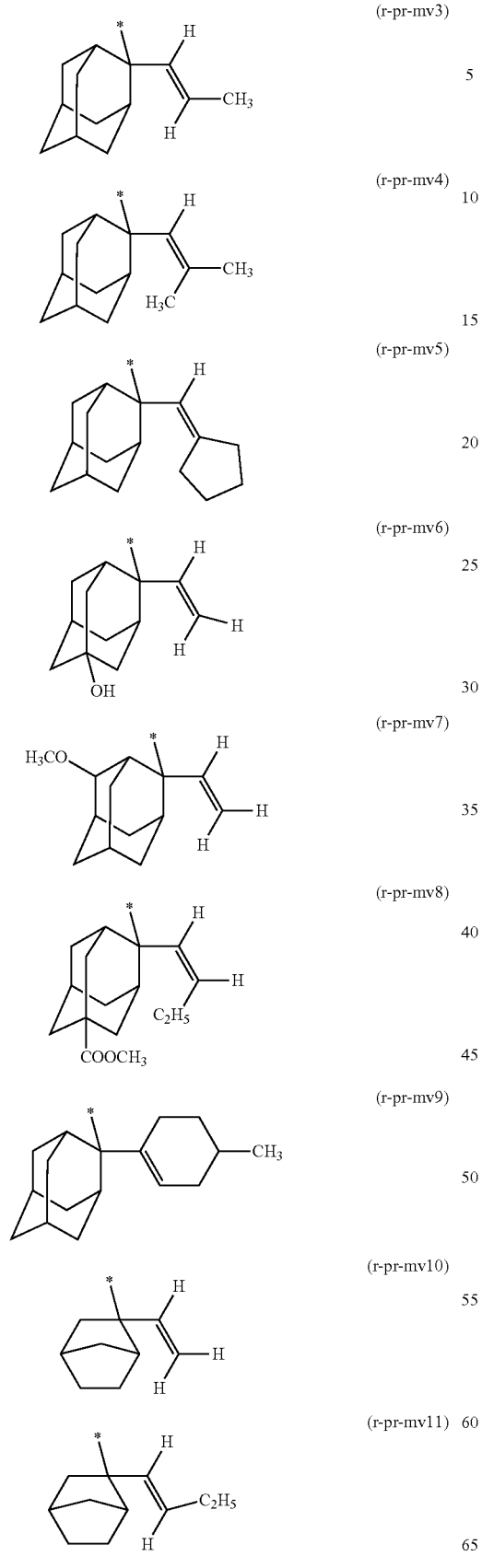
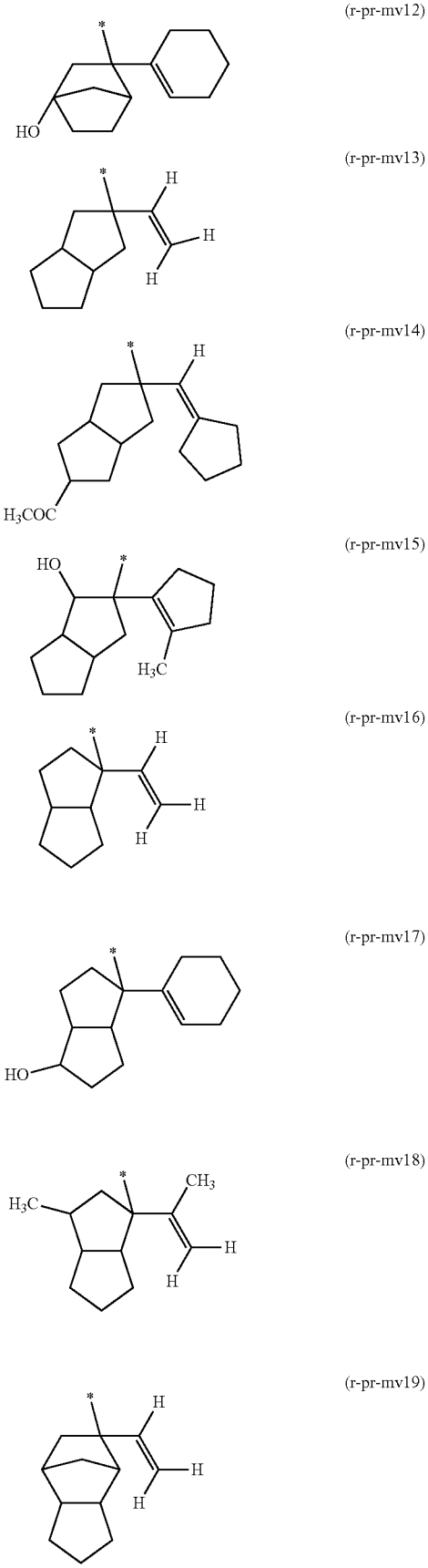

(r-pr-mv20)
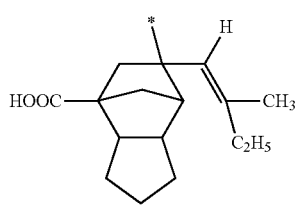
(r-pr-mv21)
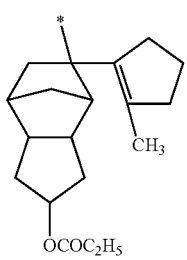
Specific examples of the group represented by Formula (a1-r2-3) are shown below.
(r-pr-sa1)
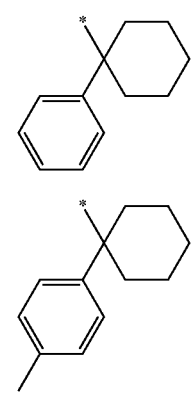
(r-pr-sa2)
(r-pr-sa3)
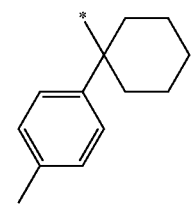
(r-pr-sa4)
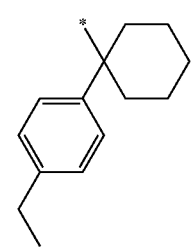
(r-pr-sa5)
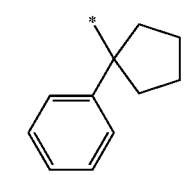
(r-pr-sa6)
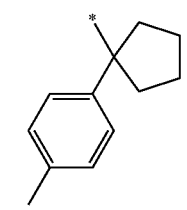
(r-pr-sa6)
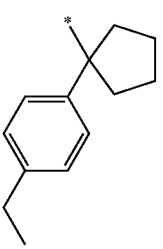
(r-pr-sa7)
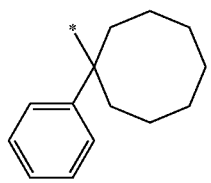
(r-pr-sa8)
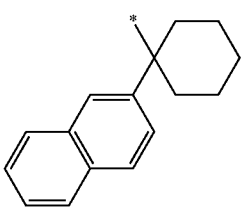
(r-pr-sa9)
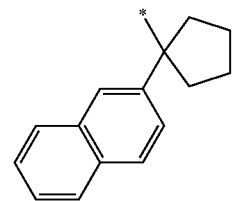
(r-pr-ma1)
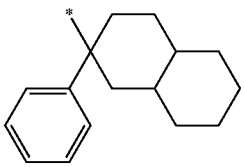
(r-pr-ma2)
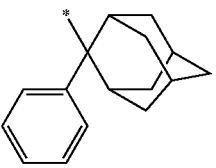
Specific examples of the group represented by Formula (a1-r2-4) are shown below.
(r-pr-cm1)
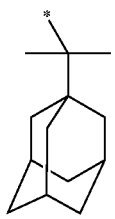

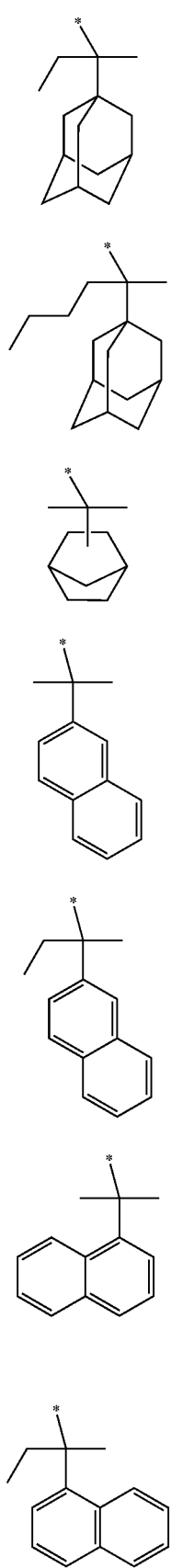
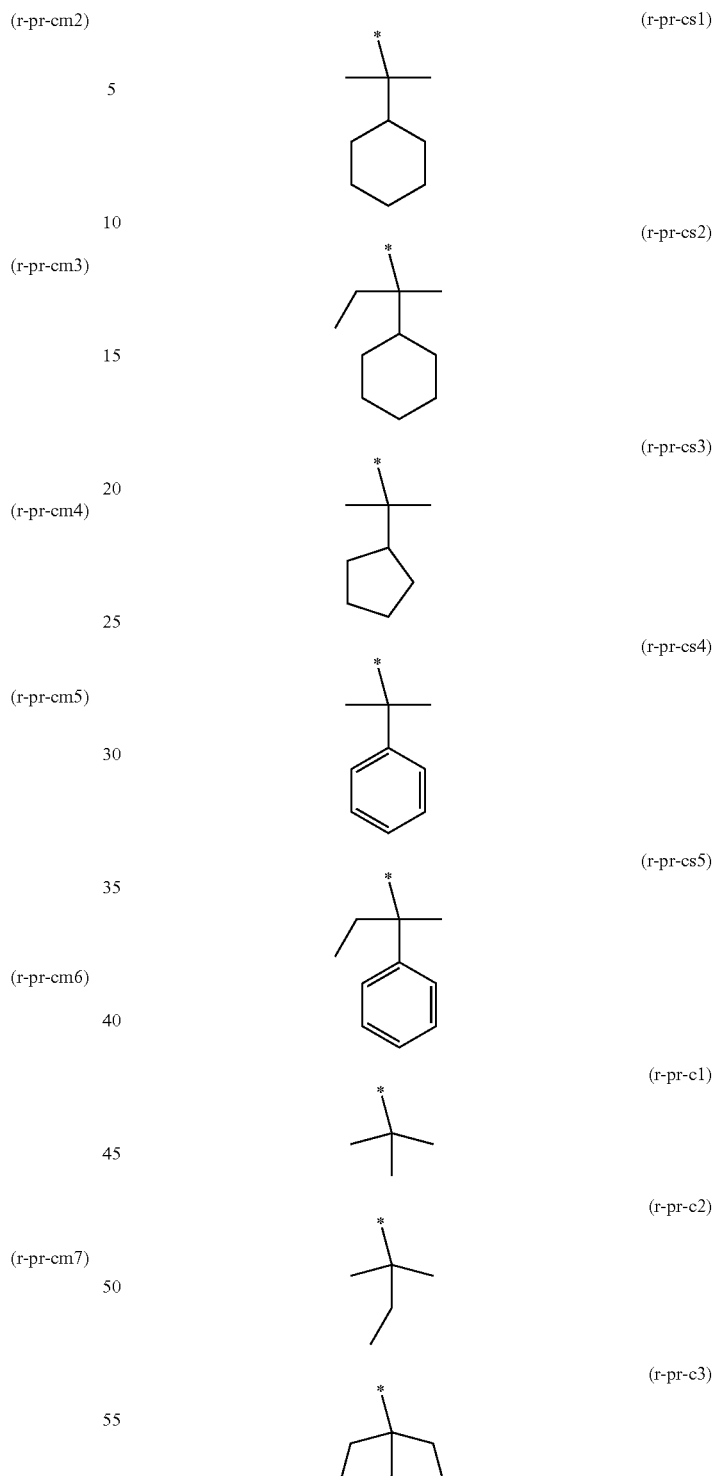
Tertiary alkyloxycarbonyl acid dissociable group:
Examples of the acid dissociable group for protecting a hydroxyl group as a polar group include an acid dissociable group (hereinafter, for convenience, also referred to as "tertiary alkyloxycarbonyl type acid dissociable group") represented by Formula (a1-r-3) shown below.

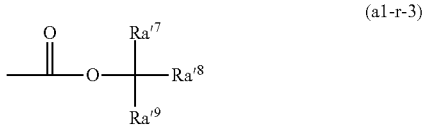

[In the formula, $Ra'^7$ to $Ra'^9$ each independently represent an alkyl group.]

In Formula (a1-r-3), $Ra'^7$ to $Ra'^9$ each independently represent preferably an alkyl group having 1 to 5 carbon atoms and more preferably an alkyl group having 1 to 3 carbon atoms.

Further, the total number of carbon atoms in each alkyl group is preferably in a range of 3 to 7, more preferably in a range of 3 to 5, and most preferably 3 or 4.

Examples of the constitutional unit (a1) include a constitutional unit derived from acrylic acid ester in which the hydrogen atom bonded to the carbon atom at the α-position may be substituted with a substituent; a constitutional unit derived from acrylamide; a constitutional unit in which at least some hydrogen atoms in a hydroxyl group of a constitutional unit derived from hydroxystyrene or a hydroxystyrene derivative are protected by a substituent containing the acid decomposable group; and a constitutional unit in which some hydrogen atoms in —C(=O)—OH of a constitutional unit derived from vinylbenzoic acid or a vinylbenzoic acid derivative are protected by a substituent containing the acid decomposable group.

Among the examples, as the constitutional unit (a1), a constitutional unit derived from acrylic acid ester in which the hydrogen atom bonded to the carbon atom at the α-position may be substituted with a substituent is preferable.

Specific preferred examples of such a constitutional unit (a1) include constitutional units represented by Formula (a1-1) or (a1-2) shown below.

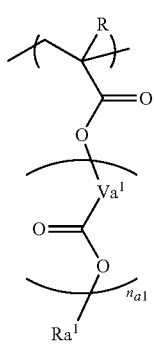

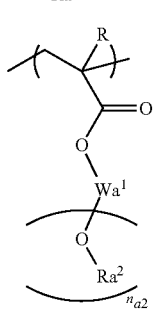

[In the formulae, R represents a hydrogen atom, an alkyl group having 1 to 5 carbon atoms, or a halogenated alkyl group having 1 to 5 carbon atoms. $Va^1$ represents a divalent hydrocarbon group which may have an ether bond. $n_{a1}$ represents an integer of 0 to 2. $Ra^1$ represents an acid dissociable group represented by Formula (a1-r-1) or (a1-r-2). $Wa^1$ represents a $(n_{a2}+1)$-valent hydrocarbon group, $n_{a2}$ represents an integer of 1 to 3, and $Ra^2$ represents an acid dissociable group represented by Formula (a1-r-1) or (a1-r-3)].

In Formula (a1-1), as the alkyl group having 1 to 5 carbon atoms as R, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which some or all hydrogen atoms of the above-described alkyl group having 1 to 5 carbon atoms have been substituted with halogen atoms. Examples of the halogen atom include a fluorine atom, a chlorine atom, a bromine atom and an iodine atom, and a fluorine atom is particularly preferable.

R represents preferably a hydrogen atom, an alkyl group having 1 to 5 carbon atoms, or a fluorinated alkyl group having 1 to 5 carbon atoms and most preferably a hydrogen atom or a methyl group from the viewpoint of industrial availability.

In Formula (a1-1), the divalent hydrocarbon group as $Va^1$ may be an aliphatic hydrocarbon group or an aromatic hydrocarbon group.

The aliphatic hydrocarbon group as a divalent hydrocarbon group represented by $Va^1$ may be saturated or unsaturated. In general, it is preferable that the aliphatic hydrocarbon group is saturated.

As specific examples of the aliphatic hydrocarbon group, a linear or branched aliphatic hydrocarbon group, and an aliphatic hydrocarbon group containing a ring in the structure thereof.

The linear aliphatic hydrocarbon group has preferably 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

The branched aliphatic hydrocarbon group has preferably 2 to 10 carbon atoms, more preferably 3 to 6 carbon atoms, still more preferably 3 or 4 carbon atoms, and most preferably 3 carbon atoms.

As the branched aliphatic hydrocarbon group, a branched alkylene group is preferred, and specific examples include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group in the alkylalkylene group, a linear alkyl group having 1 to 5 carbon atoms is preferable.

Examples of the aliphatic hydrocarbon group containing a ring in the structure thereof include an alicyclic hydrocarbon group (a group in which two hydrogen atoms have been removed from an aliphatic hydrocarbon ring), a group in which the alicyclic hydrocarbon group is bonded to the terminal of the above-described linear or branched aliphatic hydrocarbon group, and a group in which the alicyclic hydrocarbon group is interposed in the above-described linear or branched aliphatic hydrocarbon group. The linear or branched aliphatic hydrocarbon group is the same as defined for the above-described linear aliphatic hydrocarbon group or the above-described branched aliphatic hydrocarbon group.

The alicyclic hydrocarbon group has preferably 3 to 20 carbon atoms and more preferably 3 to 12 carbon atoms.

The alicyclic hydrocarbon group may be monocyclic or polycyclic. As the monocyclic alicyclic hydrocarbon group, a group in which two hydrogen atoms have been removed from a monocycloalkane is preferable. The monocycloalkane has preferably 3 to 6 carbon atoms, and specific examples thereof include cyclopentane and cyclohexane. As the polycyclic alicyclic group, a group in which two hydrogen atoms have been removed from a polycycloalkane is preferable. As the polycycloalkane, a group having 7 to 12 carbon atoms is preferable. Specific examples of the polycycloalkane include adamantane, norbornane, isobornane, tricyclodecane, and tetracyclododecane.

The aromatic hydrocarbon group as the divalent hydrocarbon group represented by $Va^1$ is a hydrocarbon group having an aromatic ring.

The aromatic hydrocarbon group has preferably 3 to 30 carbon atoms, more preferably 5 to 30 carbon atoms, still more preferably 5 to 20 carbon atoms, particularly preferably 6 to 15 carbon atoms, and most preferably 6 to 12 carbon atoms. Here, the number of carbon atoms in a substituent is not included in the number of carbon atoms.

Specific examples of the aromatic ring contained in the aromatic hydrocarbon group include aromatic hydrocarbon rings such as benzene, biphenyl, fluorene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom and a nitrogen atom.

Specific examples of the aromatic hydrocarbon group include a group in which two hydrogen atoms have been removed from the above-described aromatic hydrocarbon ring (an arylene group); and a group in which one hydrogen atom of a group (an aryl group) formed by removing one hydrogen atom from the aromatic hydrocarbon ring has been substituted with an alkylene group (a group formed by removing one more hydrogen atom from an aryl group in an arylalkyl group such as a benzyl group, a phenethyl group, a 1-naphthylmethyl group, a 2-naphthylmethyl group, a 1-naphthylethyl group, or a 2-naphthylethyl group). The alkylene group (an alkyl chain in the arylalkyl group) has preferably 1 to 4 carbon atoms, more preferably 1 or 2 carbon atoms, and particularly preferably 1 carbon atom.

In Formula (a1-1), $Ra^1$ represents an acid dissociable group represented by Formula (a1-r-1) or (a1-r-2).

In Formula (a1-2), the $(n_{a2}+1)$-valent hydrocarbon group as $Wa^1$ may be an aliphatic hydrocarbon group or an aromatic hydrocarbon group. The aliphatic hydrocarbon group indicates a hydrocarbon group that has no aromaticity, and may be saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof.

The valency of $n_{a2}+1$ is preferably divalent, trivalent or tetravalent, and divalent or trivalent is more preferable.

In Formula (a1-2), $Ra^2$ represents an acid dissociable group represented by Formula (a1-r-1) or (a1-r-3).

Specific examples of the constitutional unit represented by Formula (a1-1) are shown below. In each formula, Ra represents a hydrogen atom, a methyl group, or a trifluoromethyl group.

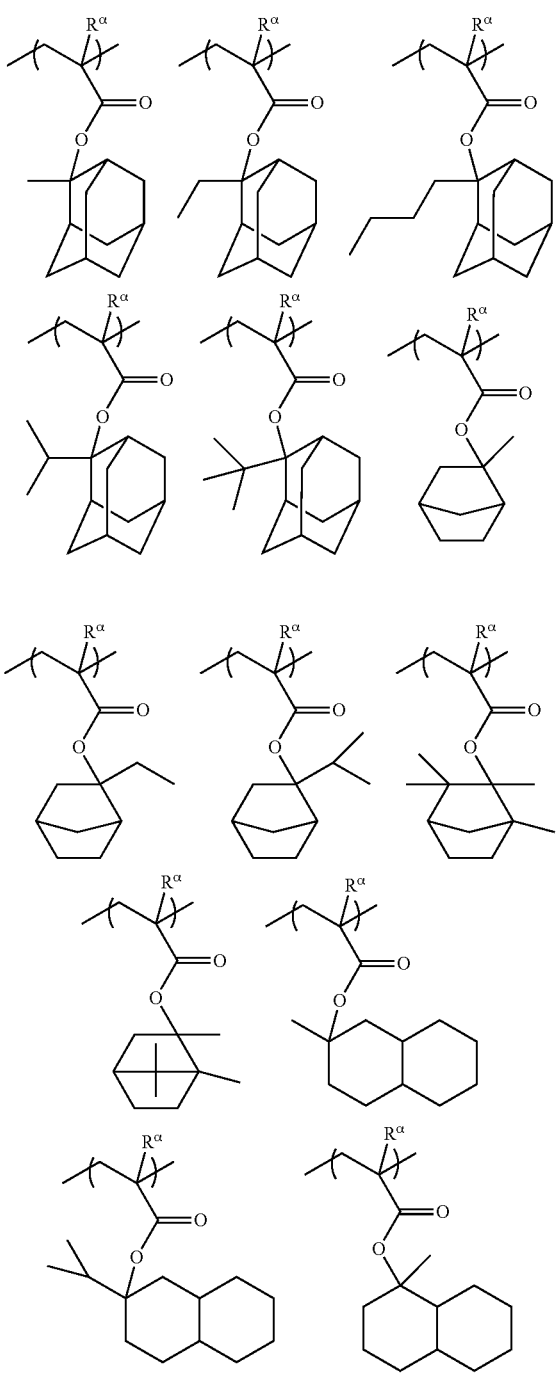

-continued
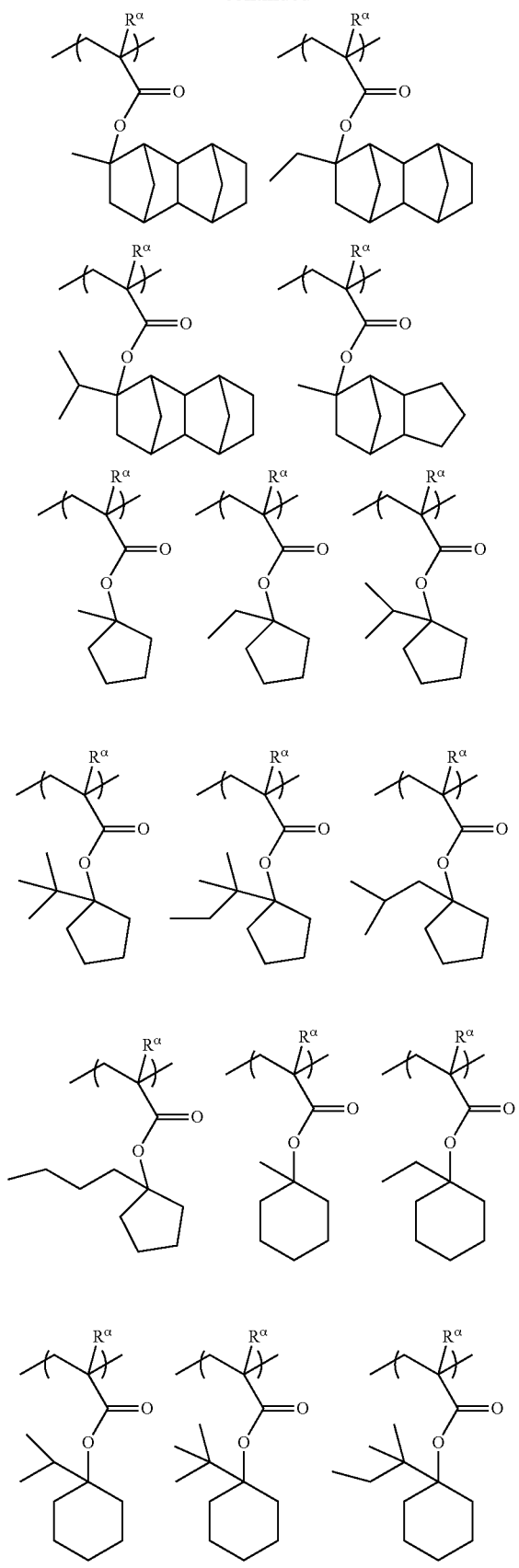
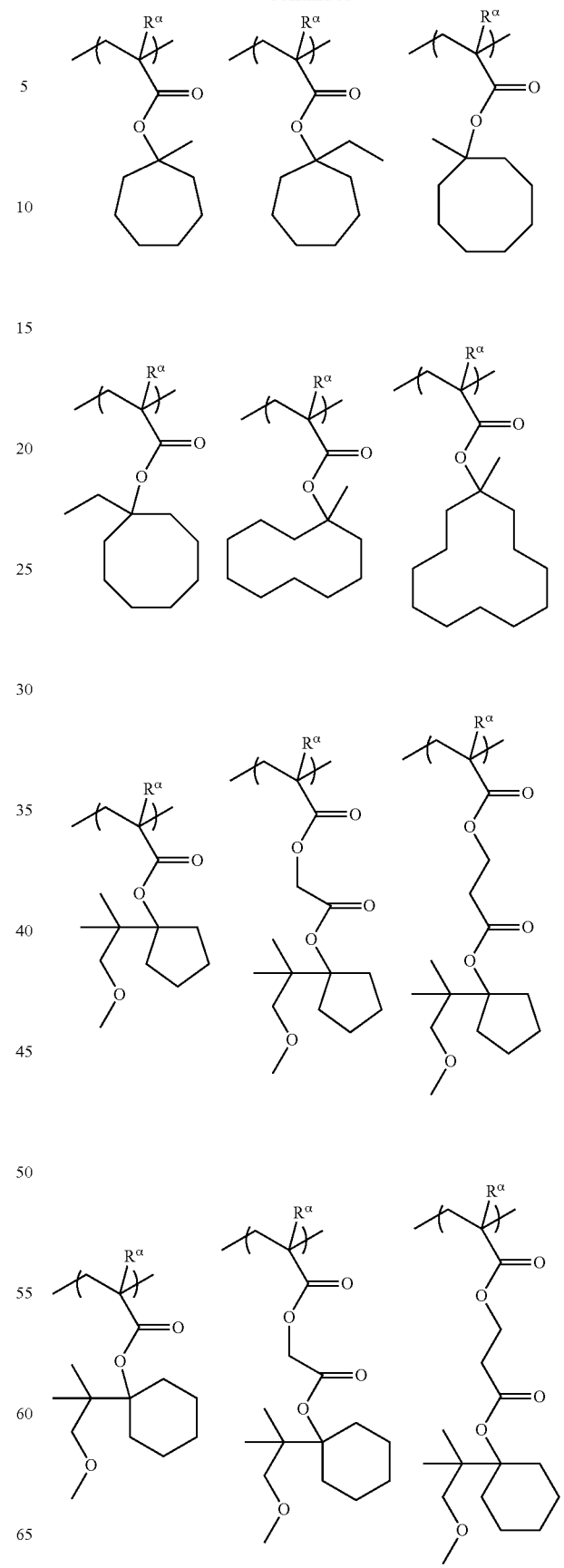

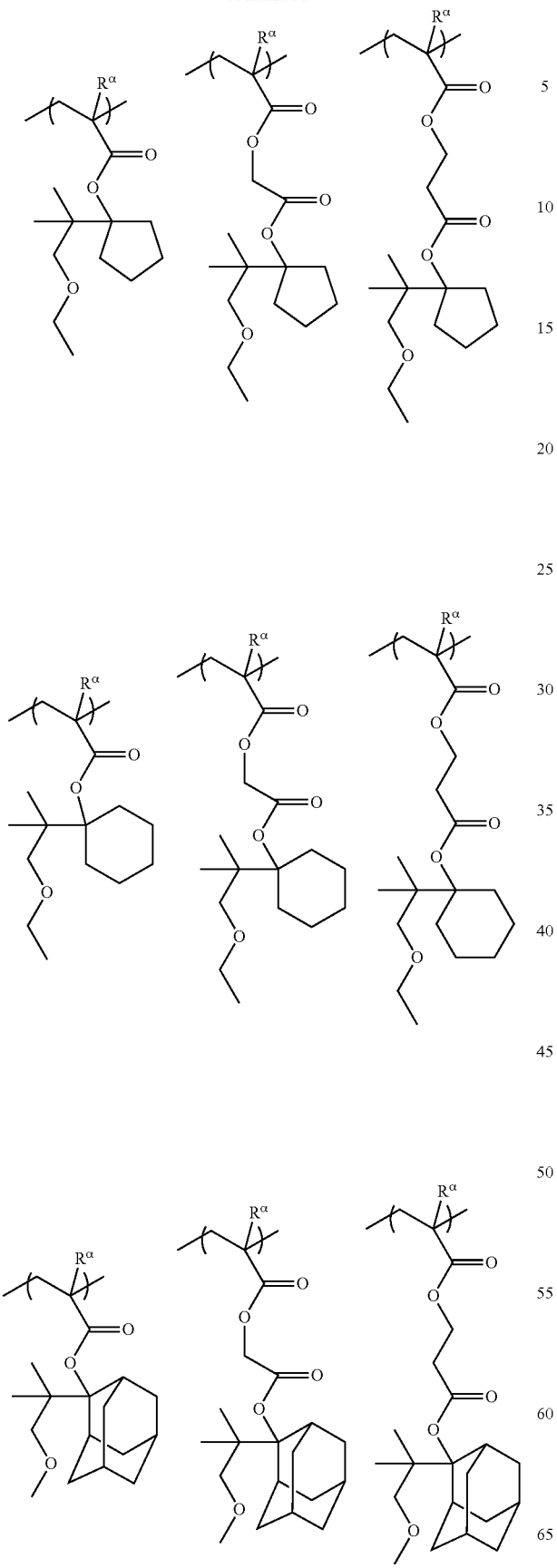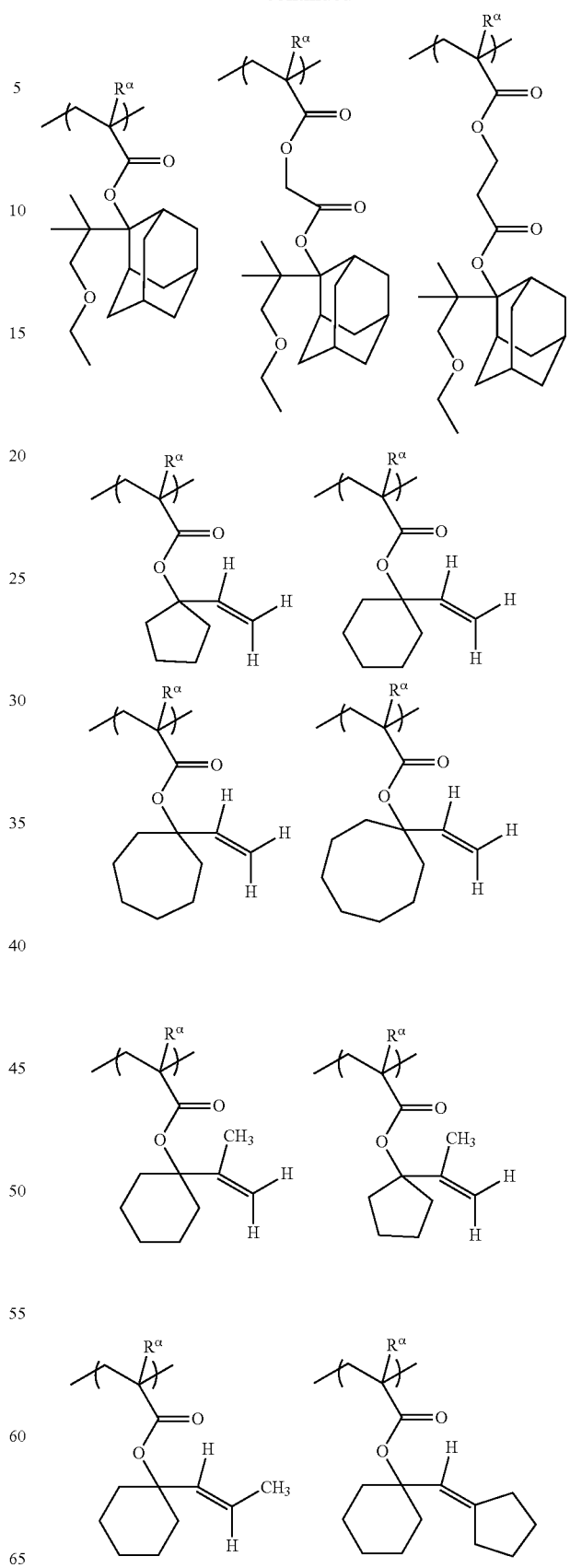

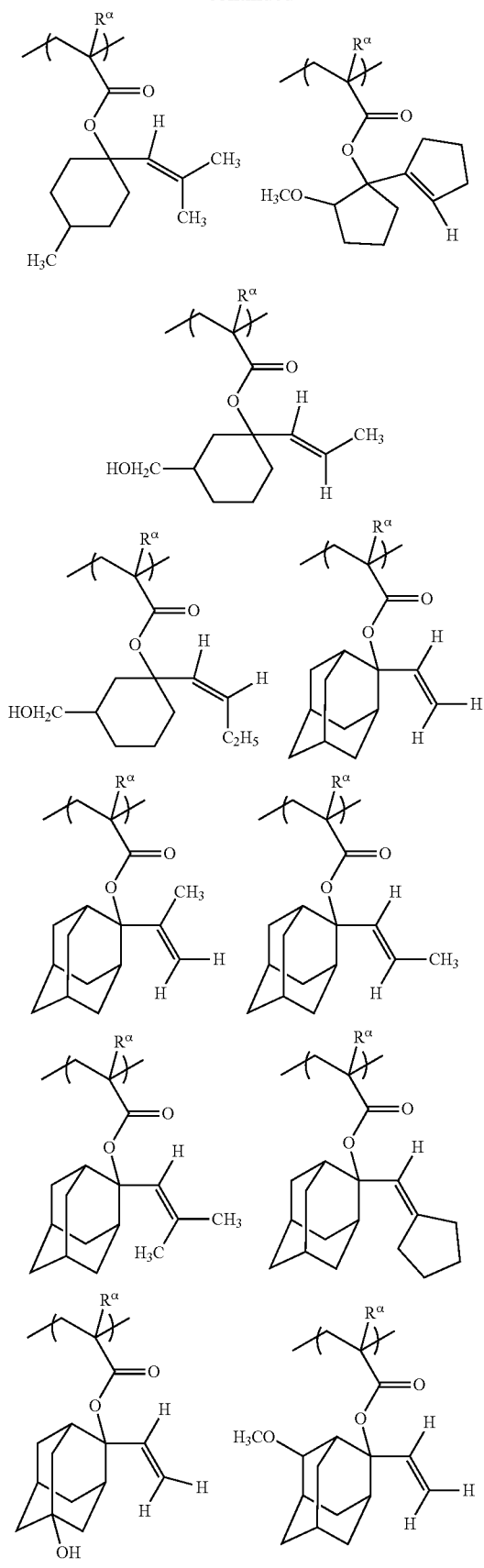
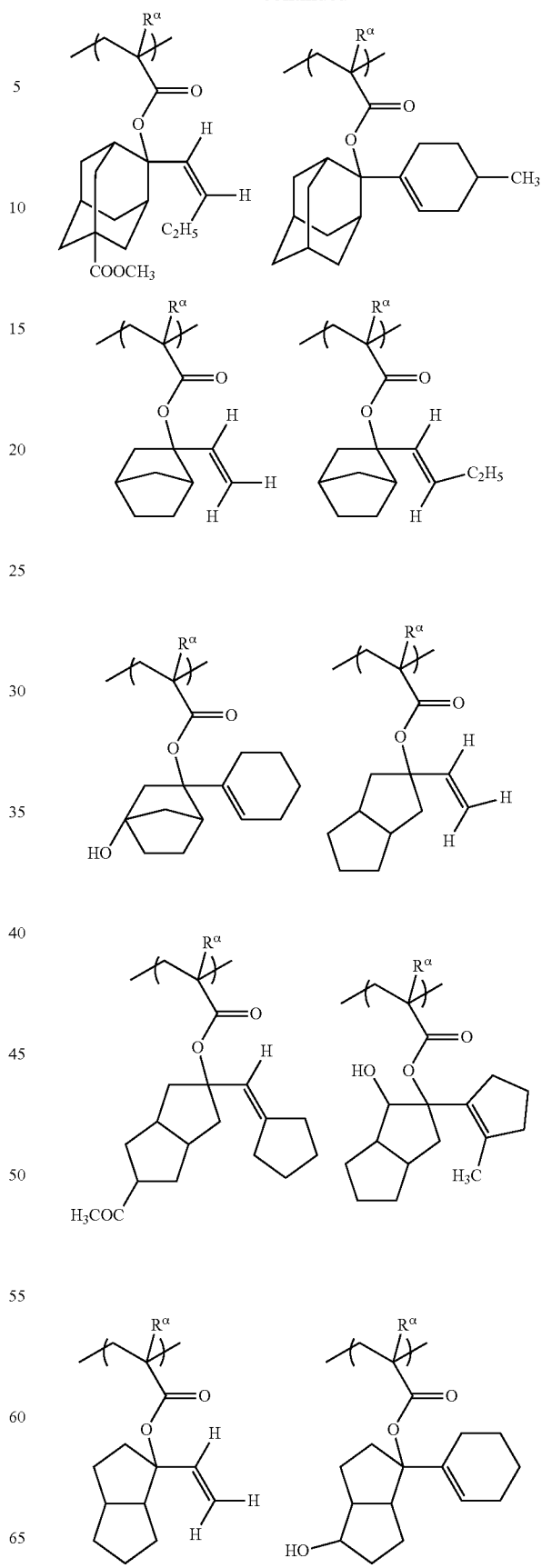

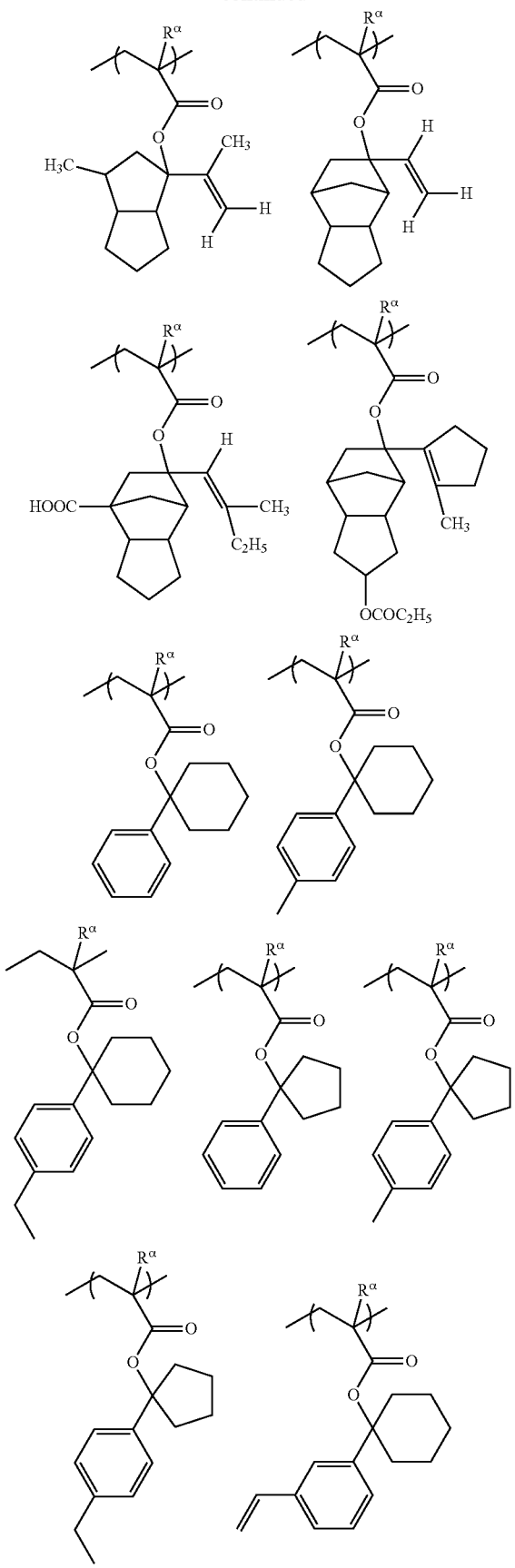
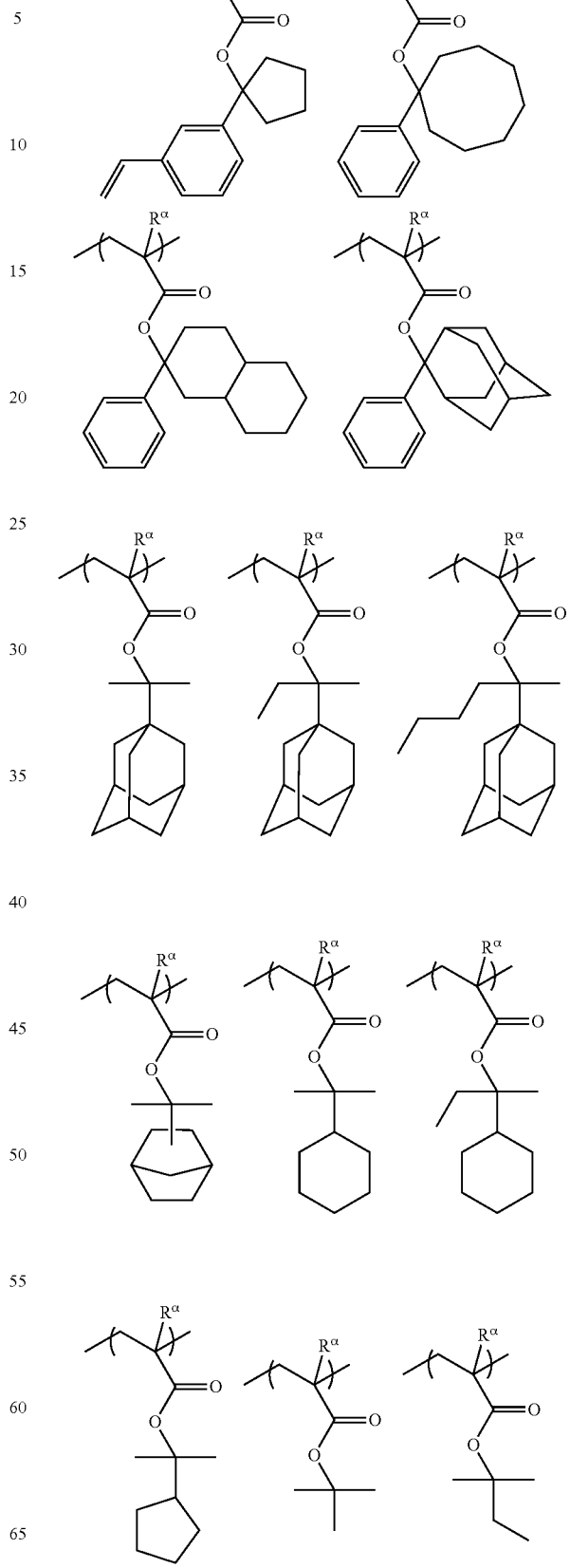

-continued
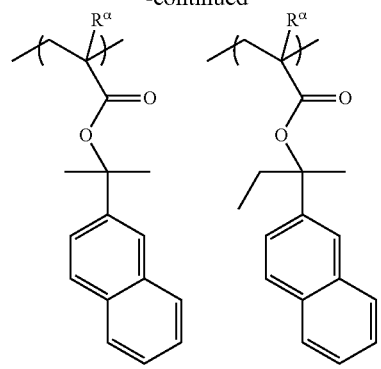
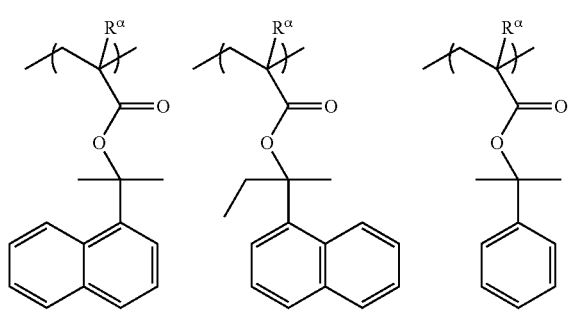
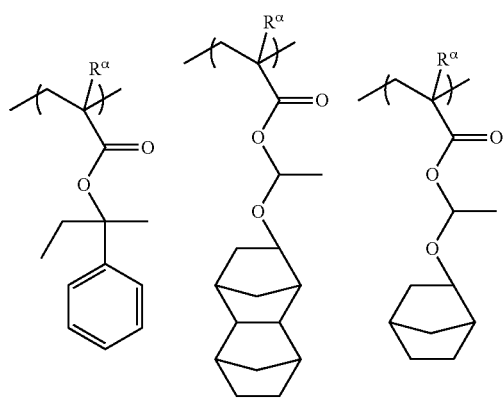
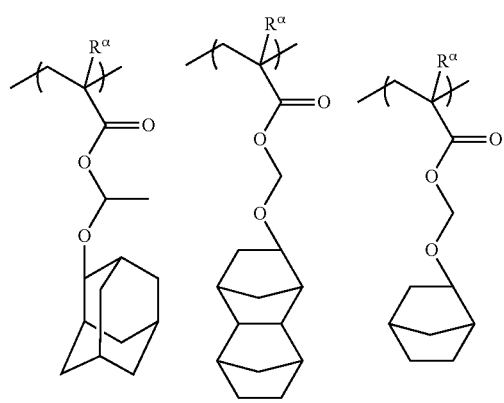
-continued
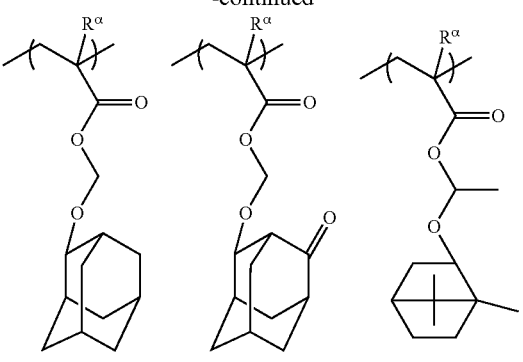
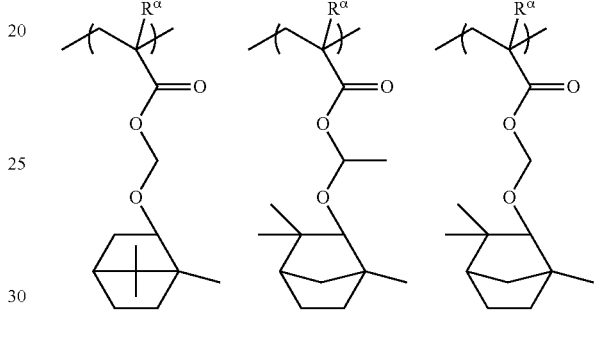
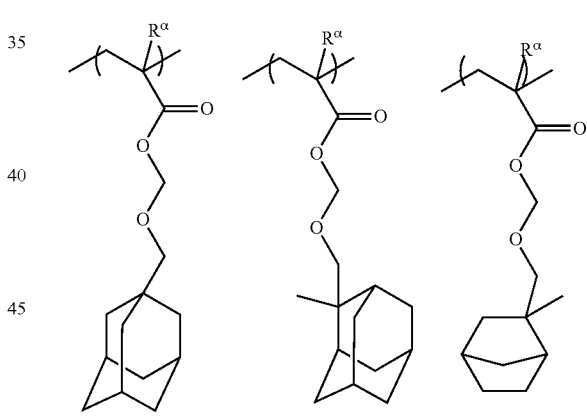

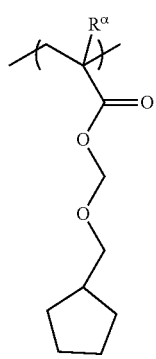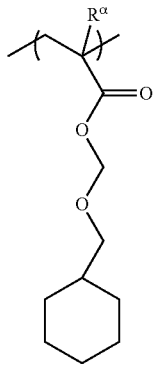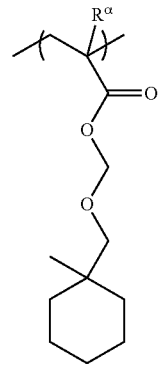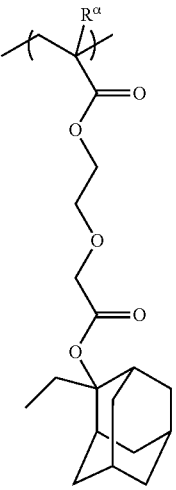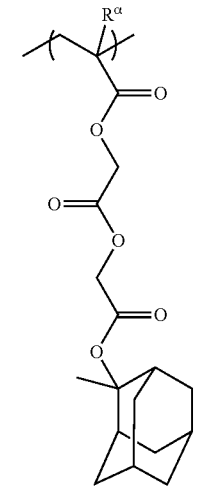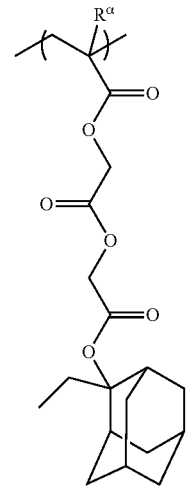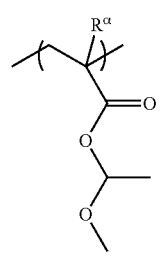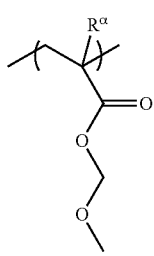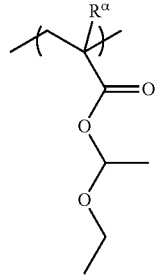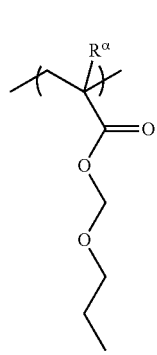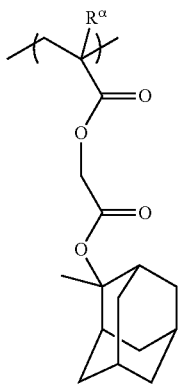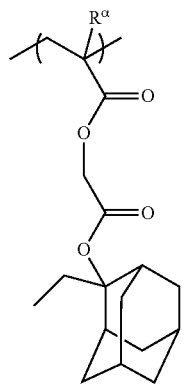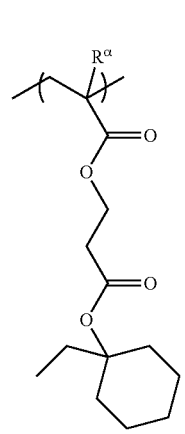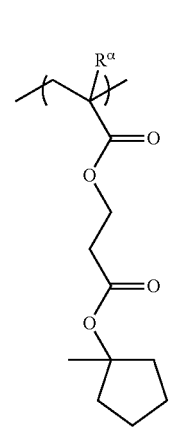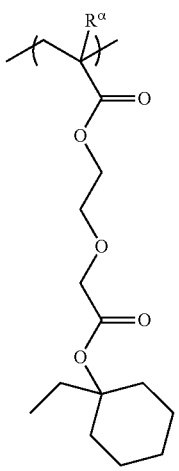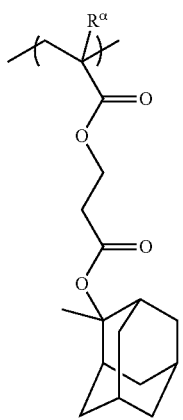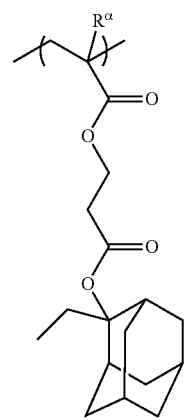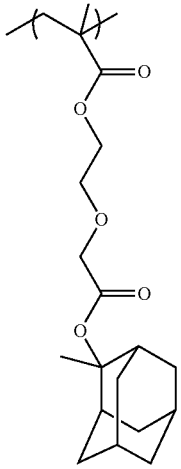

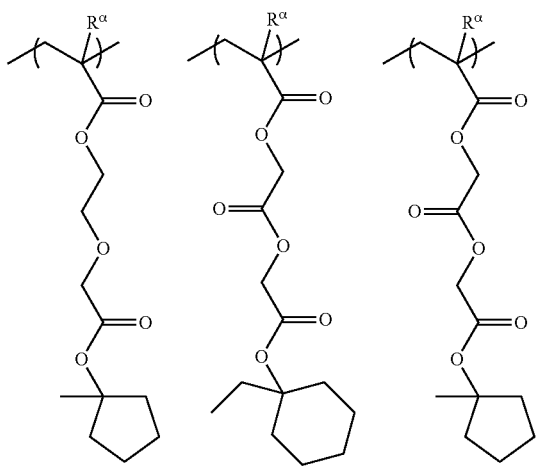

Specific examples of the constitutional unit represented by Formula (a1-2) are shown below.

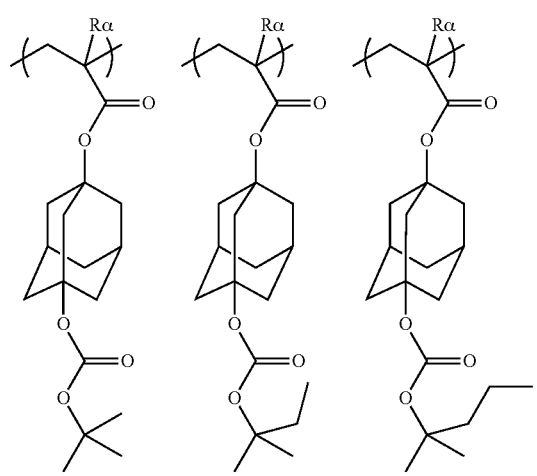

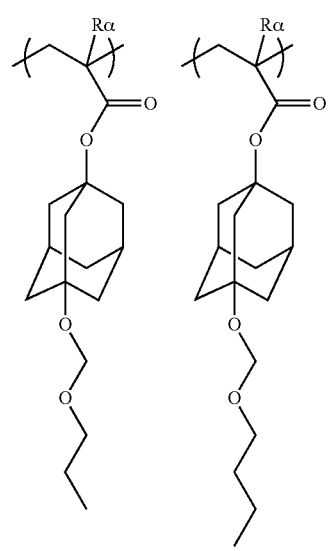

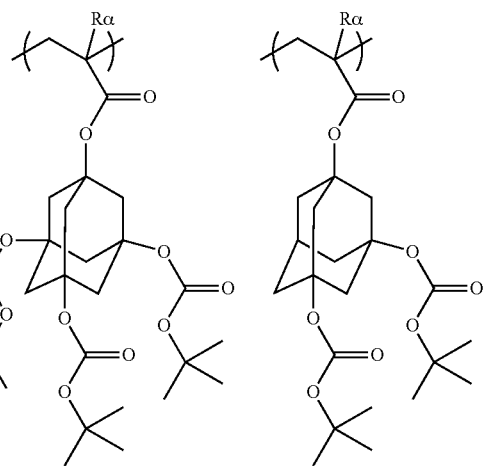

The constitutional unit (a1) included in the component (A1) may be used alone or two or more kinds thereof. Since the characteristics (the sensitivity, the shape, and the like) of the lithography using electron beams or EUV are likely to be improved, a constitutional unit represented by Formula (a1-1) is preferable as the constitutional unit (a1).

Among examples, a constitutional unit having a constitutional unit represented by Formula (a1-1-1) is particularly preferable as the constitutional unit (a1).

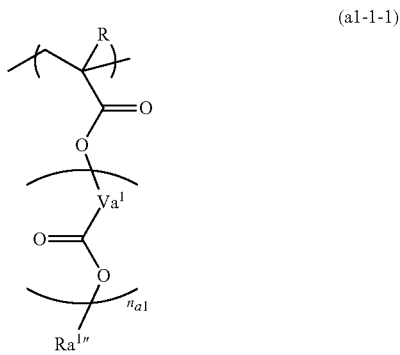

(a1-1-1)

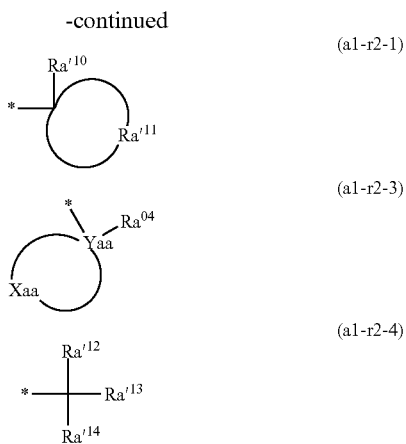

(a1-r2-1)

(a1-r2-3)

(a1-r2-4)

[In the formulae, Ra1″ represents an acid dissociable group represented by Formula (a1-r2-1), (a1-r2-3), or (a1-r2-4).]

In Formula (a1-1-1), R, $Va^1$, and $n_{a1}$ each have the same definition as that for R, $Va^1$, and $n_{a1}$ in Formula (a1-1).

The description of the acid dissociable group represented by Formula (a1-r2-1), (a1-r2-3), or (a1-r2-4) is the same as described above. Among examples of the group, since the reactivity thereof is suitably improved at the time of use for EB or EUV, it is preferable to select a constitutional unit in which the acid dissociable group is a cyclic group.

The proportion of the constitutional unit (a1) in the component (A1) is preferably in a range of 5% to 80% by mole, more preferably in a range of 10% to 75% by mole, still more preferably in a range of 30% to 70% by mole, and particularly preferably in a range of 30% to 60% by mole with respect to the total amount (100% by mole) of all constitutional units constituting the component (A1).

By setting the proportion of the constitutional unit (a1) to be greater than or equal to the lower limit of the above-described preferable range, a resist pattern can be easily obtained, and lithography characteristics of enhancing the sensitivity, the resolution, the roughness, and the like are improved. Further, by setting the proportion of the constitutional unit (a1) to be lower than or equal to the upper limit, the constitutional unit (a1) and other constitutional units can be balanced, and various lithography characteristics are improved.

<<Constitutional Unit (a10) Having Hydroxystyrene Skeleton>>

As the component (A1), a component which has a constitutional unit (a10) having a hydroxystyrene skeleton in addition to the constitutional unit (a1) is preferable.

Suitable examples of such a constitutional unit (a10) include a constitutional unit represented by Formula (a10-1).

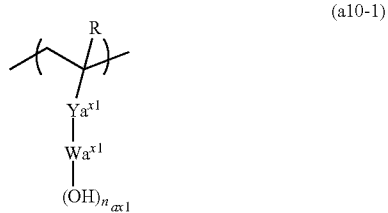

(a10-1)

[In the formulae, R represents a hydrogen atom, an alkyl group having 1 to 5 carbon atoms, or a halogenated alkyl group having 1 to 5 carbon atoms. $Ya^{x1}$ represents a single bond or a divalent linking group. $Wa^{x1}$ represents a $(n_{ax1}+1)$-valent aromatic hydrocarbon group. $n_{ax1}$ represents an integer of 1 to 3.]

In formula (a10-1), R represents a hydrogen atom, an alkyl group having 1 to 5 carbon atoms, or a halogenated alkyl group having 1 to 5 carbon atoms.

The alkyl group having 1 to 5 carbon atoms in R is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms in R is a group in which some or all hydrogen atoms of the above-described alkyl group having 1 to 5 carbon atoms have been substituted with halogen atoms. Examples of the halogen atom include a fluorine atom, a chlorine atom, a bromine atom and an iodine atom, and a fluorine atom is particularly preferable.

R represents preferably a hydrogen atom, an alkyl group having 1 to 5 carbon atoms, or a fluorinated alkyl group having 1 to 5 carbon atoms and most preferably a hydrogen atom or a methyl group from the viewpoint of industrial availability.

In Formula (a10-1), $Ya^{x1}$ represents a single bond or a divalent linking group.

Suitable examples of the divalent linking group as $Ya^{x1}$ include a divalent hydrocarbon group which may have a substituent, and a divalent linking group having a hetero atom.

Divalent Hydrocarbon Group which May have Substituent:

In a case where $Ya^{x1}$ represents a divalent hydrocarbon group which may have a substituent, the hydrocarbon group may be an aliphatic hydrocarbon group or an aromatic hydrocarbon group.

Aliphatic Hydrocarbon Group as $Ya^{x1}$

The aliphatic hydrocarbon group indicates a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof.

Linear or Branched Aliphatic Hydrocarbon Group

The number of carbon atoms in the linear aliphatic hydrocarbon group is preferably in a range of 1 to 10, more preferably in a range of 1 to 6, still more preferably in a range of 1 to 4, and most preferably in a range of 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$-] and a pentamethylene group [—$(CH_2)_5$—].

The number of carbon atoms in the branched aliphatic hydrocarbon group is preferably in a range of 2 to 10, more preferably in a range of 3 to 6, still more preferably 3 or 4, and most preferably 3.

As the branched aliphatic hydrocarbon group, a branched alkylene group is preferred, and specific examples include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —CH (CH₃)CH₂—, —CH(CH₃)CH(CH₃)—, —C(CH₃)₂CH₂—, —CH(CH₂CH₃)CH₂—, and —C(CH₂CH₃)₂—CH₂—; alkyltrimethylene groups such as —CH(CH₃)CH₂CH₂—, and —CH₂CH(CH₃)CH₂—; and alkyltetramethylene groups such as —CH(CH₃)CH₂CH₂CH₂—, and —CH₂CH (CH₃)CH₂CH₂—. As the alkyl group in the alkylalkylene group, a linear alkyl group having 1 to 5 carbon atoms is preferable.

The linear or branched aliphatic hydrocarbon group may or may not have a substituent. Examples of the substituent include a fluorine atom, a fluorinated alkyl group having 1 to 5 carbon atoms which has been substituted with a fluorine atom, and a carbonyl group.

Aliphatic Hydrocarbon Group Containing Ring in Structure Thereof

Examples of the aliphatic hydrocarbon group containing a ring in the structure thereof include a cyclic aliphatic hydrocarbon group which may have a substituent containing a hetero atom in the ring structure thereof (a group in which two hydrogen atoms have been removed from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed in a linear or branched aliphatic hydrocarbon group. As the linear or branched aliphatic hydrocarbon group, the same groups as those described above can be used.

The cyclic aliphatic hydrocarbon group has preferably 3 to 20 carbon atoms and more preferably 3 to 12 carbon atoms.

The cyclic aliphatic hydrocarbon group may be a polycyclic group or a monocyclic group. As the monocyclic alicyclic hydrocarbon group, a group in which two hydrogen atoms have been removed from a monocycloalkane is preferable. The monocycloalkane has preferably 3 to 6 carbon atoms, and specific examples thereof include cyclopentane and cyclohexane. As the polycyclic alicyclic hydrocarbon group, a group in which two hydrogen atoms have been removed from a polycycloalkane is preferable. As the polycycloalkane, a group having 7 to 12 carbon atoms is preferable. Specific examples of the polycycloalkane include adamantane, norbornane, isobornane, tricyclodecane, and tetracyclododecane.

The cyclic aliphatic hydrocarbon group may or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and a methyl group, an ethyl group, a propyl group, an n-butyl group, or a tert-butyl group is particularly preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom as the substituent include a fluorine atom, a chlorine atom, a bromine atom, and an iodine atom, and a fluorine atom is preferable.

Examples of the halogenated alkyl group as the substituent include groups in which some or all hydrogen atoms in the above-described alkyl groups have been substituted with the above-described halogen atoms.

In the cyclic aliphatic hydrocarbon group, some carbon atoms constituting the ring structure thereof may be substituted with a substituent containing a hetero atom. As the substituent containing a hetero atom, —O—, —C(=O)—O—, —S—, —S(=O)₂—, or —S(=O)₂—O— is preferable.

Aromatic Hydrocarbon Group as $Ya^{x1}$

The aromatic hydrocarbon group is a hydrocarbon group having at least one aromatic ring.

The aromatic ring is not particularly limited as long as it is a cyclic conjugated system having $(4n+2)\pi$ electrons, and may be monocyclic or polycyclic. The number of carbon atoms in the aromatic ring is preferably in a range of 5 to 30, more preferably in a range of 5 to 20, still more preferably in a range of 6 to 15, and particularly preferably in a range of 6 to 12. Here, the number of carbon atoms in a substituent is not included in the number of carbon atoms. Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which two hydrogen atoms have been removed from the above-described aromatic hydrocarbon ring or aromatic hetero ring (an aryl group or a heteroaryl group); a group in which two hydrogen atoms have been removed from an aromatic compound having two or more aromatic rings (biphenyl, fluorene or the like); and a group in which one hydrogen atom a group (an aryl group or a heteroaryl group) obtained by removing one hydrogen atom from of the above-described aromatic hydrocarbon ring or aromatic hetero ring has been substituted with an alkylene group (for example, an arylalkyl group such as a benzyl group, a phenethyl group, a 1-naphthylmethyl group, a 2-naphthylmethyl group, a 1-naphthylethyl group, or a 2-naphthylethyl group). The number of carbon atoms in the alkylene group bonded to an aryl group or a heteroaryl group is preferably in a range of 1 to 4, more preferably 1 or 2, and particularly preferably 1.

With respect to the aromatic hydrocarbon group, the hydrogen atom in the aromatic hydrocarbon group may be substituted with a substituent. For example, the hydrogen atom bonded to the aromatic ring in the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group having 1 to 5 carbon atoms, and a methyl group, an ethyl group, a propyl group, an n-butyl group, or a tert-butyl group is particularly preferable.

As the alkoxy group, the halogen atom, and the halogenated alkyl group as the substituents, the same groups as the above-described substituent groups for substituting a hydrogen atom in the cyclic aliphatic hydrocarbon group is an exemplary example.

Divalent Linking Group Containing Hetero Atom:

In a case where $Ya^{x1}$ represents a divalent linking group containing a hetero atom, preferred examples of the linking group include —O—, —C(=O)—O—, —C(=O)—, —O—C(=O)—O—, —C(=O)—NH—, —NH—, —NH—C(=NH)— (H may be substituted with a substituent such as an alkyl group, an acyl group, or the like), —S—, —S(=O)₂—, —S(=O)₂—O—, and a group represented by Formula: —$Y^{21}$—O—$Y^{22}$—, —$Y^{21}$—O—, —$Y^{21}$—C (=O)—O—, —C(=O)—O—Y²¹—, —[Y²¹—C(=O)—O]$_{m''}$—Y²²—, —Y²¹—O—C(=O)—Y²²— or —Y²¹—S(=O)₂—O—Y²²— [in the formulae, Y²¹ and Y²² each independently represent a divalent hydrocarbon group which may have a substituent, O represents an oxygen atom, and m" represents an integer of 0 to 3].

In a case where the divalent linking group containing the hetero atom is —C(=O)—NH—, —C(=O)—NH—C(=O)—, —NH— or —NH—C(=NH)—, H may be substituted with a substituent such as an alkyl group, an acyl group, or the like. The substituent (an alkyl group, an acyl group, or the like) has preferably 1 to 10 carbon atoms, more preferably 1 to 8 carbon atoms, and most preferably 1 to 5 carbon atoms.

In Formulae —Y²¹—O—Y²²—, —Y²¹—O—, —Y²¹—C(=O)—O—, —C(=O)—O—Y²¹—, —[Y²¹—C(=O)—O]$_{m''}$—Y²²—, —Y²¹—O—C(=O)—Y²²— or —Y²¹—S(=O)₂—O—Y²²—, Y²¹ and Y²² each independently represent a divalent hydrocarbon group which may have a substituent. Examples of the divalent hydrocarbon group include the same groups as those described above as the "divalent hydrocarbon group which may have a substituent" in the explanation of the above-described divalent linking group.

As Y²¹, a linear aliphatic hydrocarbon group is preferable, a linear alkylene group is more preferable, a linear alkylene group having 1 to 5 carbon atoms is still more preferable, and a methylene group or an ethylene group is particularly preferable.

As Y²², a linear or branched aliphatic hydrocarbon group is preferable, and a methylene group, an ethylene group, or an alkylmethylene group is more preferable. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[Y²¹—C(=O)—O]$_{m''}$—Y²²—, m" represents an integer of 0 to 3, preferably an integer of 0 to 2, more preferably 0 or 1, and particularly preferably 1. In other words, it is particularly preferable that the group represented by Formula —[Y²¹—C(=O)—O]$_{m''}$—Y²²— is a group represented by Formula —Y²¹—C(=O)—O—Y²²—. Among these, a group represented by Formula —(CH₂)$_{a'}$—C(=O)—O—(CH₂)$_{b'}$— is preferable. In the formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

Ya$^{x1}$ represents preferably a single bond, an ester bond [—C(=O)—O—], an ether bond (—O—), —C(=O)—NH—, a linear or branched alkylene group, or a combination of these and particularly preferably a single bond.

In Formula (a10-1), Wa$^{x1}$ represents a (n$_{ax1}$+1)-valent aromatic hydrocarbon group.

Examples of the aromatic hydrocarbon group as Wa$^{x1}$ include a group formed by removing (n$_{ax1}$+1) hydrogen atoms from an aromatic ring. The aromatic ring is not particularly limited as long as it is a cyclic conjugated system having (4n+2)π electrons, and may be monocyclic or polycyclic. The aromatic ring has preferably 5 to 30 carbon atoms, more preferably 5 to 20 carbon atoms, still more preferably 6 to 15 carbon atoms, and particularly preferably 6 to 12 carbon atoms. Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom and a nitrogen atom. Specific examples of the aromatic hetero ring include a pyridine ring and a thiophene ring.

In Formula (a10-1), n$_{ax1}$ represents an integer of 1 to 3, preferably 1 or 2, and more preferably 1.

Hereinafter, specific examples of the constitutional unit represented by Formula (a10-1) will be described.

In each formula shown below, R$^α$ represents a hydrogen atom, a methyl group, or a trifluoromethyl group.

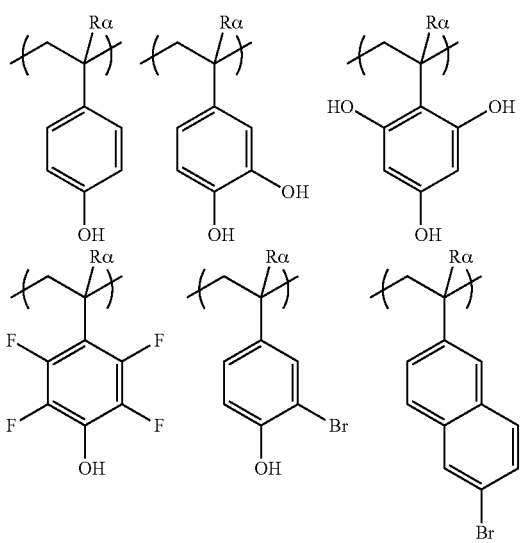

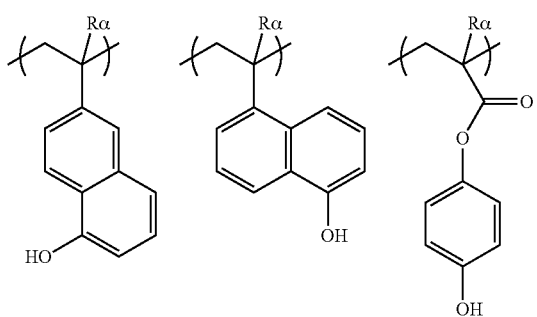

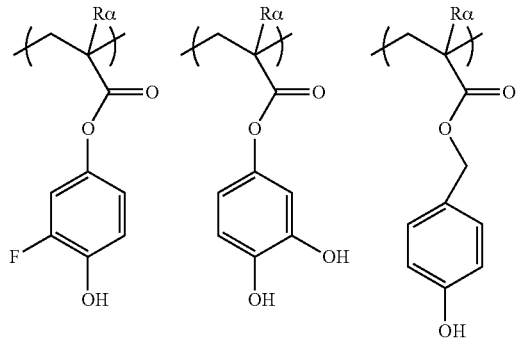

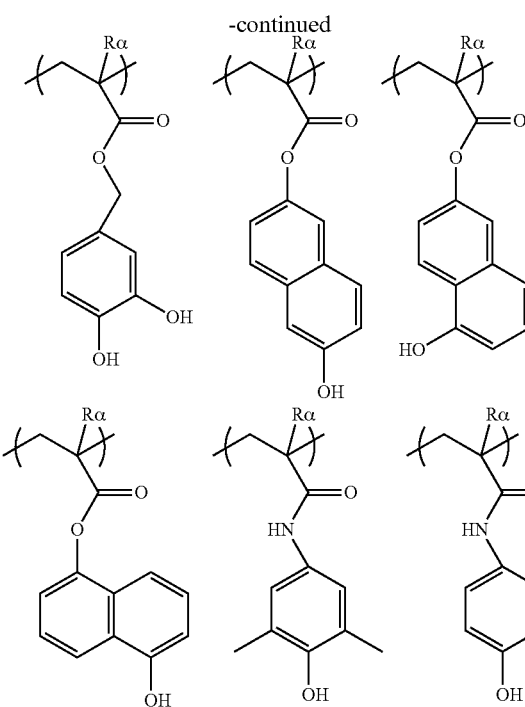

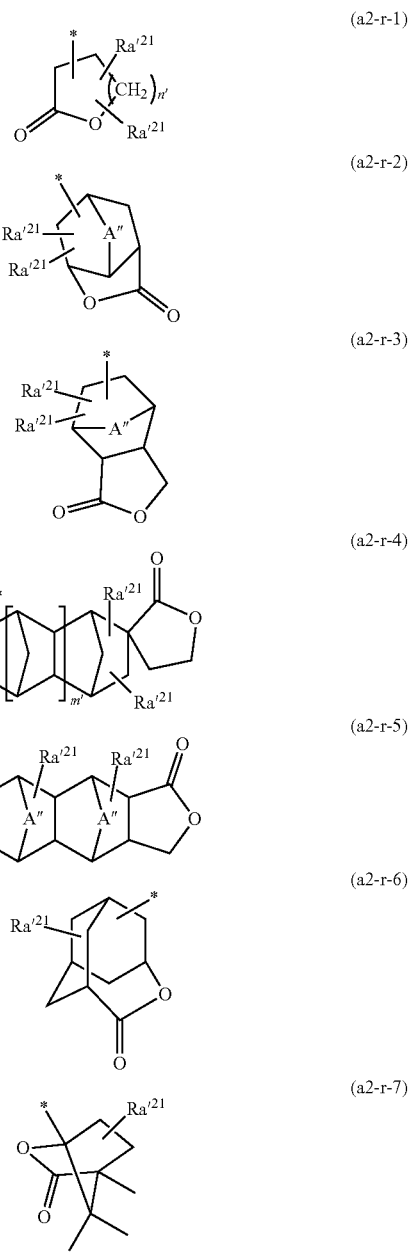

The constitutional unit (a10) included in the component (A1) may be used alone, or two or more kinds thereof may be used.

The proportion of the constitutional unit (a10) in the component (A1) is in a range of 0% to 80% by mole, preferably in a range of 10% to 80% by mole, more preferably in a range of 20% to 70% by mole, and particularly preferably in a range of 30% to 60% by mole with respect to the total amount (100% by mole) of all constitutional units constituting the component (A1).

By setting the proportion of the constitutional unit (a10) to be greater than or equal to the above-described lower limit, the lithography characteristics of enhancing the sensitivity, the resolution, the roughness, and the like are improved. Further, in a case where the proportion thereof is less than or equal to the upper limit, the constitutional unit (a10) and other constitutional units can be balanced, and various lithography characteristics are improved.

<<Constitutional Unit (a2)>>

The component (A1) may further have a constitutional unit (a2) (here, a constitutional unit corresponding to the constitutional unit (a1) or the constitutional unit (a10) is excluded) which contains a lactone-containing cyclic group, a —$SO_2$-containing cyclic group, or a carbonate-containing cyclic group, in addition to the constitutional unit (a1) or the constitutional units (a1) and (a10).

In a case where the component (A1) is used for forming a resist film, the lactone-containing cyclic group, the —$SO_2$-containing cyclic group, or the carbonate-containing cyclic group in the constitutional unit (a2) is effective for improving the adhesiveness of the resist film to the substrate. Further, in a case where the component (A1) has the constitutional unit (a2), effects of appropriately adjusting the acid diffusion length, improving the adhesiveness of the resist film to the substrate, and appropriately adjusting the solubility during the development are obtained. Therefore, the lithography characteristics and the like are improved.

The term "lactone-containing cyclic group" indicates a cyclic group that contains a ring (lactone ring) containing a —O—C(=O)— in the ring structure. In a case where the lactone ring is counted as the first ring and the group contains only the lactone ring, the group is referred to as a monocyclic group. Further, in a case where the group has other ring structures, the group is referred to as a polycyclic group regardless of the structures. The lactone-containing cyclic group may be a monocyclic group or a polycyclic group.

The lactone-containing cyclic group for the constitutional unit (a2) is not particularly limited, and an optional constitutional unit may be used. Specific examples thereof include groups represented by Formulae (a2-r-1) to (a2-r-7) shown below.

[In the formulae, each $Ra'^{21}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; and R" represents a hydrogen atom, an alkyl group, a lactone-containing cyclic group, a carbonate-containing cyclic group, or a —SO$_2$-containing cyclic group; A" represents an oxygen atom (—O—), a sulfur atom (—S—) or an alkylene group having 1 to 5 carbon atoms which may contain an oxygen atom or a sulfur atom; n' represents an integer of 0 to 2; and m' represents 0 or 1.]

In Formulae (a2-r-1) to (a2-r-7), the alkyl group as $Ra'^{21}$ is preferably an alkyl group having 1 to 6 carbon atoms. Further, the alkyl group is preferably a linear alkyl group or a branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly preferable.

The alkoxy group as $Ra'^{21}$ is preferably an alkoxy group having 1 to 6 carbon atoms.

Further, the alkoxy group is preferably a linear or branched alkoxy group. Specific examples of the alkoxy groups include a group formed by linking the above-described alkyl group as $Ra'^{21}$ to an oxygen atom (—O—).

Examples of the halogen atom as $Ra'^{21}$ include a fluorine atom, a chlorine atom, a bromine atom, and an iodine atom. Among these, a fluorine atom is preferable.

Examples of the halogenated alkyl group as $Ra'^{21}$ include groups in which some or all hydrogen atoms in the above-described alkyl group as $Ra'^{21}$ have been substituted with the above-described halogen atoms. As the halogenated alkyl group, a fluorinated alkyl group is preferable, and a perfluoroalkyl group is particularly preferable.

In —COOR" and —OC(=O)R" as $Ra'^{21}$, R" represents a hydrogen atom, an alkyl group, a lactone-containing cyclic group, a carbonate-containing cyclic group, or a —SO$_2$-containing cyclic group.

The alkyl group as R" may be linear, branched, or cyclic, and preferably has 1 to 15 carbon atoms.

In a case where R" represents a linear or branched alkyl group, it is preferably an alkyl group having 1 to 10 carbon atoms, more preferably an alkyl group having 1 to 5 carbon atoms, and most preferably a methyl group or an ethyl group.

In a case where R" represents a cyclic alkyl group, the number of carbon atoms thereof is preferably in a range of 3 to 15, more preferably in a range of 4 to 12, and most preferably in a range of 5 to 10. Specific examples thereof include groups in which one or more hydrogen atoms have been removed from a monocycloalkane, which may or may not be substituted with a fluorine atom or a fluorinated alkyl group; and groups in which one or more hydrogen atoms have been removed from a polycycloalkane such as bicycloalkane, tricycloalkane, or tetracycloalkane. More specific examples thereof include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane, or tetracyclododecane.

Examples of the lactone-containing cyclic group as R" include those provided as exemplary examples of the groups represented by Formulae (a2-r-1) to (a2-r-7).

The carbonate-containing cyclic group as R" has the same definition as that for the carbonate-containing cyclic group described below. Specific examples of the carbonate-containing cyclic group include groups represented by Formulae (ax3-r-1) to (ax3-r-3).

The —SO$_2$-containing cyclic group as R" has the same definition as that for the —SO$_2$-containing cyclic group described below. Specific examples of the —SO$_2$-containing cyclic group include groups represented by Formulae (a5-r-1) to (a5-r-4).

The hydroxyalkyl group as $Ra'^{21}$ has preferably 1 to 6 carbon atoms, and specific examples thereof include a group in which at least one hydrogen atom in the alkyl group as $Ra'^{21}$ has been substituted with a hydroxyl group.

In Formulae (a2-r-2), (a2-r-3) and (a2-r-5), as the alkylene group having 1 to 5 carbon atoms as A", a linear or branched alkylene group is preferable, and examples thereof include a methylene group, an ethylene group, an n-propylene group, and an isopropylene group. Examples of alkylene groups that contain an oxygen atom or a sulfur atom include groups in which —O— or —S— is interposed in the terminal of the alkylene group or between the carbon atoms of the alkylene group, and examples thereof include —O—CH$_2$—, —CH$_2$—O—CH$_2$—, —S—CH$_2$—, and —CH$_2$—S—CH$_2$—. As A", an alkylene group having 1 to 5 carbon atoms or —O— is preferable, an alkylene group having 1 to 5 carbon atoms is more preferable, and a methylene group is most preferable.

Specific examples of the groups represented by Formulae (a2-r-1) to (a2-r-7) are shown below.

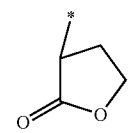

(r-lc-1-1)

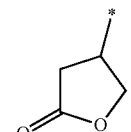

(r-lc-1-2)

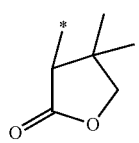

(r-lc-1-3)

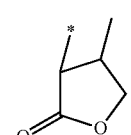

(r-lc-1-4)

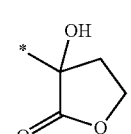

(r-lc-1-5)

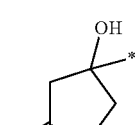

(r-lc-1-6)

-continued
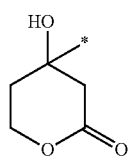
(r-lc-1-7)
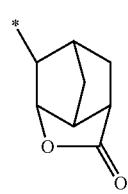
(r-lc-2-1)
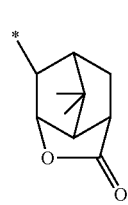
(r-lc-2-2)
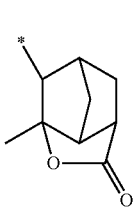
(r-lc-2-3)
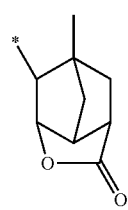
(r-lc-2-4)
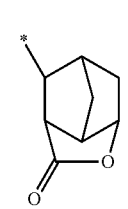
(r-lc-2-5)
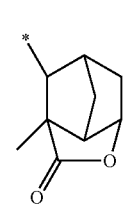
(r-lc-2-6)
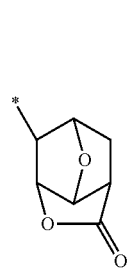
(r-lc-2-7)
-continued
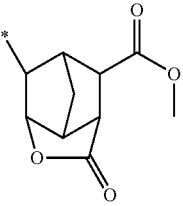
(r-lc-2-8)
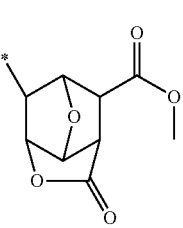
(r-lc-2-9)
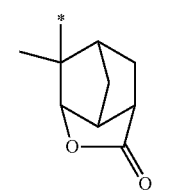
(r-lc-2-10)
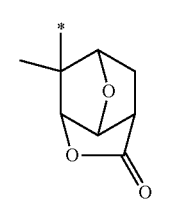
(r-lc-2-11)
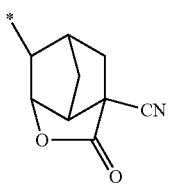
(r-lc-2-12)
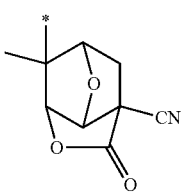
(r-lc-2-13)
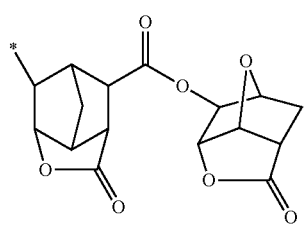
(r-lc-2-14)

-continued (r-lc-2-15)

(r-lc-2-16)

(r-lc-2-17)

(r-lc-2-18)

(r-lc-3-1)

(r-lc-3-2)

(r-lc-3-3)

-continued (r-lc-3-4)

(r-lc-3-5)

(r-lc-4-1)

(r-lc-4-2)

(r-lc-4-3)

(r-lc-4-4)

(r-lc-4-5)

(r-lc-4-6)

(r-lc-4-7)

(r-lc-4-8)

(r-lc-4-9) 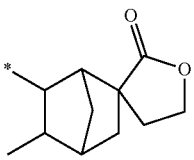

(r-lc-5-1) 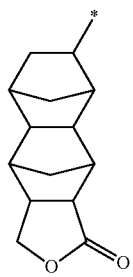

(r-lc-5-2) 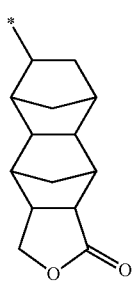

(r-lc-5-3) 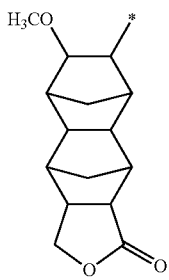

(r-lc-5-4) 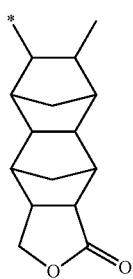

(r-lc-6-1) 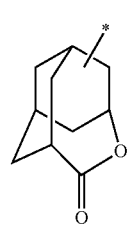

(r-lc-7-1) 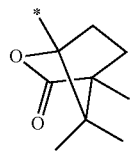

The "—$SO_2$-containing cyclic group" indicates a cyclic group having a ring containing —$SO_2$— in the ring structure thereof. Specifically, the —$SO_2$-containing cyclic group is a cyclic group in which the sulfur atom (S) in —$SO_2$— forms a part of the ring skeleton of the cyclic group. In a case where the ring containing —$SO_2$— in the ring skeleton thereof is counted as the first ring and the group contains only the ring, the group is referred to as a monocyclic group. Further, in a case where the group has other ring structures, the group is referred to as a polycyclic group regardless of the structures. The —$SO_2$-containing cyclic group may be a monocyclic group or a polycyclic group.

As the —$SO_2$-containing cyclic group, a cyclic group containing —O—$SO_2$— in the ring skeleton thereof, in other words, a cyclic group containing a sultone ring in which —O—S— in the —O—$SO_2$— group forms a part of the ring skeleton thereof is particularly preferable.

More specific examples of the —$SO_2$-containing cyclic group include groups represented by Formulae (a5-r-1) to (a5-r-4) shown below.

(a5-r-1) 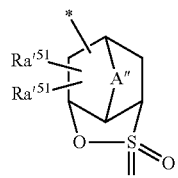

(a5-r-2) 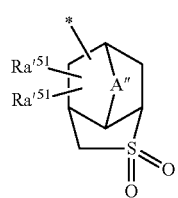

(a5-r-3) 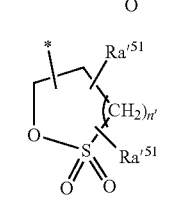

(a5-r-4) 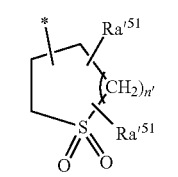

[In the formulae, each $Ra'^{51}$ independently represents a hydrogen atom, an alkyl group, an alkoxy group, a halogen atom, a halogenated alkyl group, a hydroxyl group, —COOR", —OC(═O)R", a hydroxyalkyl group, or a cyano group. R" represents a hydrogen atom, an alkyl group, a lactone-containing cyclic group, a carbonate-containing cyclic group, or a —SO$_2$-containing cyclic group. A" represents an oxygen atom, a sulfur atom or an alkylene group having 1 to 5 carbon atoms which may contain an oxygen atom or a sulfur atom. n' represents an integer of 0 to 2.]

In Formulae (a5-r-1) and (a5-r-2), A" has the same definition as that for A" in Formulae (a2-r-2), (a2-r-3) and (a2-r-5).

Examples of the alkyl group, the alkoxy group, the halogen atom, the halogenated alkyl group, —COOR", —OC(=O)R", and the hydroxyalkyl group as Ra'$^{51}$ include the same groups as those described above in the explanation of Ra'$^{21}$ in Formulae (a2-r-1) to (a2-r-7).

Specific examples of the groups represented by Formulae (a5-r-1) to (a5-r-4) are shown below. In the formulae shown below, "Ac" represents an acetyl group.

(r-sl-1-1)
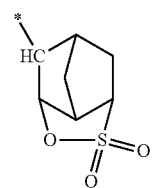

(r-sl-1-2)
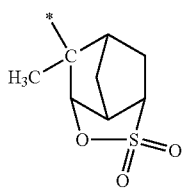

(r-sl-1-3)
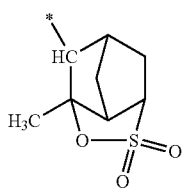

(r-sl-1-4)
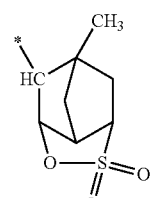

(r-sl-1-5)
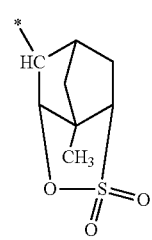

(r-sl-1-6)
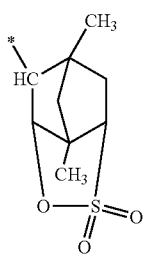

(r-sl-1-7)
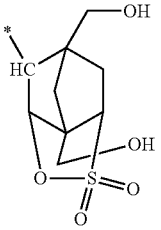

(r-sl-1-8)
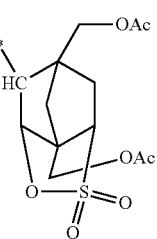

(r-sl-1-9)
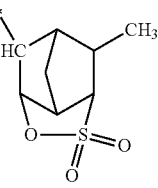

(r-sl-1-10)
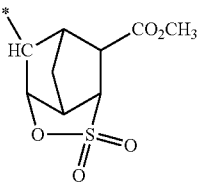

(r-sl-1-11)
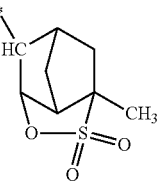

(r-sl-1-12)

(r-sl-1-13)
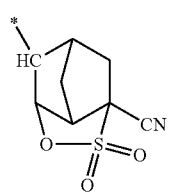
(r-sl-1-14)
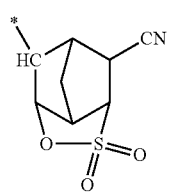
(r-sl-1-15)
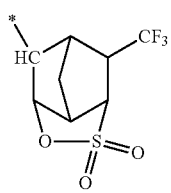
(r-sl-1-16)
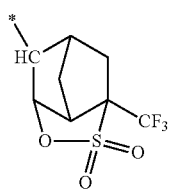
(r-sl-1-17)
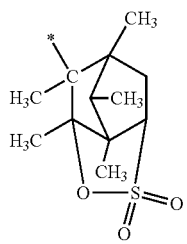
(r-sl-1-18)
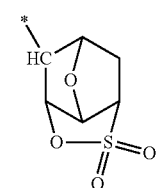
(r-sl-1-19)
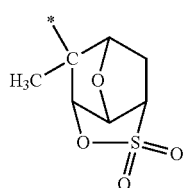
(r-sl-1-20)
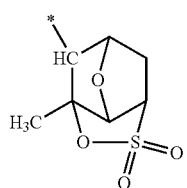
(r-sl-1-21)
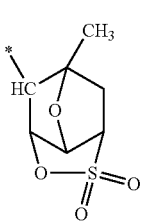
(r-sl-1-22)
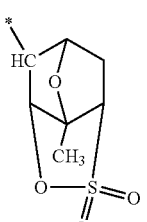
(r-sl-1-23)
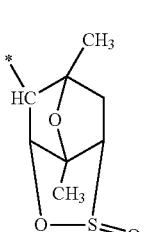
(r-sl-1-24)
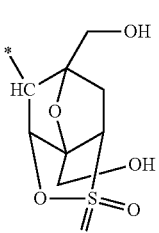
(r-sl-1-25)
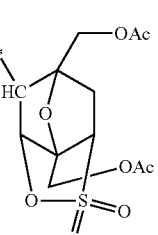
(r-sl-1-26)
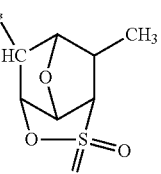
(r-sl-1-27)
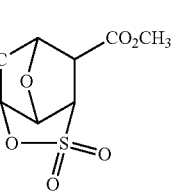

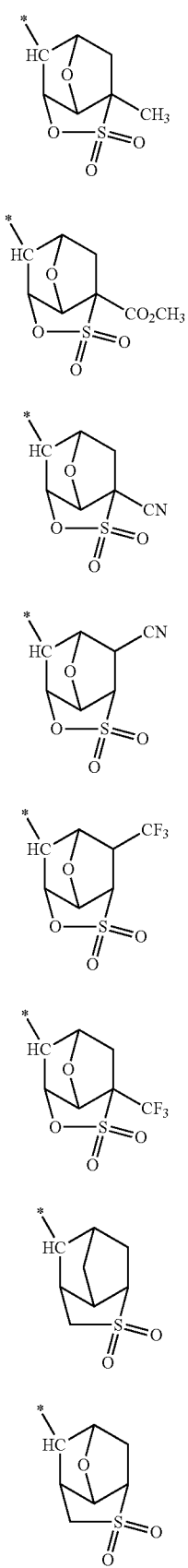

(r-sl-1-28)
(r-sl-1-29)
(r-sl-1-30)
(r-sl-1-31)
(r-sl-1-32)
(r-sl-1-33)
(r-sl-2-1)
(r-sl-2-2)

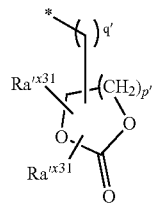

(r-sl-3-1)

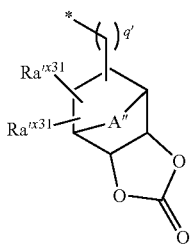

(r-sl-4-1)

The "carbonate-containing cyclic group" indicates a cyclic group having a ring (a carbonate ring) containing —O—C(=O)—O— in the ring structure thereof. In a case where the carbonate ring is counted as the first ring and the group contains only the carbonate ring, the group is referred to as a monocyclic group. Further, in a case where the group has other ring structures, the group is referred to as a polycyclic group regardless of the structures. The carbonate-containing cyclic group may be a monocyclic group or a polycyclic group.

The carbonate ring-containing cyclic group is not particularly limited, and an optional group may be used. Specific examples thereof include groups represented by Formulae (ax3-r-1) to (ax3-r-3) shown below.

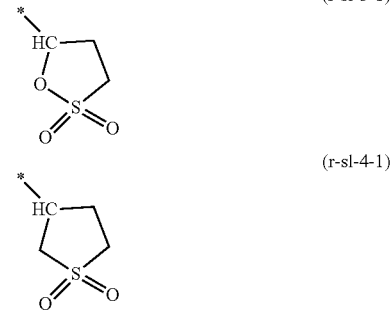

(ax3-r-1)

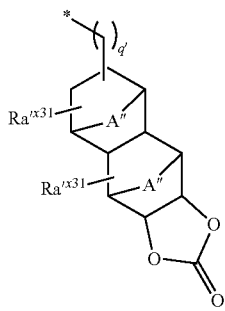

(ax3-r-2)

(ax3-r-3)

[In the formulae, each $Ra'^{x31}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group. R" represents a hydrogen atom, an alkyl group, a lactone-containing cyclic group, a carbonate-containing cyclic group, or a —SO$_2$-containing cyclic group. A" represents an oxygen atom, a sulfur atom or an alkylene group having 1 to 5 carbon atoms which may contain an oxygen atom or a sulfur atom. p' represents an integer of 0 to 3, and q' represents 0 or 1.]

In Formulae (ax3-r-2) and (ax3-r-3), A" has the same definition as that for A" in Formulae (a2-r-2), (a2-r-3) and (a2-r-5).

Examples of the alkyl group, the alkoxy group, the halogen atom, the halogenated alkyl group, —COOR", —OC(=O)R", and the hydroxyalkyl group as Ra'$^{31}$ include the same groups as those described above in the explanation of Ra'$^{21}$ in Formulae (a2-r-1) to (a2-r-7).

Specific examples of the groups represented by Formulae (ax3-r-1) to (ax3-r-3) are shown below.

(r-cr-1-1)
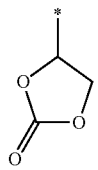

(r-cr-1-2)
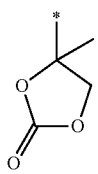

(r-cr-1-3)
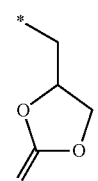

(r-cr-1-4)
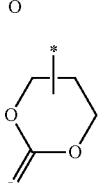

(r-cr-1-5)
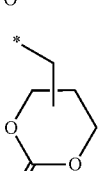

(r-cr-1-6)
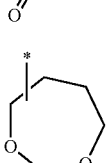

(r-cr-1-7)
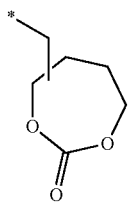

(r-cr-2-1)
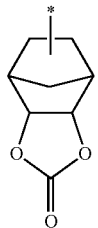

(r-cr-2-2)
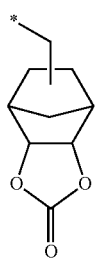

(r-cr-2-3)
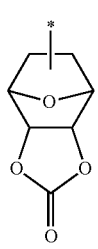

(r-cr-2-4)
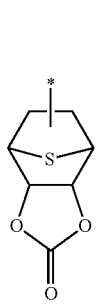

(r-cr-3-1)
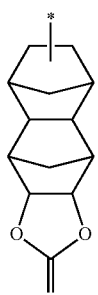

(r-cr-3-2)
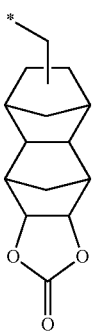

(r-cr-3-3)
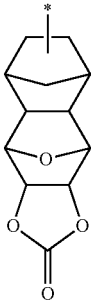

(r-cr-3-4)
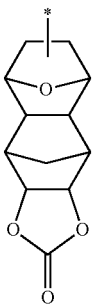

(r-cr-3-5)

As the constitutional unit (a2), a constitutional unit derived from acrylic acid ester in which the hydrogen atom bonded to the carbon atom at the α-position may be substituted with a substituent is preferable.

Specific preferred examples of such a constitutional unit (a2) include a constitutional unit represented by Formula (a2-1) shown below.

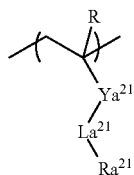
(a2-1)

[In the formula, R represents a hydrogen atom, an alkyl group having 1 to 5 carbon atoms, or a halogenated alkyl group having 1 to 5 carbon atoms. $Ya^{21}$ represents a single bond or a divalent linking group. $La^{21}$ represents —O—, —COO—, —CON(R')—, —OCO—, —CONHCO— or —CONHCS—. R' represents a hydrogen atom or a methyl group; provided that, in a case where $La^{21}$ represents —O—, $Ya^{21}$ does not represents —CO—. $Ra^{21}$ represents a lactone-containing cyclic group, a carbonate-containing cyclic group, or a —$SO_2$-containing cyclic group.]

In Formula (a2-1), R has the same definition as described above. R represents preferably a hydrogen atom, an alkyl group having 1 to 5 carbon atoms, or a fluorinated alkyl group having 1 to 5 carbon atoms and most preferably a hydrogen atom or a methyl group from the viewpoint of industrial availability.

In Formula (a2-1), the divalent linking group as $Ya^{21}$ is not particularly limited, and suitable examples thereof include a divalent hydrocarbon group which may have a substituent and a divalent linking group having hetero atoms. The description of the divalent hydrocarbon group which may have a substituent and the divalent linking group having a hetero atom as $Ya^{21}$ is the same as the description of the divalent linking groups (the divalent hydrocarbon group which may have a substituent and the divalent linking group having a hetero atom) as $Ya^{x1}$ in Formula (a10-1).

As $Ya^{21}$, a single bond, an ester bond [—C(=O)—O—], an ether bond (—O—), a linear or branched alkylene group, or a combination of these is preferable.

In Formula (a2-1), $Ra^{21}$ represents a lactone-containing cyclic group, a —$SO_2$-containing cyclic group, or a carbonate-containing cyclic group.

Preferred examples of the lactone-containing cyclic group, the —$SO_2$-containing cyclic group, and the carbonate-containing cyclic group as $Ra^{21}$ include groups represented by Formulae (a2-r-1) to (a2-r-7), groups represented by Formulae (a5-r-1) to (a5-r-4), and groups represented by Formulae (ax3-r-1) to (ax3-r-3).

Among the examples, $Ra^{21}$ represents preferably a lactone-containing cyclic group or a —$SO_2$-containing cyclic group and more preferably a group represented by Formula (a2-r-1), (a2-r-2), (a2-r-6) or (a5-r-1). Specifically, a group represented by any of chemical Formulae (r-1c-1-1) to (r-1c-1-7), (r-1c-2-1) to (r-1c-2-18), (r-1c-6-1), (r-s1-1-1), and (r-s1-1-18) is still more preferable.

The constitutional unit (a2) included in the component (A1) may be used alone, or two or more kinds thereof may be used.

In a case where the component (A1) has the constitutional unit (a2), the proportion of the constitutional unit (a2) in the component (A1) is preferably in a range of 5% to 60% by mole, more preferably in a range of 10% to 60% by mole, still more preferably in a range of 20% to 55% by mole, and even more preferably in a range of 30% to 50% by mole with respect to the total amount (100% by mole) of all constitutional units constituting the component (A1).

In a case where the proportion of the constitutional unit (a2) is greater than or equal to the above-described preferable lower limit, the effect obtained by allowing the component (A1) to contain the constitutional unit (a2) can be satisfactorily achieved due to the above-described effects. In addition, in a case where the proportion of the constitutional unit (a2) is less than or equal to the upper limit, the constitutional unit (a2) and other constitutional units can be balanced, and various lithography characteristics are improved.

<<Constitutional Unit (a3)>>

The component (A1) may further have a constitutional unit (a3) containing a polar group-containing aliphatic hydrocarbon group (here, a constitutional unit corresponding to the constitutional unit (a1), the constitutional unit (a10), or the constitutional unit (a2) is excluded) in addition to the constitutional unit (a1) or the constitutional units (a1) and (a10). In a case where the component (A1) includes the constitutional unit (a3), the hydrophilicity of the component (A) is enhanced, and this contributes to improvement of the resolution. Further, the acid diffusion length can be appropriately adjusted.

Examples of the polar group include a hydroxyl group, a cyano group, a carboxyl group, or a hydroxyalkyl group in which some hydrogen atoms of the alkyl group have been substituted with fluorine atoms. Among these, a hydroxyl group is particularly preferable.

Examples of the aliphatic hydrocarbon group include linear or branched hydrocarbon groups (preferably alkylene groups) having 1 to 10 carbon atoms, and cyclic aliphatic hydrocarbon groups (cyclic groups). The cyclic group may be a monocyclic group or a polycyclic group. For example, these cyclic groups can be selected appropriately from the multitude of groups that have been proposed for the resins of resist compositions for ArF excimer lasers.

In a case where the cyclic group is a monocyclic group, the carbon atoms in the group is more preferably in a range of 3 to 10. Among the examples, constitutional units derived from acrylic acid ester that include an aliphatic monocyclic group containing a hydroxyl group, cyano group, carboxyl group, or a hydroxyalkyl group in which some hydrogen atoms of the alkyl group have been substituted with fluorine atoms are particularly preferable. As the monocyclic group, a group formed by removing two or more hydrogen atoms from a monocycloalkane is an exemplary example. Specific examples thereof include a group formed by removing two or more hydrogen atoms from a monocycloalkane such as cyclopentane, cyclohexane, or cyclooctane. Among these monocyclic groups, a group formed by removing two or more hydrogen atoms from a80 monocyclic groups, a group formed by removing two or more hydrogen atoms from a cyclopentane or a group formed by removing two or more hydrogen atoms from a cyclohexane is preferable industrially.

In a case where the cyclic group is a polycyclic group, the carbon atoms in the polycyclic group is more preferably in a range of 7 to 30. Among the examples, constitutional units derived from acrylic acid ester that include an aliphatic polycyclic group containing a hydroxyl group, cyano group, carboxyl group, or a hydroxyalkyl group in which some hydrogen atoms of the alkyl group have been substituted with fluorine atoms are particularly preferable. Examples of the polycyclic group include groups in which two or more hydrogen atoms have been removed from a bicycloalkane, tricycloalkane, tetracycloalkane or the like. Specific examples thereof include groups in which two or more hydrogen atoms have been removed from a polycycloalkane such as adamantane, norbornane, isobornane, tricyclodecane or tetracyclododecane. Among these polycyclic groups, groups in which two or more hydrogen atoms have been removed from adamantane, groups in which two or more hydrogen atoms have been removed from norbornane or groups in which two or more hydrogen atoms have been removed from tetracyclododecane are preferred industrially.

The constitutional unit (a3) is not particularly limited as long as the constitutional unit contains a polar group-containing aliphatic hydrocarbon group, and an optional constitutional unit may be used.

The constitutional unit (a3) is a constitutional unit derived from acrylic acid ester in which the hydrogen atom bonded to the carbon atom at the α-position may be substituted with a substituent, and a constitutional unit containing a polar group-containing aliphatic hydrocarbon group is preferable.

In a case where the hydrocarbon group in the polar group-containing aliphatic hydrocarbon group is a linear or branched hydrocarbon group having 1 to 10 carbon atoms, a constitutional unit derived from hydroxyethyl ester of acrylic acid is preferable as the constitutional unit (a3).

In addition, in a case where the hydrocarbon group in the polar group-containing aliphatic hydrocarbon group is a polycyclic group, a constitutional unit represented by Formula (a3-1), a constitutional unit represented by Formula (a3-2), or a constitutional unit represented by Formula (a3-3) shown below is preferable as the constitutional unit (a3). Further, in a case where the hydrocarbon group is a monocyclic group, a constitutional unit represented by Formula (a3-4) is preferable as the constitutional unit (a3).

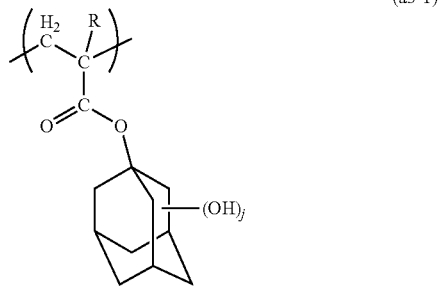

(a3-1)

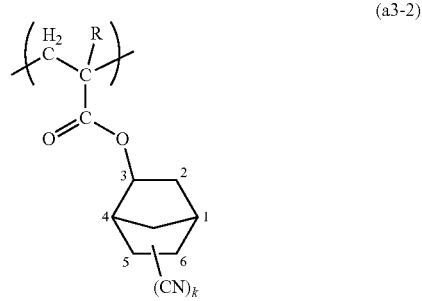

(a3-2)

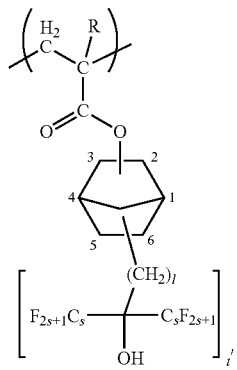

(a3-3)

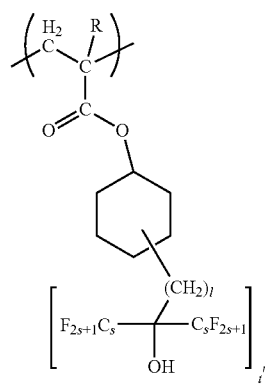

(a3-4)

[In the formulae, R has the same definition as described above, j represents an integer of 1 to 3, k represents an integer of 1 to 3, t' represents an integer of 1 to 3, l represents an integer of 0 to 5, and s represents an integer of 1 to 3.]

In Formula (a3-1), j represents preferably 1 or 2 and more preferably 1. In a case where j represents 2, it is preferable that the hydroxyl group is bonded to the third and fifth positions of the adamantyl group. In a case where j represents 1, it is preferable that the hydroxyl group is bonded to the third position of the adamantyl group.

j represents preferably 1, and it is particularly preferable that the hydroxyl group is bonded to the third position of the adamantyl group.

In Formula (a3-2), k represents preferably 1. The cyano group is preferably bonded to the fifth or sixth position of the norbornyl group.

In Formula (a3-3), t' represents preferably 1. l represents preferably 1. s represents preferably 1. Further, it is preferable that a 2-norbornyl group or 3-norbornyl group is bonded to the terminal of the carboxy group of the acrylic acid. The fluorinated alkyl alcohol is preferably bonded to the fifth or sixth position of the norbornyl group.

In Formula (a3-4), t' represents preferably 1 or 2. l represents preferably 0 or 1. s represents preferably 1. It is preferable that the fluorinated alkyl alcohol is bonded to the third or fifth position of the cyclohexyl group.

The constitutional unit (a3) included in the component (A1) may be used alone, or two or more kinds thereof may be used.

In a case where the component (A1) has the constitutional unit (a3), the proportion of the constitutional unit (a3) is preferably in a range of 1% to 30% by mole, more preferably in a range of 2% to 25% by mole, and still more preferably in a range of 5% to 20% by mole with respect to the total amount (100% by mole) of all constitutional units constituting the component (A1).

In a case where the proportion of the constitutional unit (a3) is greater than or equal to the above-described preferable lower limit, the effect obtained by allowing the component (A1) to contain the constitutional unit (a3) can be satisfactorily achieved due to the above-described effects. In addition, in a case where the proportion of the constitutional unit (a3) is less than or equal to the above-described preferable upper limit, the constitutional unit (a3) and other constitutional units can be balanced, and various lithography characteristics are improved.

<<Constitutional Unit (a9)>>

The component (A1) may further have a constitutional unit (a9) represented by Formula (a9-1) in addition to the constitutional unit (a1) or the constitutional units (a1) and (a10).

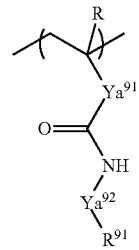

(a9-1)

[In the formulae, R represents a hydrogen atom, an alkyl group having 1 to 5 carbon atoms, or a halogenated alkyl group having 1 to 5 carbon atoms. $Ya^{91}$ represents a single bond or a divalent linking group. $Ya^{92}$ represents a divalent linking group. $R^{91}$ represents a hydrocarbon group which may have a substituent.]

In Formula (a9-1), R has the same definition as described above.

R represents preferably a hydrogen atom, an alkyl group having 1 to 5 carbon atoms, or a fluorinated alkyl group having 1 to 5 carbon atoms and most preferably a hydrogen atom or a methyl group from the viewpoint of industrial availability.

In Formula (a9-1), examples of the divalent linking group as $Ya^{91}$ are the same as those for the divalent linking groups (the divalent hydrocarbon group which may have a substituent and the divalent linking group having a hetero atom) as $Ya^{x1}$ in Formula (a10-1). Among these, it is preferable that $Ya^{91}$ represents a single bond.

In Formula (a9-1), examples of the divalent linking group as $Ya^{92}$ are the same as those for the divalent linking groups (the divalent hydrocarbon group which may have a substituent and the divalent linking group having a hetero atom) as $Ya^{x1}$ in Formula (a10-1).

In the divalent linking group as $Ya^{92}$, a linear or branched aliphatic hydrocarbon group is preferable as the divalent hydrocarbon group which may have a substituent.

In a case where $Ya^{92}$ represents a divalent linking group, preferred examples of the linking group containing a hetero atom include —O—, —C(=O)—O—, —C(=O)—, —O—C(=O)—O—, —C(=O)—NH—, —NH—, —NH—C(=NH)— (H may be substituted with a substituent such as an alkyl group, an acyl group, or the like), —S—, —S(=O)$_2$—, —S(=O)$_2$—O—, —C(=S)—, and a group represented by Formula: —$Y^{21}$—O—$Y^{22}$—, —$Y^{21}$—O—, —Y²¹—C(=O)—O—, —C(=O)—O—Y²¹—, —[Y21-C(=O)—O]ₘ'—Y²²—, or —Y²¹—O—C(=O)—Y²²— or [in the formulae, Y²¹ and Y²² each independently represent a divalent hydrocarbon group which may have a substituent, O represents an oxygen atom, and m' represents an integer of 0 to 3]. Among these, —C(=O)— or —C(=S)— is preferable.

In Formula (a9-1), examples of the hydrocarbon group as $R^{91}$ include an alkyl group, a monovalent alicyclic hydrocarbon group, an aryl group, and an aralkyl group.

The alkyl group as $R^{91}$ has preferably 1 to 8 carbon atoms, more preferably 1 to 6 carbon atoms, still more preferably 1 to 4 carbon atoms and may be linear or branched. Specific preferred examples thereof include a methyl group, an ethyl group, a propyl group, a butyl group, a hexyl group, and an octyl group.

The monovalent alicyclic hydrocarbon group as $R^{91}$ has preferably 3 to 20 carbon atoms, more preferably 3 to 12 carbon atoms and may be linear or branched. As the monocyclic alicyclic hydrocarbon group, a group in which one or more hydrogen atoms have been removed from a monocycloalkane is preferable. The monocycloalkane has preferably 3 to 6 carbon atoms, and specific examples thereof include cyclobutane, cyclopentane and cyclohexane. As the polycyclic alicyclic group, a group in which one or more hydrogen atoms have been removed from a polycycloalkane is preferable. As the polycycloalkane, a group having 7 to 12 carbon atoms is preferable. Specific examples of the polycycloalkane include adamantane, norbornane, isobornane, tricyclodecane, and tetracyclododecane.

The aryl group as $R^{91}$ has preferably 6 to 18 carbon atoms and more preferably 6 to 10 carbon atoms. Specifically, a phenyl group is particularly preferable as the aryl group.

As the aralkyl group as $R^{91}$, an aralkyl group formed by bonding an alkylene group having 1 to 8 carbon atoms and the "aryl group as $R^{91}$" to each other is preferable, an aralkyl group formed by bonding an alkylene group having 1 to 6 carbon atoms and the "aryl group as $R^{91}$" to each other is more preferable, and an aralkyl group formed by bonding an alkylene group having 1 to 4 carbon atoms and the "aryl group as $R^{91}$" to each other is particularly preferable.

In the hydrocarbon group as $R^{91}$, it is preferable that some or all hydrogen atoms in the hydrocarbon group are substituted with fluorine atoms and more preferable that 30% to 100% of hydrogen atoms in the hydrocarbon group are substituted with fluorine atoms. Among these, a perfluoroalkyl group in which all hydrogen atoms in the alkyl group have been substituted with fluorine atoms is particularly preferable.

The hydrocarbon group as $R^{91}$ may have a substituent. Examples of the substituent include a halogen atom, an oxo group (=O), a hydroxyl group (—OH), an amino group (—NH₂), and —SO₂—NH₂. Further, some carbon atoms constituting the hydrocarbon group may be substituted with a substituent having heteroatoms. Examples of the substituent having heteroatoms include —O—, —NH—, —N=, —C(=O)—O—, —S—, —S(=O)₂—, and —S(=O)₂—O—.

Examples of the hydrocarbon group having a substituent as $R^{91}$ include lactone-containing cyclic groups respectively represented by Formulae (a2-r-1) to (a2-r-7).

Further, examples of the hydrocarbon group having a substituent as $R^{91}$ include —SO₂-containing cyclic groups respectively represented by Formulae (a5-r-1) to (a5-r-4), a substituted aryl group represented by the following chemical formula, and a monovalent heterocyclic group.

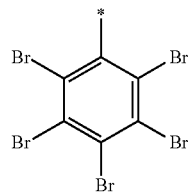
(r-ar-1)

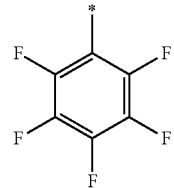
(r-ar-2)

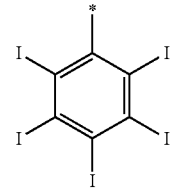
(r-ar-3)

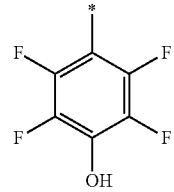
(r-ar-4)

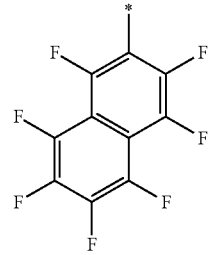
(r-ar-5)

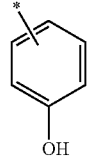
(r-ar-6)

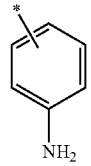
(r-ar-7)

(r-ar-8) 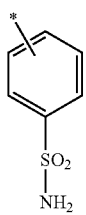

(r-hr-1) 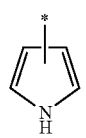

(r-hr-2) 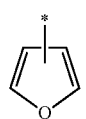

(r-hr-3) 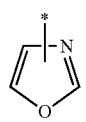

(r-hr-4) 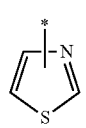

(r-hr-5) 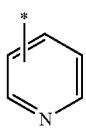

(r-hr-6) 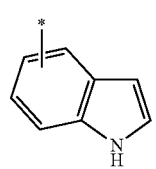

(r-hr-7) 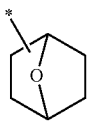

(r-hr-8) 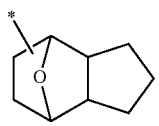

(r-hr-9) 

(r-hr-10) 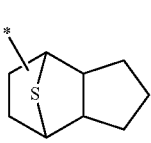

(r-hr-11) 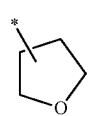

(r-hr-12) 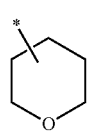

(r-hr-13) 

(r-hr-14) 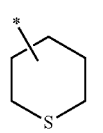

(r-hr-15) 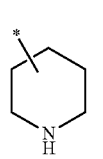

(r-hr-16) 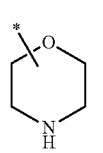

Among examples of the constituent unit (a9), a constitutional unit represented by Formula (a9-1-1) is preferable.

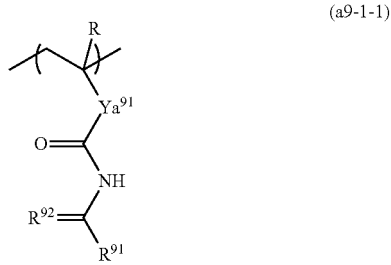

(a9-1-1)

[In the formula, R has the same definition as described above, $Ya^{91}$ represents a single bond or a divalent linking group, $R^{91}$ represents a hydrocarbon group which may have a substituent, and $R^{92}$ represents an oxygen atom or a sulfur atom.]

In Formula (a9-1-1), $Ya^{91}$, $R^{91}$, and R each have the same definition as described above.

Further, $R^{92}$ represents an oxygen atom or a sulfur atom.

Hereinafter, specific examples of the constitutional unit represented by Formula (a9-1) or (a9-1-1) will be described. In the formula describe below", $R^{\alpha}$ represents a hydrogen atom, a methyl group, or a trifluoromethyl group.

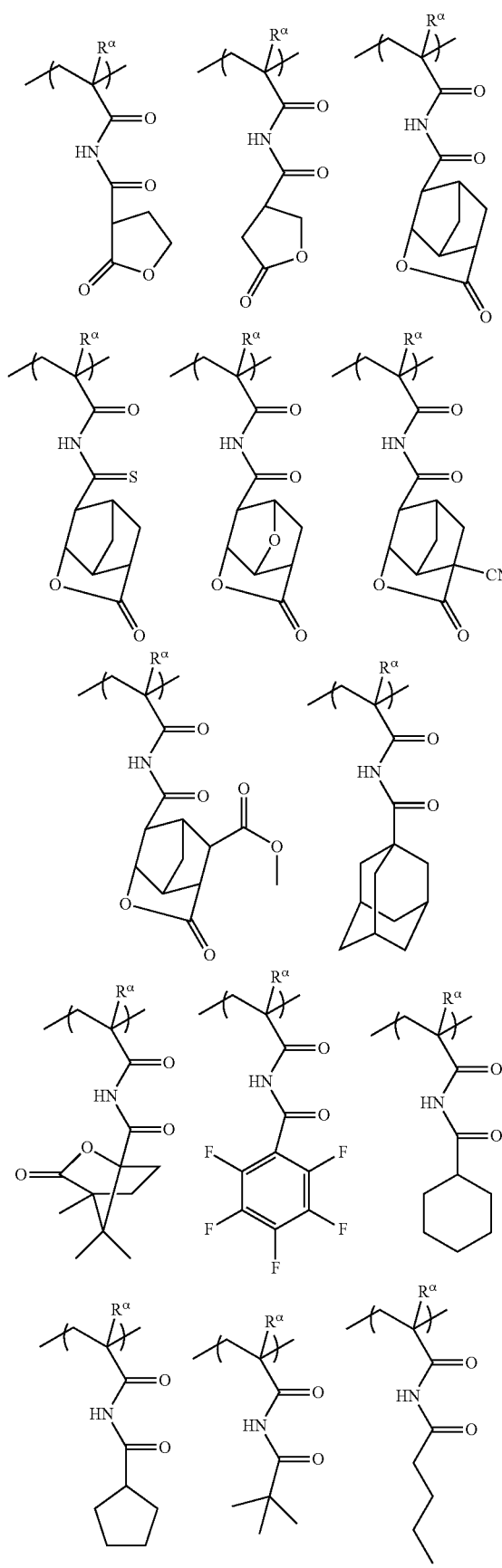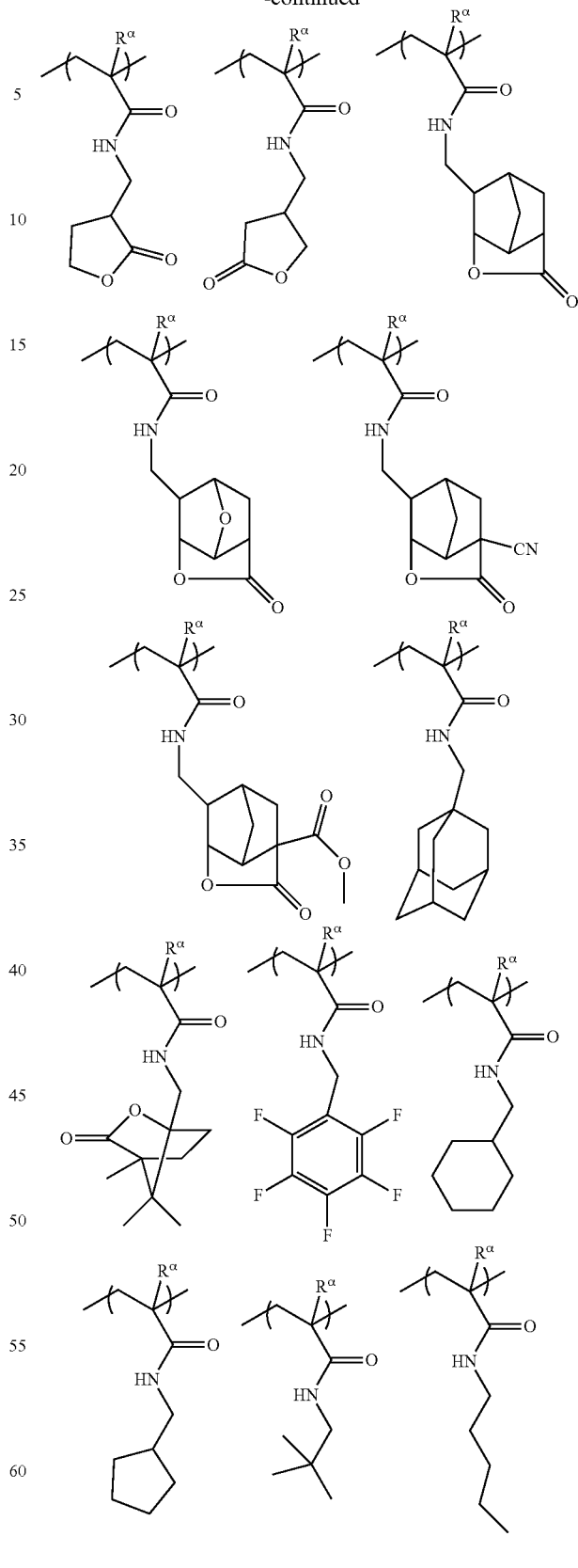
The constitutional unit (a9) included in the component (A1) may be used alone, or two or more kinds thereof may be used.

In a case where the component (A1) has the constitutional unit (a9), the proportion of the constitutional unit (a9) in the component (A1) is preferably in a range of 1% to 40% by mole, more preferably in a range of 3% to 30% by mole, still more preferably in a range of 5% to 25% by mole, and even more preferably in a range of 10% to 20% by mole with respect to the total amount (100% by mole) of all constitutional units constituting the component (A1).

In a case where the proportion of the constitutional unit (a9) is greater than or equal to the lower limit, for example, effects of appropriately adjusting the acid diffusion length, improving the adhesiveness of the resist film to the substrate, appropriately adjusting the solubility during the development, and improving the etching resistance are obtained. In a case where the proportion thereof is less than or equal to the upper limit, the constitutional unit (a9) and other constitutional units can be balanced, and various lithography characteristics are improved.

The component (A1) contained in the resist composition may be used alone or in combination of two or more kinds thereof.

In the resist composition of the present embodiment, examples of the component (A1) include a polymer compound having the constitutional unit (a1).

Preferred examples of the component (A1) include a polymer compound having a repeating structure of the constitutional unit (a1) and the constitutional unit (a10). Further, examples of the component (A1) include a polymer compound having a repeating structure of the constitutional unit (a1), the constitutional unit (a10), and other constitutional units. Further, the component (A1) may be a mixed resin of a polymer compound having a repeating structure of the constitutional unit (a1) and other constitutional units.

Such a compound (A1) can be produced by dissolving a monomer that guides each constitutional unit in a polymerization solvent and adding a radical polymerization initiator such as azobisisobutyronitrile (AIBN) or dimethyl azobisisobutyrate (for example, V-601) thereto to carry out polymerization. Alternatively, such a compound (A1) can be produced by dissolving a monomer that guides the constitutional unit (a1) and constitutional units other than the constitutional unit (a1) as necessary in a polymerization solvent, adding the above-described radical polymerization initiator thereto to carry out polymerization, and then carrying out a deprotection reaction. Further, a —C(CF$_3$)$_2$—OH group may be introduced into the terminal of the component (A1) during the polymerization using a chain transfer agent such as HS—CH$_2$—CH$_2$—CH$_2$—C(CF$_3$)$_2$—OH together. As described above, a copolymer into which a hydroxyalkyl group, formed by substitution of some hydrogen atoms in the alkyl group with fluorine atoms, has been introduced is effective for reducing development defects and reducing line edge roughness (LER: uneven irregularities of a line side wall).

The mass average molecular weight (Mw) (in terms of polystyrene determined by gel permeation chromatography (GPC)) of the component (A1) is not particularly limited, but is preferably in a range of 1,000 to 50,000, more preferably in a range of 2,000 to 30,000, and most preferably in a range of 3,000 to 20,000.

In a case where the Mw of the component (A1) is less than or equal to the preferable upper limit of the above-described range, the resist composition exhibits a satisfactory solubility in a resist solvent enough to be used as a resist. Meanwhile, in a case where the Mw thereof is greater than or equal to the preferable lower limit of the above-described range, dry etching resistance and the cross-sectional shape of the resist pattern become excellent.

Further, the dispersity (Mw/Mn) of the component (A1) is not particularly limited, but is preferably in a range of 1.0 to 4.0, more preferably in a range of 1.0 to 3.0, and particularly preferably in a range of 1.0 to 2.0. Further, Mn indicates a number average molecular weight.

In Regard to Base Material Component Other than Component (A1)

In the resist composition of the present embodiment, a base material component which does not correspond to the component (A1) and whose solubility in a developing solution is changed due to the action of an acid may be used in combination as the component (A). The base material component that does not correspond to the component (A1) is not particularly limited, and can be optionally selected from those known in the related art as base material components for a chemically amplified resist composition and may use a single polymer high molecular weight compound or low molecular weight compound or a combination of two or more kinds thereof.

In the resist composition of the present embodiment, the amount of the component (A) may be adjusted according to the film thickness of a resist intended to be formed.

<Acid Generator Component (B)>

The resist composition of the present embodiment contains the component (A) and an acid generator component (B) (hereinafter, also referred to as a "component (B)") that generates an acid upon exposure. In the resist composition of the present embodiment, the component (B) contains a compound (B1) represented by Formula (b1) (hereinafter, also referred to as a "component (B1)").

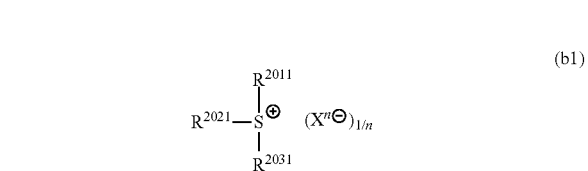

(b1)

[In the formula, $R^{2011}$ to $R^{2031}$ each independently represent an aryl group which may have a substituent, an alkyl group which may have a substituent, or an alkenyl group which may have a substituent, and two or more of $R^{2011}$ to $R^{2031}$ may be mutually bonded to form a ring together with a sulfur atom in the formula. Here, $R^{2011}$ to $R^{2031}$ have a total of four or more substituents containing fluorine atoms. $X^{n-}$ represents an n-valent anion, and n represents an integer of 1 or greater]

In Regard to Component (B1)

The component (B1) is formed of an anion moiety and a cation moiety having a specific structure represented by Formula (b1).

{Cation Moiety}

In Formula (b1), $R^{2011}$ to $R^{2031}$ each independently represent an aryl group which may have a substituent, an alkyl group which may have a substituent, or an alkenyl group which may have a substituent.

Examples of the aryl group as $R^{2011}$ to $R^{2031}$ include an unsubstituted aryl group having 6 to 20 carbon atoms, and a phenyl group or a naphthyl group is preferable.

As the alkyl group as $R^{2011}$ to $R^{2031}$, a chain-like or cyclic alkyl group having 1 to 30 carbon atoms is preferable.

The alkenyl group as $R^{2011}$ to $R^{2031}$ preferably has 2 to 10 carbon atoms.

Examples of the substituent which $R^{2011}$ to $R^{2031}$ may have include an alkyl group, a halogen atom, a halogenated alkyl group, a carbonyl group, a cyano group, an amino group, an aryl group, and groups represented by Formulae (ca-r-1) to (ca-r-7) shown below.

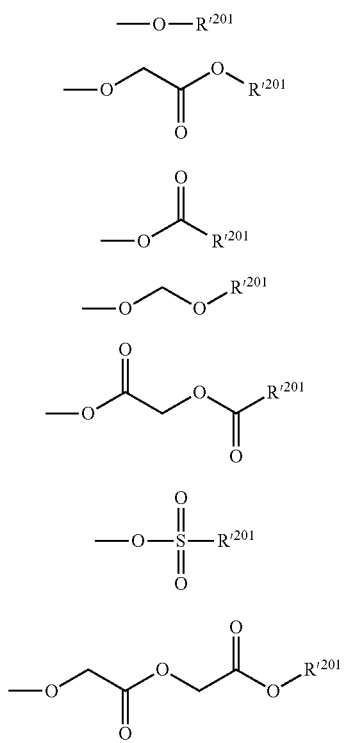

[In the formulae, each $R'^{201}$ independently represents a hydrogen atom, a cyclic group which may have a substituent, a chain-like alkyl group which may have a substituent, or a chain-like alkenyl group which may have a substituent.]

$R'^{201}$ represents a cyclic group which may have a substituent, a chain-like alkyl group which may have a substituent, or a chain-like alkenyl group which may have a substituent.

Cyclic group which may have substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that does not have aromaticity. The aliphatic hydrocarbon group may be saturated or unsaturated, but in general, the aliphatic hydrocarbon group is preferably saturated.

The aromatic hydrocarbon group as $R'^{201}$ is a hydrocarbon group having an aromatic ring. The aromatic hydrocarbon group has preferably 3 to 30 carbon atoms, more preferably 5 to 30 carbon atoms, still more preferably 5 to 20 carbon atoms, particularly preferably 6 to 15 carbon atoms, and most preferably 6 to 10 carbon atoms. Here, the number of carbon atoms in a substituent is not included in the number of carbon atoms.

Specific examples of the aromatic ring contained in the aromatic hydrocarbon group as $R'^{201}$ include benzene, fluorene, naphthalene, anthracene, phenanthrene, biphenyl, or an aromatic hetero ring in which some carbon atoms constituting any of these aromatic rings have been substituted with hetero atoms.

Examples of the hetero atom in the aromatic hetero rings include an oxygen atom, a sulfur atom and a nitrogen atom.

Specific examples of the aromatic hydrocarbon group as $R'^{201}$ include a group in which one hydrogen atom has been removed from the above-described aromatic ring (an aryl group such as a phenyl group or a naphthyl group), and a group in which one hydrogen atom in the aromatic ring has been substituted with an alkylene group (an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) has preferably 1 to 4 carbon atoms, more preferably 1 or 2 carbon atoms, and particularly preferably 1 carbon atom.

Examples of the cyclic aliphatic hydrocarbon group as $R'^{201}$ include aliphatic hydrocarbon groups containing a ring in the structure thereof.

Examples of the hydrocarbon group containing a ring in the structure thereof include an alicyclic hydrocarbon group (a group in which one hydrogen atom has been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed in a linear or branched aliphatic hydrocarbon group.

The alicyclic hydrocarbon group has preferably 3 to 20 carbon atoms and more preferably 3 to 12 carbon atoms.

The alicyclic hydrocarbon group may be a monocyclic group or a polycyclic group. As the monocyclic alicyclic hydrocarbon group, a group in which one or more hydrogen atoms have been removed from a monocycloalkane is preferable. The monocycloalkane has preferably 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the number of carbon atoms of the polycycloalkane is preferably in a range of 7 to 30. Among polycycloalkanes, a polycycloalkane having a bridged ring polycyclic skeleton, such as adamantane, norbornane, isobornane, tricyclodecane, or tetracyclododecane, and a polycycloalkane having a fused ring polycyclic skeleton, such as a cyclic group having a steroid skeleton are preferable.

Chain-like alkyl group which may have substituent:

The chain-like alkyl group as $R'^{201}$ may be linear or branched.

The linear alkyl group has preferably 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched alkyl group has preferably 3 to 20 carbon atoms, more preferably 3 to 15, and most preferably 3 to 10. Specific examples thereof include a 1-methylethyl group, 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-like alkenyl group which may have substituent:

Such a chain-like alkenyl group as $R'^{201}$ may be linear or branched, and the number of carbon atoms thereof is preferably in a range of 2 to 10, more preferably in a range of 2 to 5, still more preferably in a range of 2 to 4, and particularly preferably 3. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Among the examples, as the chain-like alkenyl group, a linear alkenyl group is preferable, a vinyl group or a propenyl group is more preferable, and a vinyl group is particularly preferable.

As the substituent for the chain-like alkyl group or alkenyl group as $R'^{201}$, an alkoxy group, a halogen atom, a halogenated alkyl group, a hydroxyl group, a carbonyl group, a nitro group, an amino group, a cyclic group as $R'^{201}$ or the like can be used.

Here, $R^{2011}$ to $R^{2031}$ have a total of four or more substituents containing fluorine atoms (hereinafter, a "fluorine-containing group").

The fluorine-containing group is not particularly limited, and examples thereof include a fluorine atom and a fluorinated alkyl group. The number of carbon atoms in the fluorinated alkyl group is preferably in a range of 1 to 10, more preferably in a range of 1 to 6, still more preferably in a range of 1 to 3, and particularly preferably 1 or 2. Specific examples of the fluorinated alkyl group include a monofluoromethyl group, a difluoromethyl group, a trifluoromethyl group, a 2-fluoroethyl group, a 2,2-difluoroethyl group, and a 2,2,2-trifluoroethyl group. As the fluorine-containing group, a fluorine atom is preferable.

Any of $R^{2011}$ to $R^{2031}$ may have a fluorine-containing group, and it is preferable that two or more of $R^{2011}$ to $R^{2031}$ have a fluorine-containing group and more preferable that all of $R^{2011}$ to $R^{2031}$ have a fluorine-containing group.

The number of fluorine-containing groups in all of $R^{2011}$ to $R^{2031}$ may be 4 or greater, and the upper limit thereof is not particularly limited. However, from the viewpoint of reducing the roughness, the number thereof is preferably 10 or less, more preferably 8 or less, still more preferably 6 or less, and particularly preferably 4 or 5.

$R^{2011}$ to $R^{2031}$ may be mutually bonded to form a ring together with a sulfur ion in the formula.

In a case where $R^{2011}$ to $R^{2031}$ are bonded to one another to form a ring with a sulfur atom in the formula, these groups may be bonded via a hetero atom such as a sulfur atom, an oxygen atom or a nitrogen atom, or a functional group such as a carbonyl group, —SO—, —SO$_2$—, —SO$_3$—, —COO—, —CONH— or —N($R_N$)— (here, $R_N$ represents an alkyl group having 1 to 5 carbon atoms). As a ring to be formed, a ring containing the sulfur atom in the formula in the skeleton thereof is preferably a 3- to 10-membered ring and most preferably a 5- to 7-membered ring including the sulfur atom. Specific examples of the ring to be formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

Suitable examples of the cation moiety of the component (B1) include a cation represented by Formula (b1-ca1).

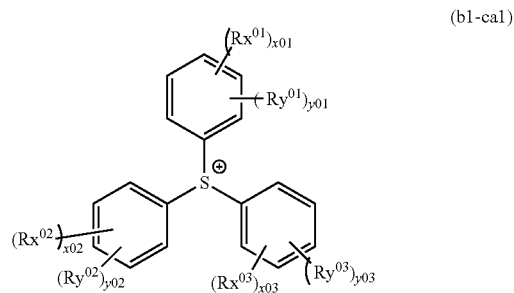

(b1-ca1)

[In the formula, $R^{01}$ to $Rx^{03}$ each independently represent a substituent having a fluorine atom, $Ry^{01}$ to $Ry^{03}$ each independently represent a substituent which does not have a fluorine atom, x01 to x03 each independently represent an integer of 0 to 5, x01+x02+x03 is greater than or equal to 4, y01 to y03 each independently represent an integer of 0 to 5, x01+y01 is less than or equal to 5, x02+y02 is less than or equal to 5, and x03+y03 is less than or equal to 5.]

In Formula (b1-Ca1), $Rx^{01}$ to $Rx^{03}$ each independently represent a substituent having a fluorine atom (fluorine-containing group). Examples of the fluorine-containing group as $Rx^{01}$ to $Rx^{03}$ are the same as those for the fluorine-containing group as $R^{2011}$ to $R^{2031}$ in Formula (b1). It is preferable that ox to $Rx^{03}$ represent a fluorine atom.

$Ry^{01}$ to $Ry^{03}$ each independently represent a substituent that does not have a fluorine atom. Examples of the substituent as $Ry^{01}$ to $Ry^{03}$ are the same as the substituents that do not have a fluorine atom among those provided as exemplary examples of the substituent as $R^{2011}$ to $R^{2031}$ in Formula (b1). Among these, it is preferable that $Ry^{01}$ to $Ry^{03}$ represents an alkyl group. The alkyl group has preferably 1 to 8 carbon atoms, more preferably 1 to 6 carbon atoms, and still more preferably 1 to 4 carbon atoms and may be linear or branched. Specific examples thereof include a methyl group, an ethyl group, a propyl group, and a butyl group. Among these, a methyl group or an ethyl group is preferable.

x01 to x03 each independently represent an integer of 0 to 5, x01+x02+x03 is greater than or equal to 4. In a case of x01+x02+x03, for example, an expression of "4≤x01+x02+x03≤10" is satisfied, an expression of "4≤x01+x02+x03≤8" is preferable, an expression of "4≤x01+x02+x03≤6" is more preferable, an expression of "4≤x01+x02+x03≤5" is still more preferable, and an equation of "x01+x02+x03=4" is particularly preferable.

y01 to y03 each independently represent an integer of 0 to 5, x01+y01 is less than or equal to 5, x02+y02 is less than or equal to 5, and x03+y03 is less than or equal to 5. y01 to y03 represent preferably an integer of 0 to 4, more preferably an integer of 0 to 3, still more preferably an integer of 0 to 2, and particularly preferably 0 or 1.

Suitable examples of the cation represented by Formula (b1-ca1) include a cation represented by Formula (b1-ca1-1).

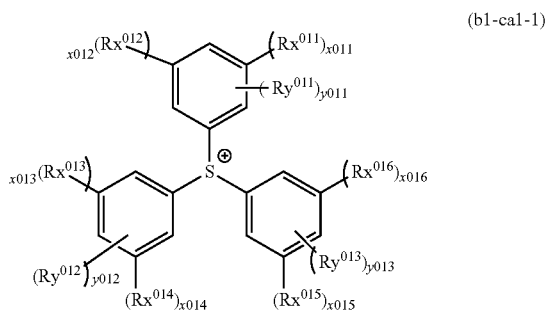

(b1-ca1-1)

[In the formula, $Rx^{011}$ to $Rx^{016}$ each independently represent a substituent having a fluorine atom, and $Ry^{011}$ to $Ry^{013}$ each independently represent a substituent which does not have a fluorine atom. x011 to x016 each independently represent 0 or 1. y01 to y03 each independently represent an integer of 0 to 3.]

In Formula (b1-ca1-1), $Rx^{011}$ to $Rx^{016}$ each independently represent a substituent having a fluorine atom (fluorine-containing group). Examples of the fluorine-containing group are the same as those for $Rx^{01}$ to $Rx^{03}$ in Formula (b1-ca1).

$Ry^{011}$ to $Ry^{013}$ each independently represent a substituent that does not have a fluorine atom. Examples of the substituent that does not have a fluorine atom are the same as those for $Ry^{01}$ to $Ry^{03}$ in Formula (b1-ca1).

x011 to x016 each independently represent 0 or 1. It is preferable that x011 to x014 represent 1 and x015 to x016 represent 0.

y01 to y03 each independently represent an integer of 0 to 3, preferably an integer of 0 to 2, more preferably 0 or 1, and still more preferably 0.

Specific examples of the cation moiety suitable for the compound represented by Formula (b1) include cations respectively represented by Chemical Formula (b1-ca-1) to (b1-ca-7).

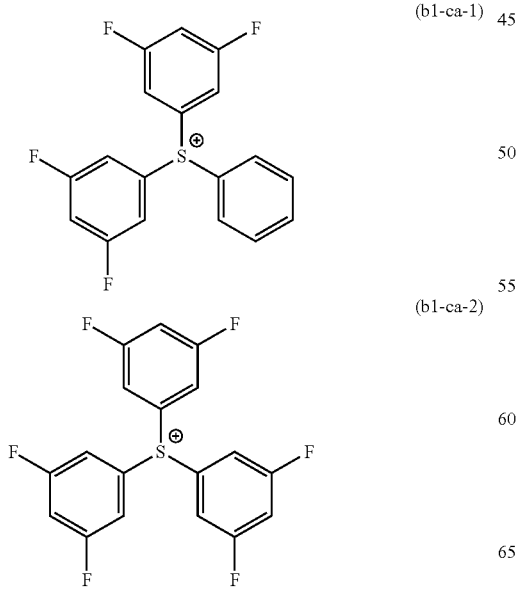

(b1-ca-1)

(b1-ca-2)

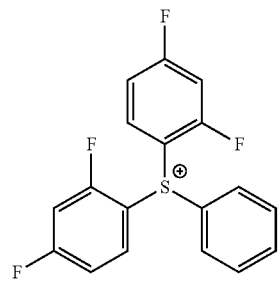

(b1-ca-3)

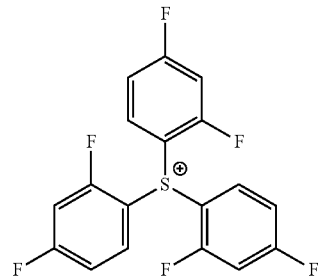

(b1-ca-4)

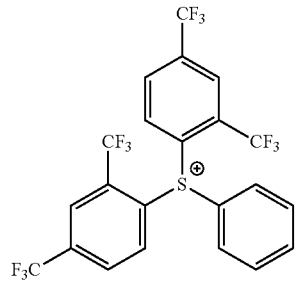

(b1-ca-5)

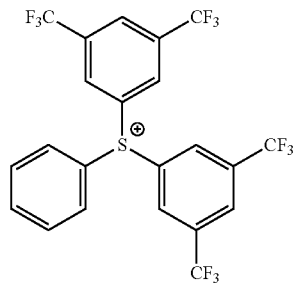

(b1-ca-6)

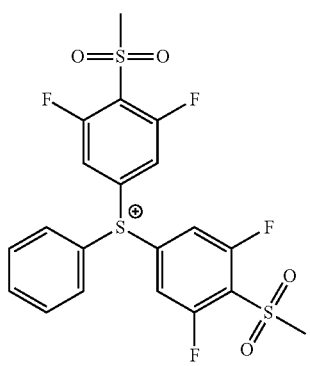

(b1-ca-7)

{Anion Moiety}

In Formula (b1), $X^{n-}$ represents an n-valent anion. n represents an integer of 1 or greater. $X^{n-}$ is not particularly limited, and an anion known as an anion moiety of an acid generator component for a resist composition can be used as appropriate.

For example, $X''^-$ may represent an anion represented by Formula (b1-an1), an anion represented by Formula (1-1-an2), or an anion represented by Formula (1-1-an3).

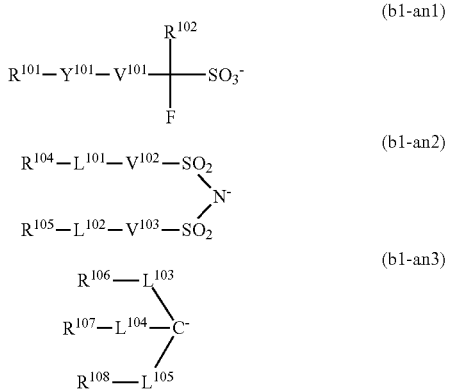

[In the formulae, $R^{101}$ and $R^{104}$ to $R^{108}$ each independently represent a cyclic group which may have a substituent, a chain-like alkyl group which may have a substituent, or a chain-like alkenyl group which may have a substituent. $R^{104}$ and $R^{105}$ may be mutually bonded to form a ring structure. $R^{102}$ represents a fluorinated alkyl group having 1 to 5 carbon atoms or a fluorine atom. $Y^{101}$ represents a divalent linking group having an oxygen atom or a single bond. $V^{101}$ to $V^{103}$ each independently represent a single bond, an alkylene group, or a fluorinated alkylene group. $L^{101}$ and $L^{102}$ each independently represent a single bond or an oxygen atom. $L^{103}$ to $L^{105}$ each independently represent a single bond, —CO—, or —SO$_2$—.]

Anion Represented by Formula (b1-An1)

In Formula (b1-an1), $R^{101}$ represents a cyclic group which may have a substituent, a chain-like alkyl group which may have a substituent, or a chain-like alkenyl group which may have a substituent.

Cyclic group which may have substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that does not have aromaticity. The aliphatic hydrocarbon group may be saturated or unsaturated, but in general, the aliphatic hydrocarbon group is preferably saturated.

The aromatic hydrocarbon group as $R^{101}$ is a hydrocarbon group having an aromatic ring. The aromatic hydrocarbon group has preferably 3 to 30 carbon atoms, more preferably 5 to 30 carbon atoms, still more preferably 5 to 20 carbon atoms, particularly preferably 6 to 15 carbon atoms, and most preferably 6 to 10 carbon atoms. Here, the number of carbon atoms in a substituent is not included in the number of carbon atoms.

Specific examples of the aromatic ring contained in the aromatic hydrocarbon group as $R^{101}$ include benzene, fluorene, naphthalene, anthracene, phenanthrene, biphenyl, or an aromatic hetero ring in which some carbon atoms constituting any of these aromatic rings have been substituted with hetero atoms. Examples of the hetero atom in the aromatic hetero rings include an oxygen atom, a sulfur atom and a nitrogen atom.

Specific examples of the aromatic hydrocarbon group as $R^{101}$ include a group in which one hydrogen atom has been removed from the above-described aromatic ring (an aryl group such as a phenyl group or a naphthyl group), and a group in which one hydrogen atom in the aromatic ring has been substituted with an alkylene group (an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) has preferably 1 to 4 carbon atoms, more preferably 1 or 2 carbon atoms, and particularly preferably 1 carbon atom.

Examples of the cyclic aliphatic hydrocarbon group as $R^{101}$ include aliphatic hydrocarbon groups containing a ring in the structure thereof.

Examples of the hydrocarbon group containing a ring in the structure thereof include an alicyclic hydrocarbon group (a group in which one hydrogen atom has been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed in a linear or branched aliphatic hydrocarbon group.

The alicyclic hydrocarbon group has preferably 3 to 20 carbon atoms and more preferably 3 to 12 carbon atoms.

The alicyclic hydrocarbon group may be a monocyclic group or a polycyclic group. As the monocyclic alicyclic hydrocarbon group, a group in which one or more hydrogen atoms have been removed from a monocycloalkane is preferable. The monocycloalkane has preferably 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the number of carbon atoms of the polycycloalkane is preferably in a range of 7 to 30. Among polycycloalkanes, a polycycloalkane having a bridged ring polycyclic skeleton, such as adamantane, norbornane, isobornane, tricyclodecane, or tetracyclododecane, and a polycycloalkane having a fused ring polycyclic skeleton, such as a cyclic group having a steroid skeleton are preferable.

Among these examples, as the cyclic aliphatic hydrocarbon group as $R^{101}$, a group in which one or more hydrogen atoms have been removed from a monocycloalkane or a polycycloalkane is preferable, a group in which one hydrogen atom has been removed from a polycycloalkane is more preferable, an adamantyl group or a norbornyl group is particularly preferable, and an adamantyl group is most preferable.

The number of carbon atoms in the linear aliphatic hydrocarbon group which may be bonded to an alicyclic hydrocarbon group is preferably in a range of 1 to 10, more preferably in a range of 1 to 6, still more preferably in a range of 1 to 4, and most preferably in a range of 1 to 3. As the linear aliphatic hydrocarbon group, a linear alkylene group is preferable. Specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$-] and a pentamethylene group [—(CH$_2$)$_5$—].

The number of carbon atoms in the branched aliphatic hydrocarbon group which may be bonded to an alicyclic hydrocarbon group is preferably in a range of 2 to 10, more preferably in a range of 3 to 6, still more preferably 3 or 4, and most preferably 3. As the branched aliphatic hydrocarbon group, a branched alkylene group is preferred, and specific examples include alkylalkylene groups, for example, alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group in the alkylalkylene group, a linear alkyl group having 1 to 5 carbon atoms is preferable.

The cyclic hydrocarbon group as $R^{101}$ may contain a hetero atom such as a hetero ring. Specific examples thereof include lactone-containing cyclic groups represented by Formulae (a2-r-1) to (a2-r-7), the —SO$_2$-containing cyclic group represented by Formulae (a5-r-1) to (a5-r-4), and other heterocyclic groups represented by Chemical Formulae (r-hr-1) to (r-hr-16).

Examples of the substituent for the cyclic group as $R^{101}$ include an alkyl group, an alkoxy group, a halogen atom, a halogenated alkyl group, a hydroxyl group, a carbonyl group, and a nitro group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom for the substituent include a fluorine atom, a chlorine atom, a bromine atom, and an iodine atom, and a fluorine atom is preferable.

Example of the above-described halogenated alkyl group as the substituent includes a group in which some or all hydrogen atoms in an alkyl group having 1 to 5 carbon atoms such as a methyl group, an ethyl group, a propyl group, an n-butyl group, or a tert-butyl group have been substituted with the above-described halogen atoms.

The carbonyl group as the substituent is a group that substitutes a methylene group (—CH$_2$—) constituting the cyclic hydrocarbon group.

Chain-like alkyl group which may have substituent:
The chain-like alkyl group as $R^{101}$ may be linear or branched.

The linear alkyl group has preferably 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched alkyl group has preferably 3 to 20 carbon atoms, more preferably 3 to 15, and most preferably 3 to 10. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-like alkenyl group which may have substituent:
Such a chain-like alkenyl group as $R^{101}$ may be linear or branched, and the number of carbon atoms thereof is preferably in a range of 2 to 10, more preferably in a range of 2 to 5, still more preferably in a range of 2 to 4, and particularly preferably 3. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Among the examples, as the chain-like alkenyl group, a linear alkenyl group is preferable, a vinyl group or a propenyl group is more preferable, and a vinyl group is particularly preferable.

As the substituent for the chain-like alkyl group or alkenyl group as $R^{101}$, an alkoxy group, a halogen atom, a halogenated alkyl group, a hydroxyl group, a carbonyl group, a nitro group, an amino group, a cyclic group as $R^{101}$ or the like can be used.

Among the examples, as $R^{101}$, a cyclic group which may have a substituent is preferable, and a cyclic hydrocarbon group which may have a substituent is more preferable. More specific preferred examples thereof include a phenyl group, a naphthyl group, a group formed by removing one or more hydrogen atoms from a polycycloalkane, a lactone-containing cyclic group represented by any of Formulae (a2-r-1) to (a2-r-7), and a —SO$_2$-containing cyclic group represented by any of Formulae (a5-r-1) to (a5-r-4). Among these, a group formed by removing one or more hydrogen atoms from a polycycloalkane is more preferable.

In Formula (b1-an1), $Y^{101}$ represents a single bond or a divalent linking group containing an oxygen atom.

In a case where $Y^{101}$ represents a divalent linking group containing an oxygen atom, $Y^{101}$ may contain an atom other than an oxygen atom. Examples of atoms other than an oxygen atom include a carbon atom, a hydrogen atom, a sulfur atom, and a nitrogen atom.

Examples of divalent linking groups having an oxygen atom include a non-hydrocarbon-based oxygen atom-containing linking group such as an oxygen atom (an ether bond; —O—), an ester bond (—C(=O)—O—), an oxycarbonyl group (—O—C(=O)—), an amide bond (—C(=O)—NH—), a carbonyl group (—C(=O)—), or a carbonate bond (—O—C(=O)—O—); and a combination of the above-described non-hydrocarbon-based oxygen atom-containing linking group with an alkylene group. A sulfonyl group (—SO$_2$—) may be further linked to the combination. Examples of the divalent linking group having an oxygen atom include linking groups represented by following Formulae (y-a1-1) to (y-a1-7).

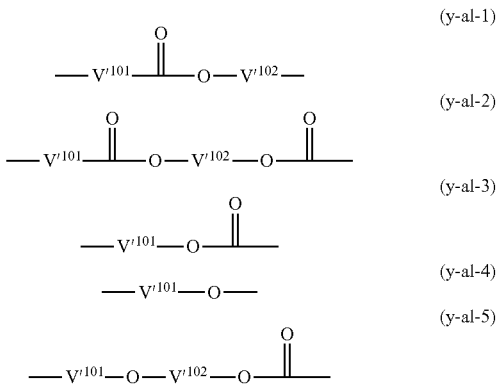

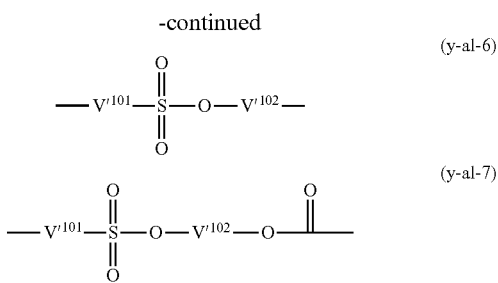

[In the formulae, $V'^{101}$ represents a single bond or an alkylene group having 1 to 5 carbon atoms, and $V'^{102}$ represents a divalent saturated hydrocarbon group having 1 to 30 carbon atoms.]

The divalent saturated hydrocarbon group as $V'^{102}$ is preferably an alkylene group having 1 to 30 carbon atoms, more preferably an alkylene group having 1 to 10 carbon atoms, and still more preferably an alkylene group having 1 to 5 carbon atoms.

The alkylene group as $V'^{101}$ and $V'^{102}$ may be a linear alkylene group or a branched alkylene group, and a linear alkylene group is preferable.

Specific examples of the alkylene group as $V'^{101}$ and $V'^{102}$ include a methylene group [—$CH_2$—]; an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, or —$C(CH_2CH_3)_2$—; an ethylene group [—$CH_2CH_2$—]; an alkylethylene group such as —$CH(CH_3)CH_2$—, —$CH(CH_3)CH(CH_3)$—, —$C(CH_3)_2CH_2$—, or —$CH(CH_2CH_3)CH_2$—; a trimethylene group (n-propylene group) [—$CH_2CH_2CH_2$—]; an alkyltrimethylene group such as —$CH(CH_3)CH_2CH_2$— or —$CH_2CH(CH_3)CH_2$—; a tetramethylene group [—$CH_2CH_2CH_2CH_2$—]; an alkyltetramethylene group such as —$CH(CH_3)CH_2CH_2CH_2$—, —$CH_2CH(CH_3)CH_2CH_2$—; and a pentamethylene group [—$CH_2CH_2CH_2CH_2CH_2$—].

Further, some methylene groups in the alkylene group as $V'^{101}$ and $V'^{102}$ may be substituted with a divalent aliphatic cyclic group having 5 to 10 carbon atoms. As the aliphatic cyclic group, a divalent group formed by removing one hydrogen atom from the cyclic aliphatic hydrocarbon group (a monocyclic aliphatic hydrocarbon group or a polycyclic aliphatic hydrocarbon group) as $Ra'^3$ in Formula (a1-r-1) is preferable, and a cyclohexylene group, a 1,5-adamantylene group, or a 2,6-adamantylene group is more preferable.

$Y^{101}$ represents preferably a divalent linking group containing an ester bond or a divalent linking group containing an ether bond and more preferably linking groups represented by Formulae (y-al-1) to (y-al-5).

In Formula (b1-an1), $V^{101}$ represents a single bond, an alkylene group, or a fluorinated alkylene group. The alkylene group and the fluorinated alkylene group as $V^{101}$ preferably have 1 to 4 carbon atoms. Examples of the fluorinated alkylene group as $V^{101}$ include a group in which some or all hydrogen atoms in the alkylene group as $V^{101}$ have been substituted with fluorine atoms. Among these examples, as $V^{101}$, a single bond or a fluorinated alkylene group having 1 to 4 carbon atoms is preferable.

In Formula (b1-an1), $R^{102}$ represents a fluorine atom or a fluorinated alkyl group having 1 to 5 carbon atoms. $R^{102}$ represents preferably a fluorine atom or a perfluoroalkyl group having 1 to 5 carbon atoms and more preferably a fluorine atom.

As a specific example of the anion moiety represented by Formula (b1-an1), in a case where $Y^{101}$ represents a single bond, a fluorinated alkylsulfonate anion such as a trifluoromethanesulfonate anion or a perfluorobutanesulfonate anion is an exemplary example; and in a case where $Y^{101}$ represents a divalent linking group containing an oxygen atom, anions represented by Formulae (an-1) to (an-3) shown below is an exemplary example.

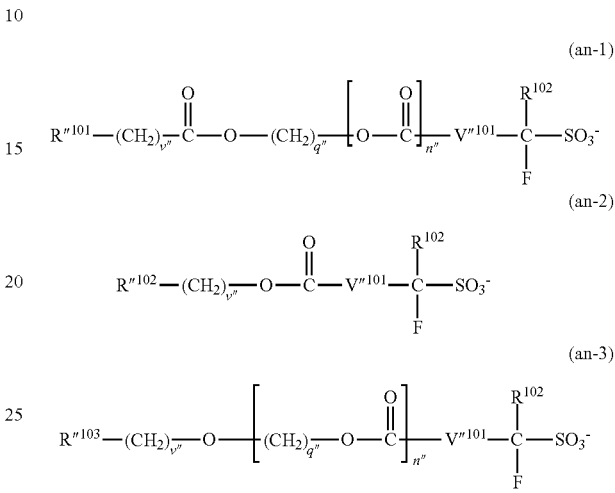

[In the formulae, $R'''^{101}$ represents an aliphatic cyclic group which may have a substituent, a monovalent heterocyclic group represented by any of Formulae (r-hr-1) to (r-hr-6), or a chain-like alkyl group which may have a substituent. $R'''^{102}$ represents an aliphatic cyclic group which may have a substituent, a lactone-containing cyclic group represented by any of Formulae (a2-r-1) and (a2-r-3) to (a2-r-7), or a —$SO_2$-containing cyclic group represented by any of Formulae (a5-r-1) to (a5-r-4). $R'''^{103}$ represents an aromatic cyclic group which may have a substituent, an aliphatic cyclic group which may have a substituent, or a chain-like alkenyl group which may have a substituent.

$V'''^{101}$ represents a single bond, an alkylene group having 1 to 4 carbon atoms, or a fluorinated alkylene group having 1 to 4 carbon atoms. $R^{102}$ represents a fluorine atom or a fluorinated alkyl group having 1 to 5 carbon atoms. Each $v''$ independently represents an integer of 0 to 3; each $q''$ independently represents an integer of 0 to 20; and $n''$ represents 0 or 1.]

As the aliphatic cyclic group as $R'''^{101}$, $R'''^{102}$, and $R'''^{103}$ which may have a substituent, the same groups as the cyclic aliphatic hydrocarbon group as $R^{101}$ in Formula (b1-an1) described above are preferable. Examples of the substituent are the same as the substituents which may substitute the cyclic aliphatic hydrocarbon group as $R^{101}$ in Formula (b1-an1).

As the aromatic cyclic group as $R'''^{103}$ which may have a substituent, the same groups as the aromatic hydrocarbon group for the cyclic hydrocarbon group represented by $R^{101}$ in Formula (b1-an1) described above are preferable. Examples of the substituent are the same as the substituents which may substitute the aromatic hydrocarbon group as $R^{101}$ in Formula (b1-an1).

As the chain-like alkyl group as $R'''^{101}$ which may have a substituent, the same groups provided as exemplary examples of the chain-like alkyl groups represented by $R^{101}$ in Formula (b1-an1) are preferable.

As the chain-like alkenyl group as R'''$^{103}$ which may have a substituent, the same groups provided as exemplary examples of the chain-like alkenyl groups represented by R$^{101}$ in Formula (b1-an1) are preferable.

Anion Represented by Formula (b1-An2)

In Formula (b1-an2), R$^{104}$ and R$^{105}$ each independently represent a cyclic group which may have a substituent, a chain-like alkyl group which may have a substituent or a chain-like alkenyl group which may have a substituent, and has the same definition as that for R$^{101}$ in Formula (b1-an1). Here, R$^{104}$ and R$^{105}$ may be bonded to each other to form a ring.

As R$^{104}$ and R$^{105}$, a chain-like alkyl group which may have a substituent is preferable, and a linear or branched alkyl group or a linear or branched fluorinated alkyl group is more preferable.

The chain-like alkyl group has preferably 1 to 10 carbon atoms, more preferably 1 to 7 carbon atoms, and still more preferably 1 to 3 carbon atoms. It is preferable that the number of carbon atoms in the chain-like alkyl group as R$^{104}$ and R$^{105}$ is small because the solubility in a solvent for a resist is also excellent in the range of the number of carbon atoms. Further, in the chain-like alkyl group as R$^{104}$ and R$^{105}$, it is preferable that the number of hydrogen atoms substituted with fluorine atoms is as large as possible because the acid strength increases and the transparency to high energy radiation of 250 nm or less or electron beams is improved.

The proportion of fluorine atoms in the chain-like alkyl group, that is, the fluorination ratio is preferably in a range of 70% to 100% and more preferably in a range of 90% to 100%, and it is most preferable that the chain-like alkyl group is a perfluoroalkyl group in which all hydrogen atoms are substituted with fluorine atoms.

In Formula (b1-an2), V$^{102}$ and V$^{103}$ each independently represent a single bond, an alkylene group, or a fluorinated alkylene group, and has the same definition as that for V$^{101}$ in Formula (b1-an1).

In Formula (b1-an2), L$^{101}$ and L$^{102}$ each independently represent a single bond or an oxygen atom.

Anion Represented by Formula (b1-An3)

In Formula (b1-an3), R$^{106}$ to R$^{108}$ each independently represent a cyclic group which may have a substituent or a chain-like alkyl group which may have a substituent or a chain-like alkenyl group which may have a substituent, and has the same definition as that for R$^{101}$ in Formula (b1-an1).

In Formula (b1-an3), L$^{103}$ to L$^{105}$ each independently represent a single bond, —CO—, or —SO$_2$—.

In Formula (b1), X$^{n-}$ may represent R$^{109}$—SO$_3$—. R$^{109}$ represents a cyclic group which may have a substituent or a chain-like alkyl group which may have a substituent or a chain-like alkenyl group which may have a substituent, and has the same definition as that for R$^{101}$ in Formula (b1-an1). Here, a fluorine atom is set to be bonded to the carbon atom adjacent to the S atom as R$^{109}$.

In Formula (b1), X$^{n-}$ may represent a halogen anion. Here, examples of the halogen anion include a fluoride ion, a chloride ion, a bromide ion, and an iodide ion.

Among these, as the anion moiety of the component (B1), an anion represented by Formula (b1-an1) is preferable. Among these, an anion represented by any of Formulae (an-1) to (an-3) is more preferable, an anion represented by Formula (an-1) or (an-2) is still more preferable, and an anion represented by Formula (an-2) is particularly preferable.

The component (B1) may use one acid generator described above or a combination of two or more kinds thereof.

As the component (B1) in the present embodiment, a compound represented by Formula (b1-1) is preferable, and a compound represented by Formula (b1-1-1) is more preferable.

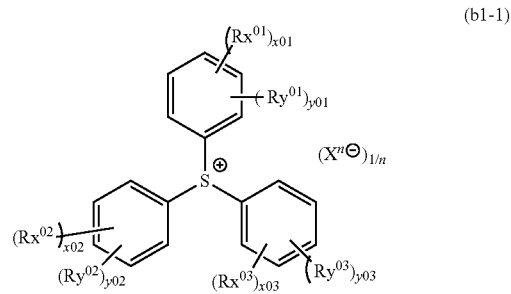

(b1-1)

[In the formula, Rx$^{01}$ to Rx$^{03}$, Ry$^{01}$ to Ry$^{03}$, x01 to X03, and y01 to y03 each have the same definition as Rx$^{01}$ to Rx$^{03}$, Ry$^{01}$ to Ry$^{03}$, x01 to X03, and y01 to y03 in Formula (b1-ca1). X$^{n-}$ represents an n-valent anion, and n represents an integer of 1 or greater.]

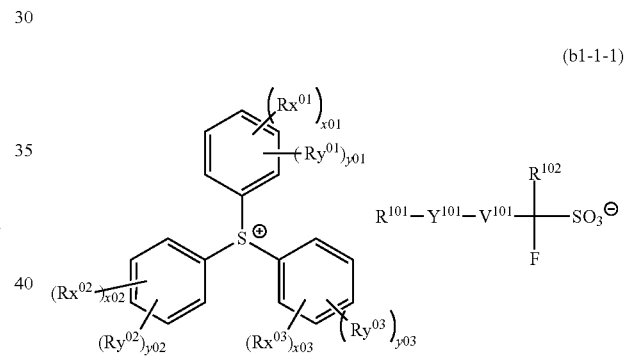

(b1-1-1)

[In the formula, R$^{101}$, Y$^{101}$, V$^{101}$, and R$^{102}$ each have the same definition as R$^{101}$, Y$^{100}$, V$^{100}$, and R$^{102}$ in Formula (b1-an1). Rx$^{01}$ to Rx$^{03}$, Ry$^{°1}$ to Ry$^{03}$, x01 to X03, and y01 to y03 each have the same definition as Rx$^{01}$ to Rx$^{03}$, Ry$^{°1}$ to Ry$^{03}$, x01 to X03, and y01 to y03 in Formula (b1-ca1).]

Specific suitable examples of the component (B1) are shown below.

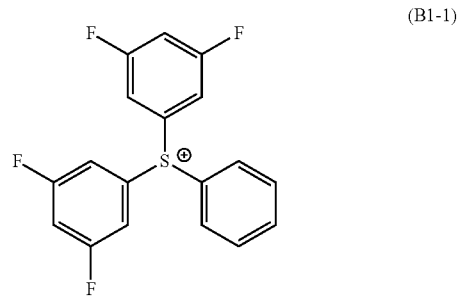

(B1-1)

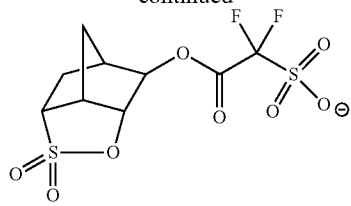

(B1-2)

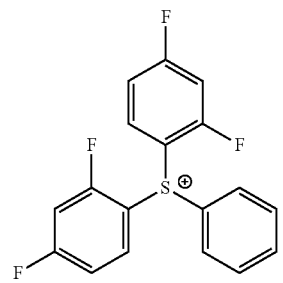

(B1-3)

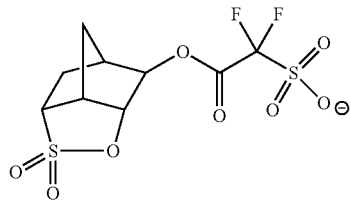

(B1-4)

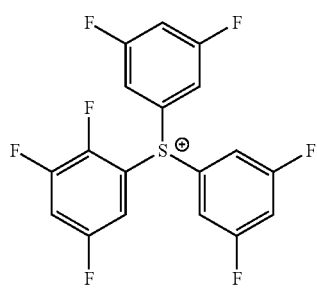

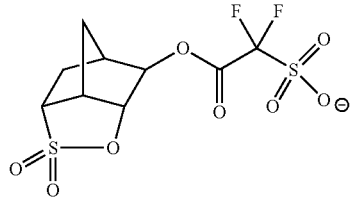

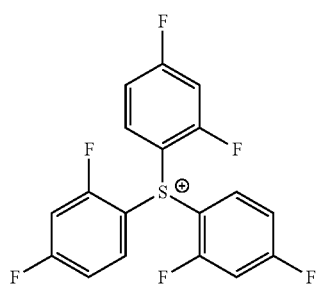

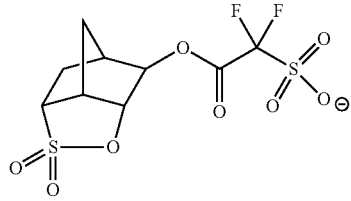

In the resist composition of the present embodiment, the component (B1) may be used alone, or two or more kinds thereof may be used in combination.

The amount of the component (B1) in the resist composition of the present embodiment is preferably in a range of 0.5 to 30 parts by mass, more preferably in a range of 1 to 25 parts by mass of the component (A).

By setting the amount of the component (B1) to be in the above-described range, pattern formation is sufficiently performed. Further, since a uniform solvent is easily obtained and the storage stability of the resist composition becomes excellent at the time of dissolving each component of the resist composition in an organic solvent, it is preferable that the amount of the component (B1) is in the above-described range. Further, in a case where the amount of the component (B1) is set to be greater than or equal to the lower limit of the above-described preferable range, reduction in roughness is attempted, and the shape of the resist pattern is further improved.

The proportion of the component (B1) in all components (B) contained in the resist composition of the present embodiment is, for example, 50% by mass or greater, preferably 70% by mass or greater, and more preferably 95% by mass or greater and may be 100% by mass.

In a case where the proportion of the component (B1) is set to be greater than or equal to the lower limit of the above-described preferable range, the lithography characteristics such as reduction in roughness and the like are improved, and a resist pattern having an excellent shape can be formed.

In Regard to Component (B2)

The resist composition of the present embodiment may further contain an acid generator component (hereinafter, referred to as a "component (B2)") other than the component (B1) in a range not damaging the effects of the present invention.

The component (B2) is not particularly limited, and those which have been proposed as an acid generator for a chemically amplified resist composition in the related art can be used.

Examples of these acid generators are numerous and include onium salt acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As the onium salt acid generator, a compound represented by Formula (b-1) (hereinafter, also referred to as "component (b-1)"), a compound represented by Formula (b-2) (hereinafter, also referred to as "component (b-2)") or a compound represented by Formula (b-3) (hereinafter, also referred to as "component (b-3)") can be used.

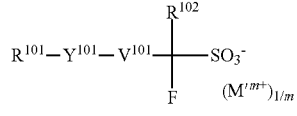

(b-1)

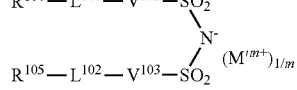

(b-2)

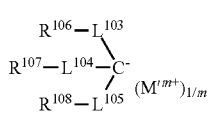
(b-3)

[In the formulae, $R^{101}$ and $R^{104}$ to $R^{108}$ each independently represent a hydrogen atom, a cyclic group which may have a substituent, a chain-like alkyl group which may have a substituent, or a chain-like alkenyl group which may have a substituent.] Here, $R^{104}$ and $R^{105}$ may be bonded to each other to form a ring.

$R^{102}$ represents a fluorine atom or a fluorinated alkyl group having 1 to 5 carbon atoms. $Y^{101}$ represents a single bond or a divalent linking group containing an oxygen atom. $V^{101}$ to $V^{103}$ each independently represent a single bond, an alkylene group, or a fluorinated alkylene group. $L^{101}$ and $L^{102}$ each independently represent a single bond or an oxygen atom. $L^{103}$ to $L^{105}$ each independently represent a single bond, —CO— or —SO$_2$—. m represents an integer of 1 or greater, and $M'^{m+}$ represents an m-valent onium cation.]

{Anion Moiety}

The anion moiety of the component (b-1) has the same definition as that for the anion represented by Formula (b1-1-an1).

The anion moiety of the component (b-2) has the same definition as that for the anion represented by Formula (1-1-an2).

The anion moiety of the component (b-3) has the same definition as that for the anion represented by Formula (1-1-an3).

{Cation Moiety}

In Formulae (b-1), (b-2), and (b-3), $M'^{m+}$ represents an m-valent onium cation (here, a cation corresponding to the cation moiety in Formula (b1-1) is excluded). Among these, a sulfonium cation or an iodonium cation is preferable. m represents an integer of 1 or greater.

Preferred examples of the cation moiety $((M'^{m+})_{1/m})$ include organic cations represented by Formulae (ca-1) to (ca-4).

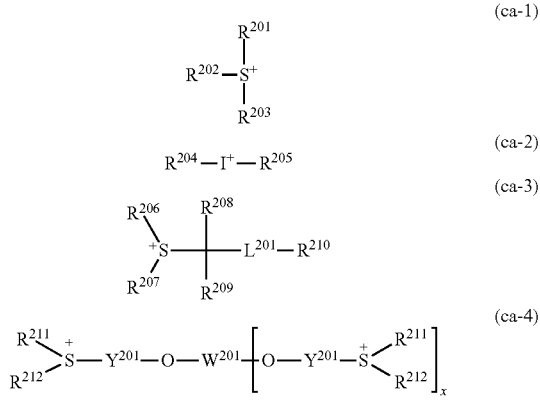

[In the formulae, $R^{201}$ to $R^{207}$, $R^{211}$, and $R^{212}$ each independently represent an aryl group, an alkyl group, or an alkenyl group which may have a substituent. $R^{201}$ to $R^{203}$, $R^{206}$ and $R^{207}$, and $R^{211}$ and $R^{212}$ may be bonded to each other to form a ring together with a sulfur atom in the formula. $R^{208}$ and $R^{209}$ each independently represent a hydrogen atom or an alkyl group having 1 to 5 carbon atoms. $R^{210}$ represents an aryl group which may have a substituent, an alkyl group which may have a substituent, an alkenyl group which may have a substituent, or a —SO$_2$-containing cyclic group which may have a substituent. $L^{201}$ represents —C(=O)— or —C(=O)—O—. $Y^{201}$'s each independently represent an arylene group, an alkylene group, or an alkenylene group. x represents 1 or 2. $W^{201}$ represents an (x+1)-valent linking group.]

Examples of the aryl group as $R^{201}$ to $R^{207}$, $R^{211}$, and $R^{212}$ in Formulae (ca-1) to (ca-4) include an unsubstituted aryl group having 6 to 20 carbon atoms. Among these, a phenyl group or a naphthyl group is preferable.

The alkyl group as $R^{201}$ to $R^{207}$, $R^{211}$, and $R^{212}$ is a chain-like or cyclic alkyl group, and the number of carbon atoms thereof is preferably in a range of 1 to 30.

The alkenyl group as $R^{201}$ to $R^{207}$, $R^{211}$, and $R^{212}$ preferably has 2 to 10 carbon atoms.

Examples of the substituent which $R^{201}$ to $R^{207}$ and $R^{210}$ to $R^{212}$ may have include an alkyl group, a halogen atom, a halogenated alkyl group, a carbonyl group, a cyano group, an amino group, an aryl group, and groups represented by Formulae (ca-r-1) to (ca-r-7) shown below.

In a case where $R^{201}$ to $R^{203}$, $R^{206}$, $R^{207}$, $R^{211}$, and $R^{212}$ in Formulae (ca-1) to (ca-4) are bonded to one another to form a ring with a sulfur atom in the formula, these groups may be bonded via a hetero atom such as a sulfur atom, an oxygen atom or a nitrogen atom, or a functional group such as a carbonyl group, —SO—, —SO$_2$—, —SO$_{03}$—, —COO—, —CONH— or —N($R_N$)— (here, $R_N$ represents an alkyl group having 1 to 5 carbon atoms). As a ring to be formed, a ring containing the sulfur atom in the formula in the skeleton thereof is preferably a 3- to 10-membered ring and most preferably a 5- to 7-membered ring including the sulfur atom. Specific examples of the ring to be formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

$R^{208}$ and $R^{209}$ each independently represent a hydrogen atom or an alkyl group having 1 to 5 carbon atoms and preferably a hydrogen atom or an alkyl group having 1 to 3 carbon atoms. In a case where $R^{208}$ and $R^{209}$ each represents an alkyl group, $R^{208}$ and $R^{209}$ may be bonded to each other to form a ring.

$R^{210}$ represents an aryl group which may have a substituent, an alkyl group which may have a substituent, an alkenyl group which may have a substituent, or a —SO$_2$-containing cyclic group which may have a substituent.

Examples of the aryl group as $R^{210}$ include an unsubstituted aryl group having 6 to 20 carbon atoms, and a phenyl group or a naphthyl group is preferable.

As the alkyl group as $R^{210}$, a chain-like or cyclic alkyl group having 1 to 30 carbon atoms is preferable.

The alkenyl group as $R^{210}$ preferably has 2 to 10 carbon atoms.

As the —SO$_2$-containing cyclic group as $R^{210}$ which may have a substituent, a "—SO$_2$-containing polycyclic group" is preferable, and a group represented by Formula (a5-r-1) is more preferable.

$Y^{201}$'s each independently represent an arylene group, an alkylene group, or an alkenylene group.

Examples of the arylene group as $Y^{201}$ include a group formed by removing one hydrogen atom from the aryl group provided as exemplary examples of the aromatic hydrocarbon group represented by $R^{101}$ in Formula (b1-1-an1).

Examples of the alkylene group and alkenylene group as $Y^{201}$ include a group formed by removing one hydrogen atom from the chain-like alkyl group or the chain-like alkenyl group as $R^{101}$ in Formula (b1-1-an1).

In Formula (ca-4), x represents 1 or 2.

$W^{201}$ represents a (x+1)-valent linking group, that is, a divalent or trivalent linking group.

As the divalent linking group represented by $W^{201}$, a divalent hydrocarbon group which may have a substituent is preferable, and as examples thereof, the same hydrocarbon groups which may have a substituent as those described above represented by $Ya^{21}$ in Formula (a2-1) are exemplary examples. The divalent linking group as $W^{201}$ may be linear, branched or cyclic, and cyclic is more preferable. Among these, an arylene group having two carbonyl groups, each bonded to the terminal thereof is preferable. Examples of the arylene group include a phenylene group, and a naphthylene group, and a phenylene group is particularly preferable.

As the trivalent linking group as $W^{201}$, a group in which one hydrogen atom has been removed from the above-described divalent linking group as $W^{201}$ and a group in which the divalent linking group has been bonded to another divalent linking group are exemplary examples. The trivalent linking group as $W^{201}$ is preferably a group in which two carbonyl groups are bonded to an arylene group.

Specific examples of suitable cations represented by Formula (ca-1) include cations represented by Formulae (ca-1-1) and (ca-1-70) shown below.

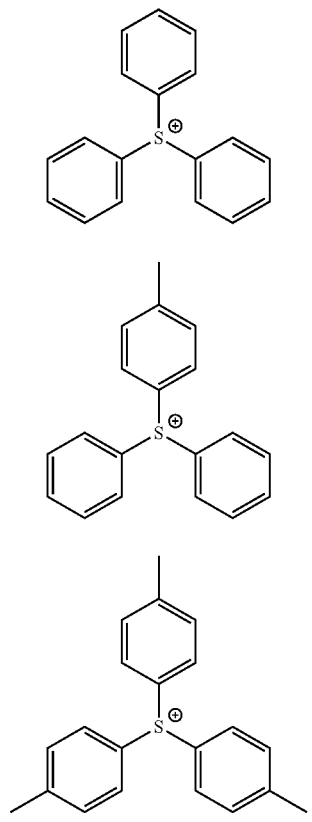

(ca-1-1)

(ca-1-2)

(ca-1-3)

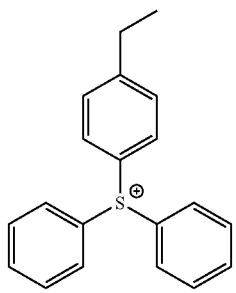

(ca-1-4)

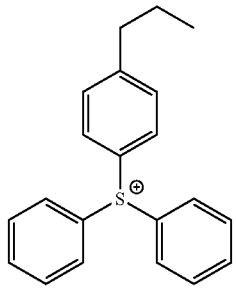

(ca-1-5)

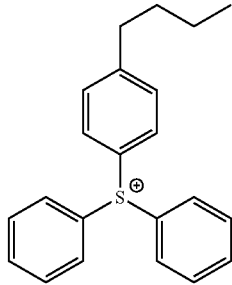

(ca-1-6)

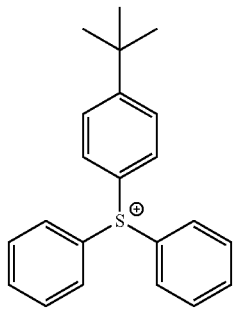

(ca-1-7)

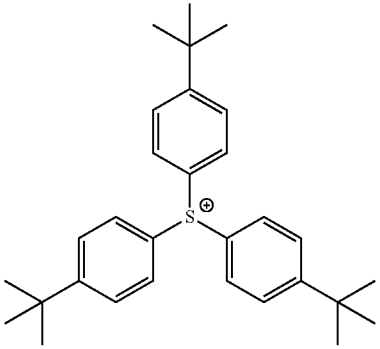

(ca-1-8)

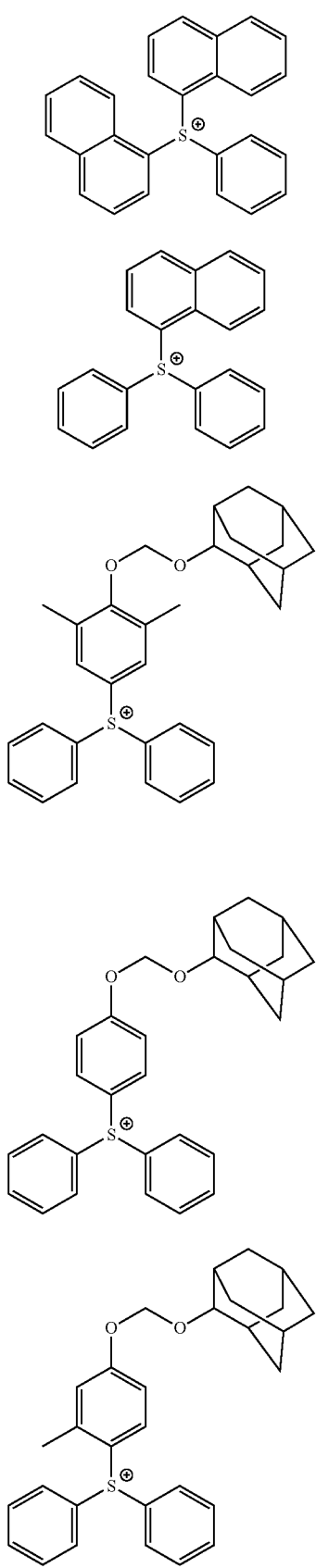
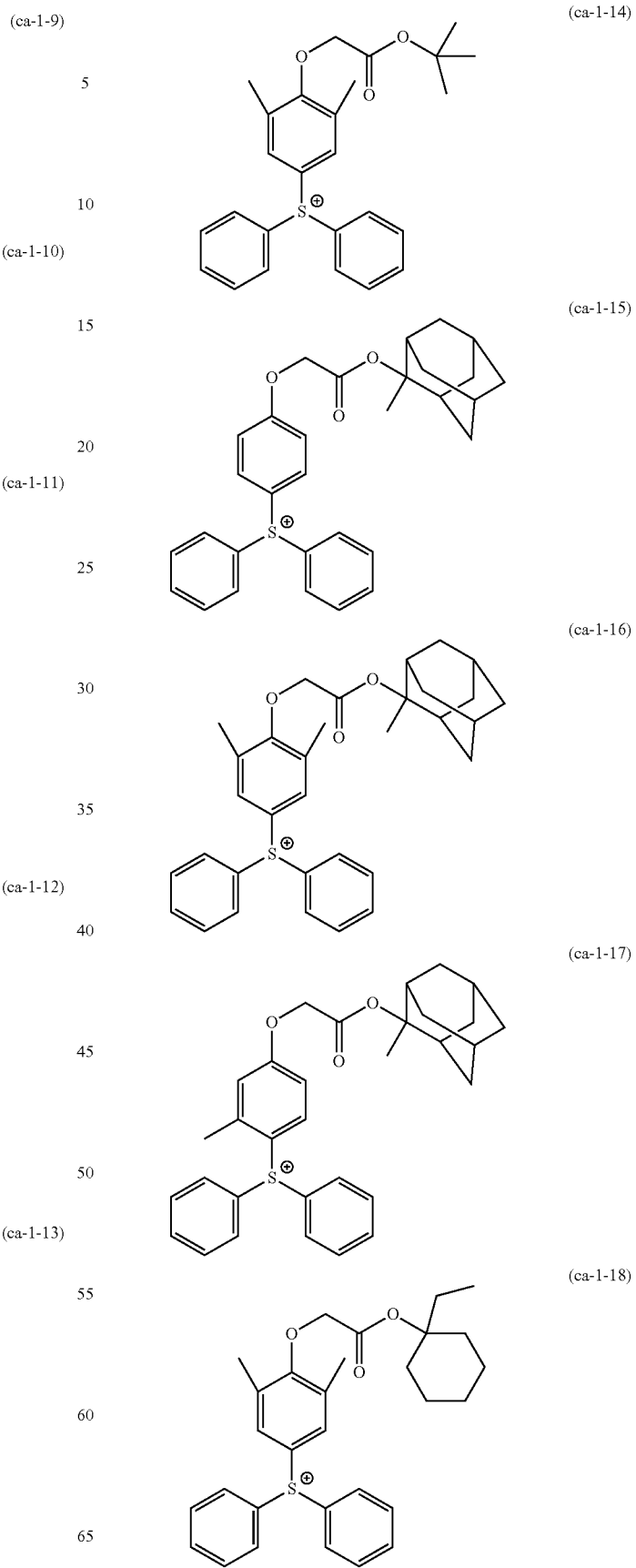

(ca-1-19)
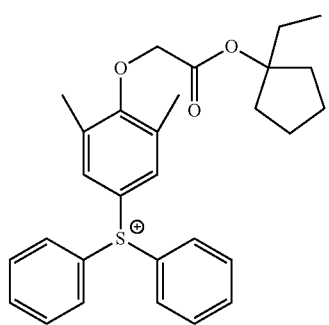
(ca-1-20)
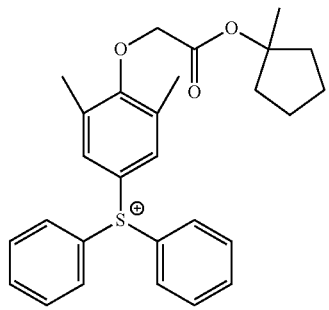
(ca-1-21)
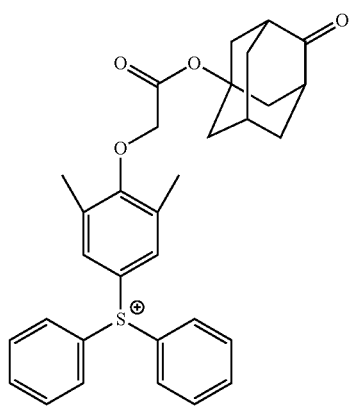
(ca-1-22)
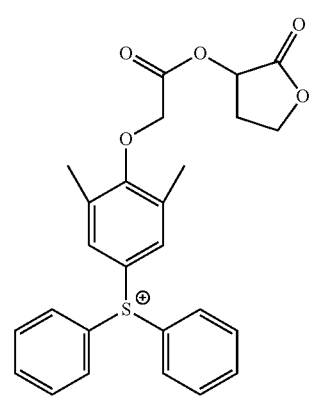
(ca-1-23)
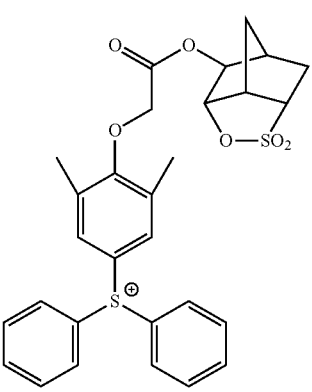
(ca-1-24)
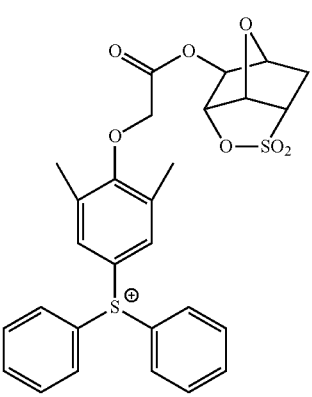
(ca-1-25)
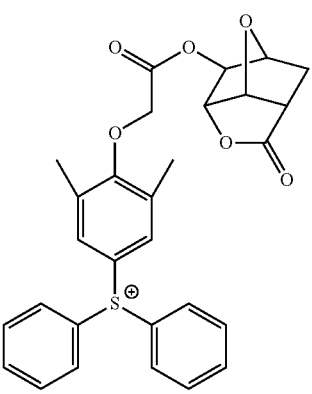
(ca-1-26)
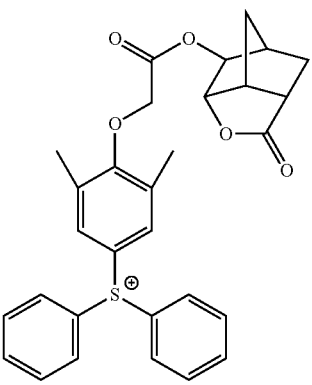

(ca-1-27) 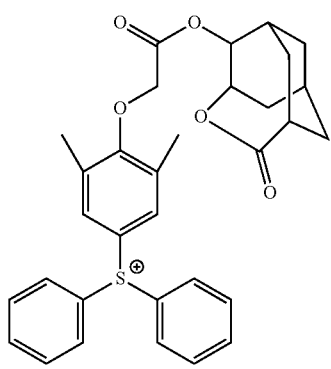
(ca-1-28) 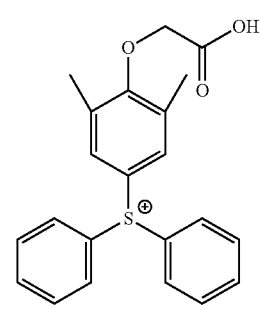
(ca-1-29) 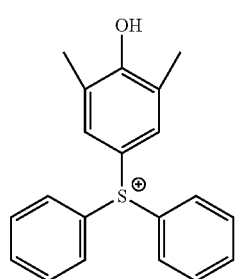
(ca-1-30) 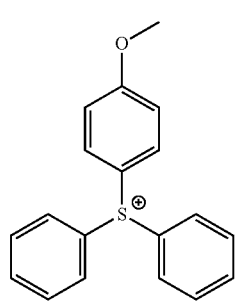
(ca-1-31) 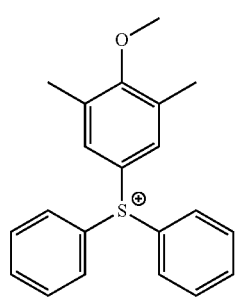
(ca-1-32) 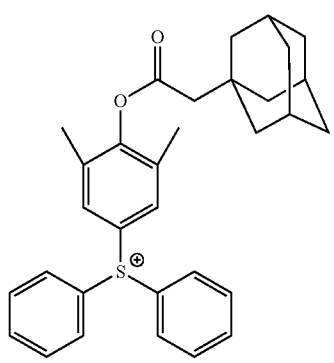
(ca-1-33) 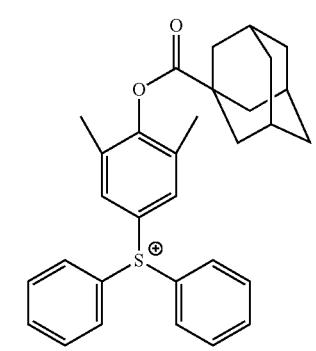
(ca-1-34) 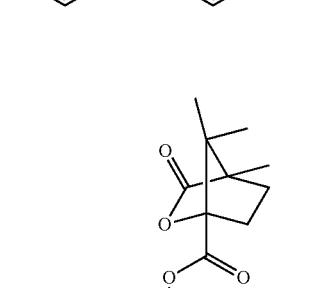
(ca-1-35) 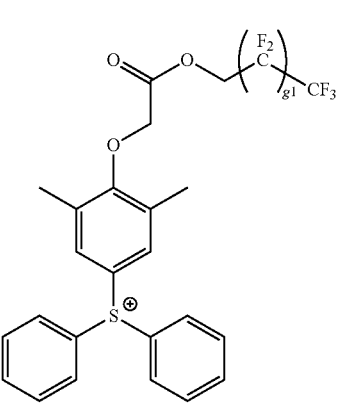

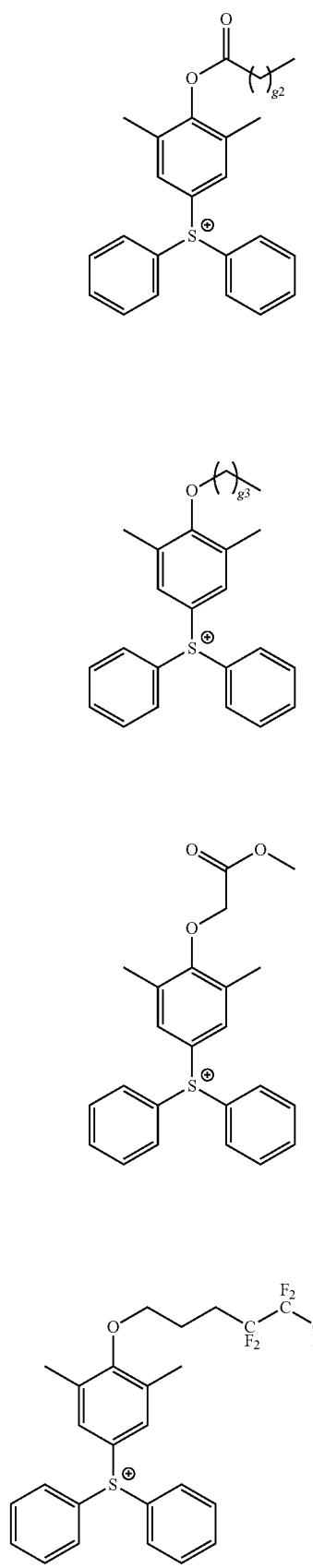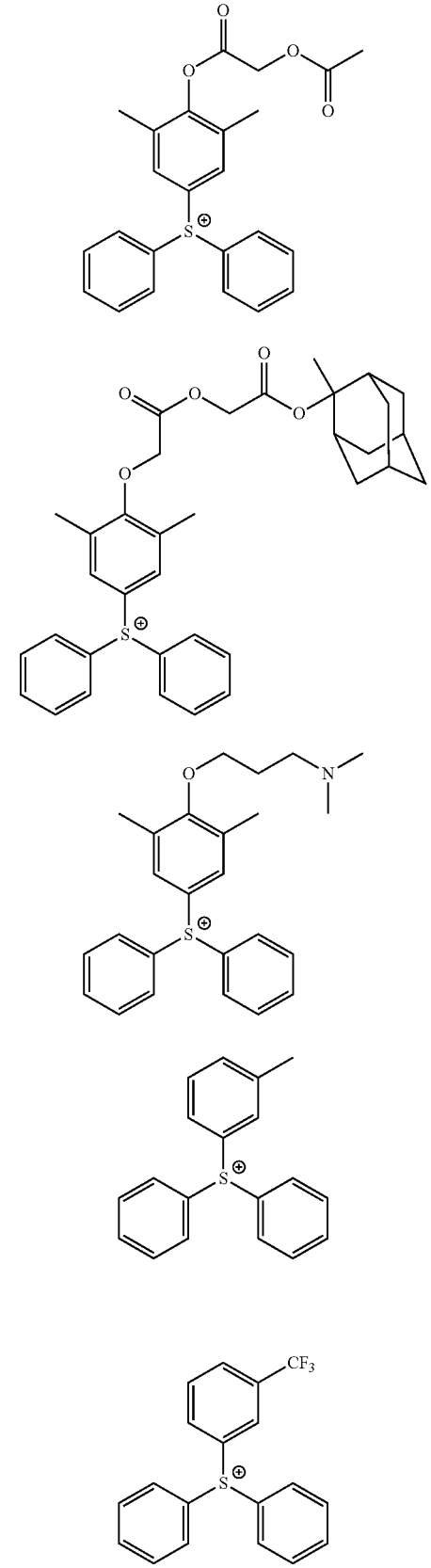

(ca-1-45)
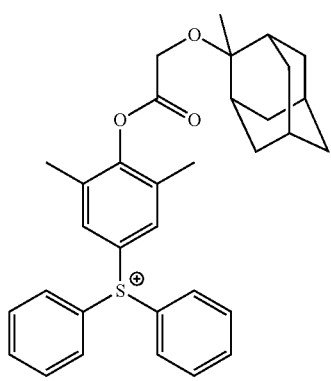
(ca-1-46)
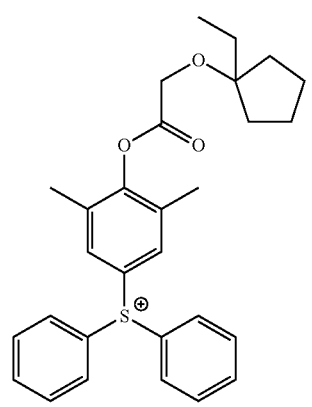
(ca-1-47)
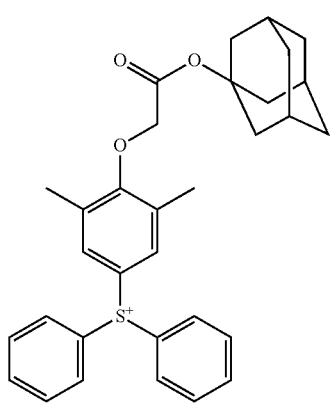
[In the formulae, g1, g2 and g3 represent a repeating number, g1 represents an integer of 1 to 5, g2 represents an integer of 0 to 20, and g3 represents an integer of 0 to 20.]
(ca-1-48)
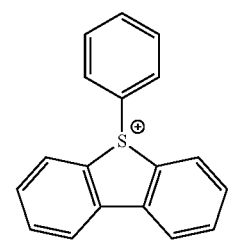
(ca-1-49)
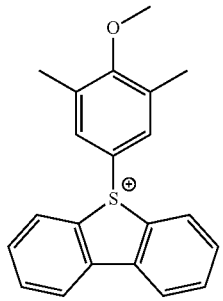
(ca-1-50)
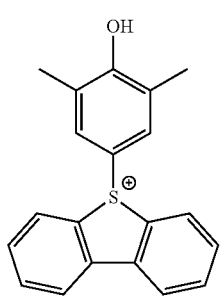
(ca-1-51)
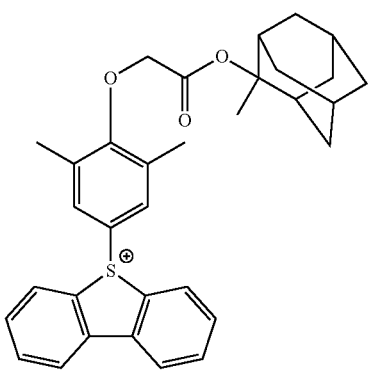
(ca-1-52)
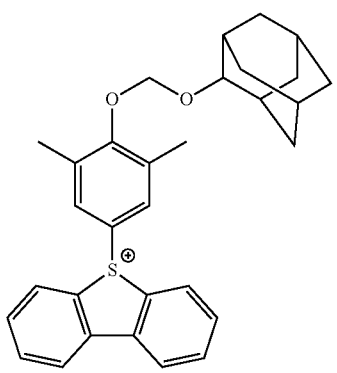
(ca-1-53)
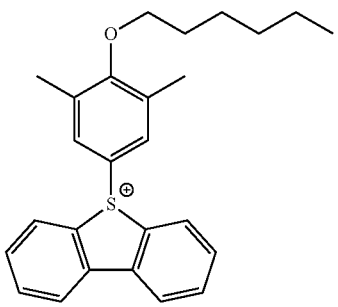

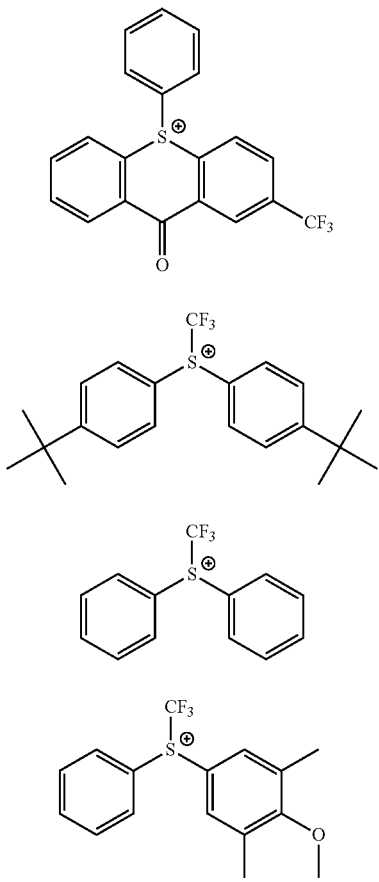
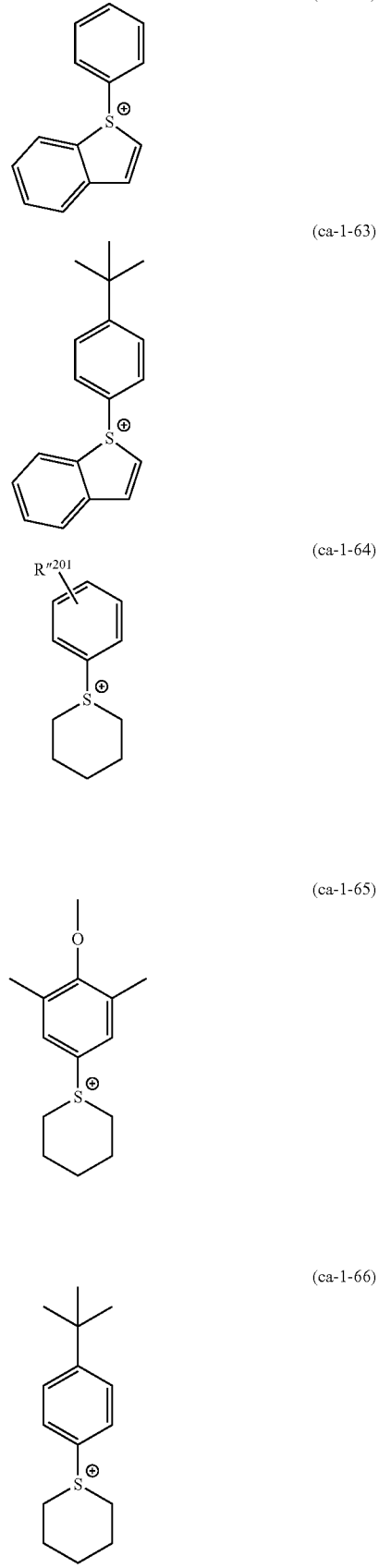

119
-continued

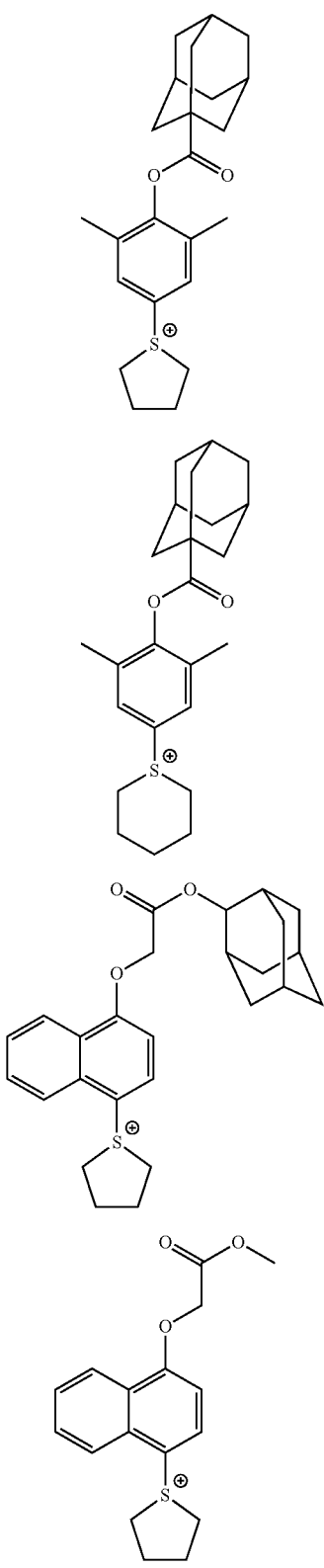

(ca-1-67)

(ca-1-68)

(ca-1-69)

(ca-1-70)

[In the formulae, $R''^{201}$ represents a hydrogen atom or a substituent, and as the substituent, the same groups as those described above for substituting $R^{201}$ to $R^{207}$ and $R^{210}$ to $R^{212}$ are exemplary examples.]

120

Specific examples of suitable cations represented by Formula (ca-2) include a dihphenyliodonium cation and a bis(4-tert-butylphenyl)iodonium cation.

Specific examples of suitable cations represented by Formula (ca-3) include cations represented by Formulae (ca-3-1) to (ca-3-6) shown below.

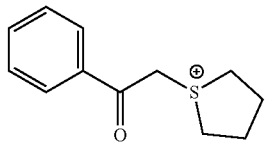
(ca-3-1)

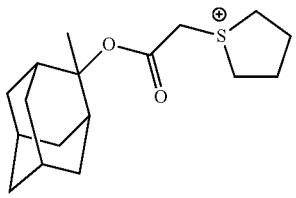
(ca-3-2)

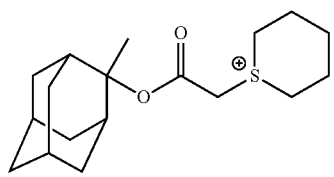
(ca-3-3)

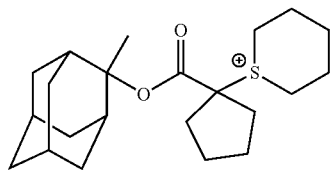
(ca-3-4)

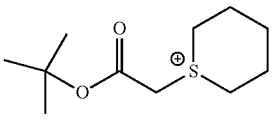
(ca-3-5)

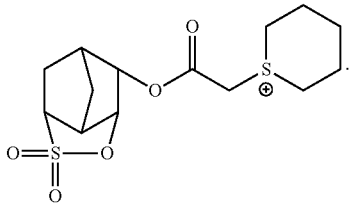
(ca-3-6)

Specific examples of suitable cations represented by Formula (ca-4) include cations represented by Formulae (ca-4-1) and (ca-4-2) shown below.

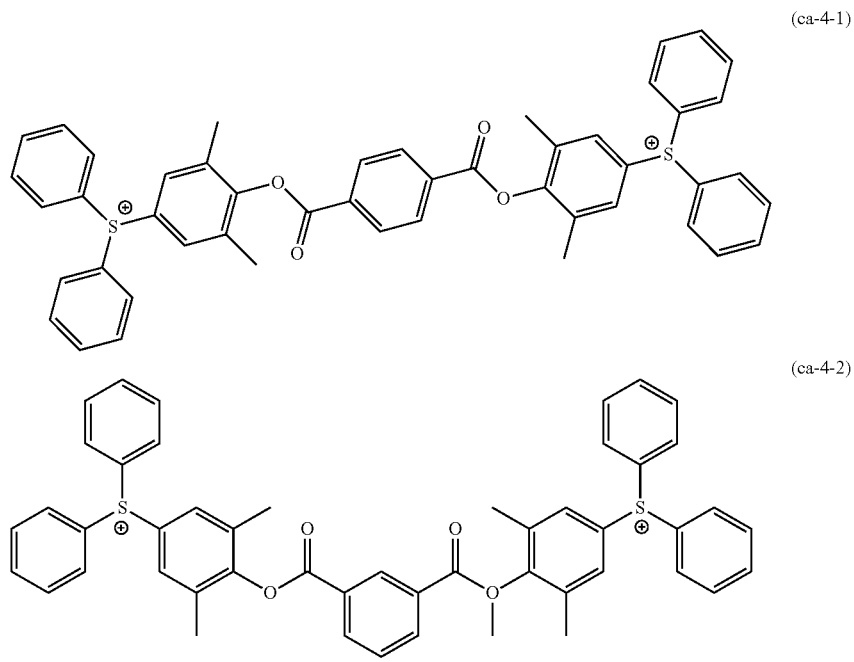

(ca-4-1)

(ca-4-2)

Among the examples, as the cation moiety $[(M^{m+})_{1/m}]$, a cation represented by Formula (ca-1) is preferable.

In the resist composition of the present embodiment, the component (B2) may be used alone, or two or more kinds thereof may be used in combination.

In the resist composition contains the component (B2), the amount of the component (B2) in the resist composition is preferably 50 parts by mass or less, more preferably in a range of 1 to 20 parts by mass, and still more preferably in a range of 1 to 10 parts by mass with respect to 100 parts by mass of the component (A).

In a case where the amount of the component (B2) is set to be in the above-described preferable range, pattern formation can be satisfactorily performed. Further, since a uniform solvent is easily obtained and the storage stability of the resist composition becomes excellent at the time of dissolving each component of the resist composition in an organic solvent, it is preferable that the amount of the component (B2) is in the above-described range.

<Organic Acid (C) Containing at Least One Carboxy Group>

The resist composition of the present embodiment contains an organic acid (C) containing at least one carboxy group (hereinafter, referred to as a "component (C)") in addition to the component (A) and the component (B). By combining the component (B1) and the component (C), the roughness can be reduced, and a resist pattern having an excellent shape with high rectangularity can be formed.

The component (C) may contain at least one carboxy group, and the number of carboxy groups is not particularly limited, but may be, for example, in a range of 1 to 6, preferably in a range of 1 to 3, more preferably 1 or 2, and still more preferably 1.

The component (C) may be aromatic carboxylic acid or aliphatic carboxylic acid.

The aromatic carboxylic acid is a compound which has at least one aromatic ring and in which at least one hydrogen atom in the aromatic ring has been substituted with a carboxy group. Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom and a nitrogen atom. Specific examples of the aromatic hetero ring include a pyridine ring and a thiophene ring.

The number of carbon atoms in the aromatic carboxylic acid is preferably in a range of 7 to 20, more preferably in a range of 7 to 15, and still more preferably in a range of 7 to 10. Specific examples of the aromatic carboxylic acid include monocarboxylic acid such as salicylic acid, benzoic acid, or gallic acid; and dicarboxylic acid such as phthalic acid, isophthalic acid, or terephthalic acid.

The aliphatic carboxylic acid may be saturated aliphatic carboxylic acid or unsaturated aliphatic carboxylic acid, but saturated aliphatic carboxylic acid is preferable.

The number of carbon atoms in the aliphatic carboxylic acid is preferably in a range of 1 to 20, more preferably in a range of 1 to 15, and still more preferably in a range of 1 to 10. Specific examples of the aliphatic carboxylic acid include monocarboxylic acid such as formic acid, acetic acid, or lactic acid; dicarboxylic acid such as malonic acid, malic acid, or succinic acid; and tricarboxylic acid such as citric acid.

Among these, from the viewpoints of reducing the roughness and improving the pattern shape, aromatic carboxylic acid is preferable, and salicylic acid is particularly preferable as the component (C).

In the resist composition of the present embodiment, the component (C) may be used alone, or two or more kinds thereof may be used in combination.

The amount of the component (C) in the resist composition of the present embodiment is preferably in a range of 0.01 to 10 parts by mass with respect to 100 parts by mass of the component (A).

In a case where the amount of the component (C) is set to be in the above-described range, the lithography characteristics such as reduction in roughness and the like are improved, and the rectangularity of the resist pattern is improved. Further, in a case where the amount of the component (C) is less than or equal to the upper limit of the above-described preferable range, the component (C) and other components are likely to be balanced.

<Other Components>

The resist composition of the present embodiment may further contain other components in addition to the component (A), the component (B), and the component (C). As other components, a component (D), a component (E), a component (F), and a component (S) described below are exemplary examples.

<<Base Component (D)>>

The resist composition of the present embodiment may further contain a base component (the component (D)) trapping (in other words, controlling diffusion of an acid) the acid generated upon exposure in addition to the component (A), the component (B), and the component (C). The component (D) acts as a quencher (an acid diffusion control agent) which traps the acid generated in the resist composition upon exposure.

The component (D) may be a photodecomposable base (D1) (hereinafter, referred to as "component (D1)") which is decomposed upon exposure and then loses the acid diffusion controllability or a nitrogen-containing organic compound (D2) (hereinafter, referred to as "component (D2)") which does not correspond to the component (D1).

In Regard to Component (D1)

In a case where a resist composition containing the component (D1) is obtained, the contrast between exposed portions and unexposed portions of the resist film can be further improved at the time of formation of a resist pattern.

The component (D1) is not particularly limited as long as decomposition is made upon exposure so that the acid diffusion controllability is lost, and one or more compounds selected from the group consisting of a compound represented by Formula (d1-1) (hereinafter, referred to as a "component (d1-1)"), a compound represented by Formula (d1-2) (hereinafter, referred to as "component (d1-2)"), and a compound represented by Formula (d1-3) (hereinafter, referred to as "component (d1-3)") are preferable.

At exposed portions of the resist film, the components (d1-1) to (d1-3) are decomposed and then lose the acid diffusion controllability (basicity), and therefore the components (d1-1) to (d1-3) cannot act as a quencher, whereas at unexposed portions of the resist film, the components (d1-1) to (d1-3) acts as a quencher.

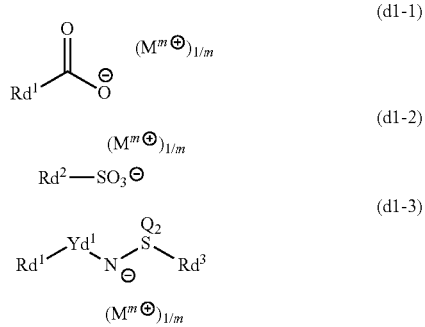

[In the formula, $Rd^1$ to $Rd^4$ represents a cyclic group which may have a substituent, a chain-like alkyl group which may have a substituent, or a chain-like alkenyl group which may have a substituent. Here, the carbon atom adjacent to the S atom as $Rd^2$ in Formula (d1-2) has no fluorine atom bonded thereto. $Yd^1$ represents a single bond or a divalent linking group. m represents an integer of 1 or greater, and $M^{m+}$'s each independently represent an m-valent organic cation.]

{Component (d1-1)}

Anion Moiety

In Formula (d1-1), $Rd^1$ represents a cyclic group which may have a substituent, a chain-like alkyl group which may have a substituent or a chain-like alkenyl group which may have a substituent, and examples thereof are the same as those described above as $R'^{201}$.

Among these, as the group as $Rd^1$, an aromatic hydrocarbon group which may have a substituent, an aliphatic cyclic group which may have a substituent and a chain-like alkyl group which may have a substituent are preferable. Examples of the substituent for these groups include a hydroxyl group, an oxo group, an alkyl group, an aryl group, a fluorine atom, a fluorinated alkyl group, a lactone-containing cyclic group represented by any of Formulae (a2-r-1) to (a2-r-7), an ether bond, an ester bond, and a combination thereof. In a case where an ether bond or an ester bond is included as the substituent, the substituent may be bonded via an alkylene group, and a linking group represented by any of Formulae (y-a1-1) to (y-a1-5) is preferable as the substituent.

Suitable examples of the aromatic hydrocarbon group include a phenyl group, a naphthyl group, and a polycyclic structure (a polycyclic structure formed of a bicyclooctane skeleton and a ring structure other than the bicyclooctane skeleton) containing a bicyclooctane skeleton.

Examples of the aliphatic cyclic group include groups in which one or more hydrogen atoms have been removed from a polycycloalkane such as adamantane, norbornane, isobornane, tricyclodecane or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl group, or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group.

In a case where the chain-like alkyl group is a fluorinated alkyl group having a fluorine atom or a fluorinated alkyl group as a substituent, the fluorinated alkyl group has preferably 1 to 11 carbon atoms, more preferably 1 to 8 carbon atoms, and still more preferably 1 to 4 carbon atoms. The fluorinated alkyl group may contain an atom other than a fluorine atom. Examples of the atom other than a fluorine atom include an oxygen atom, a sulfur atom, and a nitrogen atom.

As $Rd^1$, a fluorinated alkyl group in which some or all hydrogen atoms constituting a linear alkyl group have been substituted with fluorine atom(s) is preferable, and a fluorinated alkyl group in which all of the hydrogen atoms constituting a linear alkyl group have been substituted with fluorine atoms (a linear perfluoroalkyl group) is particularly preferable.

Specific examples of preferable anion moieties for the component (d1-1) are shown below.

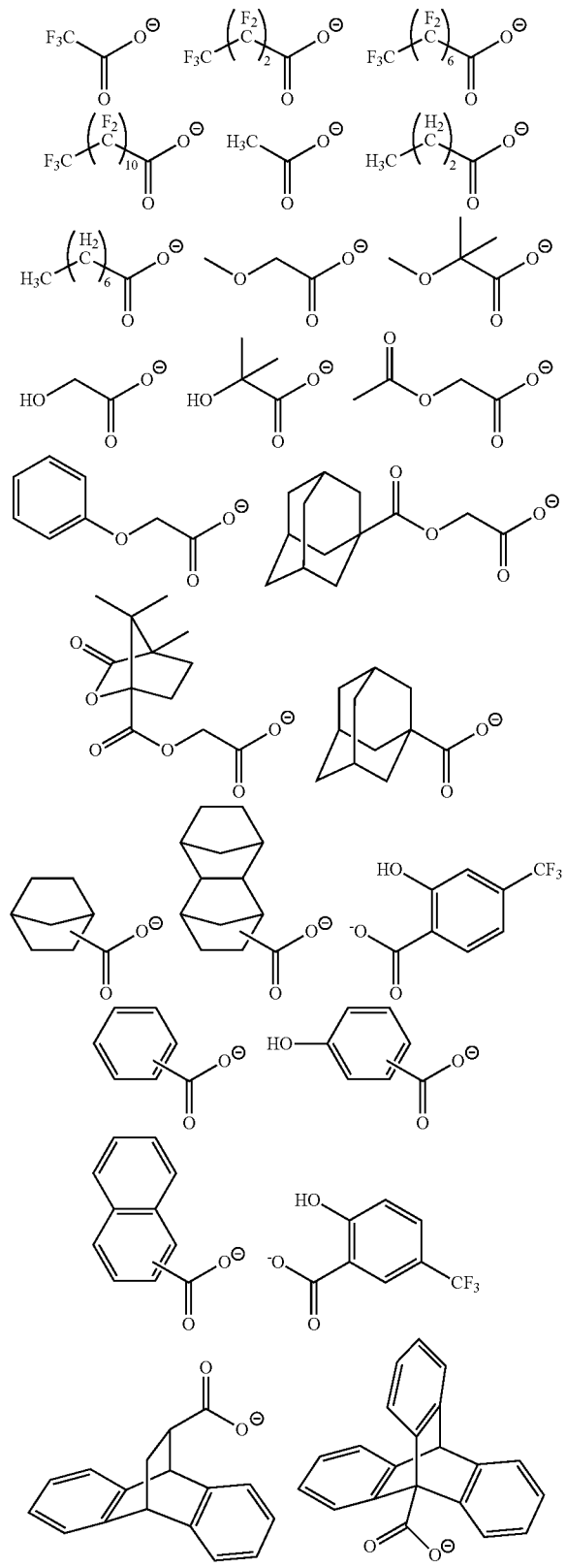

Cation Moiety

In Formula (d1-1), $M^{m+}$ represents an m-valent organic cation.

As the organic cation as $M^{m+}$, the same cations as those represented by Formulae (ca-1) to (ca-4) are suitable exemplary examples, a cation represented by the above-described Formulae (ca-1) is more preferable, and cations represented Formulae (ca-1-1) to (ca-1-70) are still more preferable.

The component (d1-1) may be used alone, or two or more kinds thereof may be used in combination.

{Component (d1-2)}

Anion Moiety

In Formula (d1-2), $Rd^2$ represents a cyclic group which may have a substituent, a chain-like alkyl group which may have a substituent, or a chain-like alkenyl group which may have a substituent, and the same groups as those described above as $R'^{201}$ are exemplary examples.

Here, the carbon atom adjacent to the S atom in $Rd^2$ has no fluorine atom bonded thereto (the carbon atom adjacent to the sulfur atom in $Rd^2$ is not substituted with a fluorine atom). As a result, the anion of the component (d1-2) becomes an appropriately weak acid anion, thereby improving the quenching ability of the component (D).

As $Rd^2$, a chain-like alkyl group which may have a substituent or an aliphatic cyclic group which may have a substituent is preferable. The chain-like alkyl group has preferably 1 to 10 carbon atoms and more preferably 3 to 10 carbon atoms. As the aliphatic cyclic group, a group in which one or more hydrogen atoms have been removed from adamantane, norbornane, isobornane, tricyclodecane, or tetracyclododecane (which may have a substituent) and a group in which one or more hydrogen atoms have been removed from camphor are more preferable.

The hydrocarbon group as $Rd^2$ may have a substituent. As the substituent, the same groups as the substituents which may be included in the hydrocarbon group (such as an aromatic hydrocarbon group, an aliphatic cyclic group, or a chain-like alkyl group) as $Rd^1$ in Formula (d1-1) are exemplary examples.

Specific examples of preferable anion moieties for the component (d1-2) are shown below.

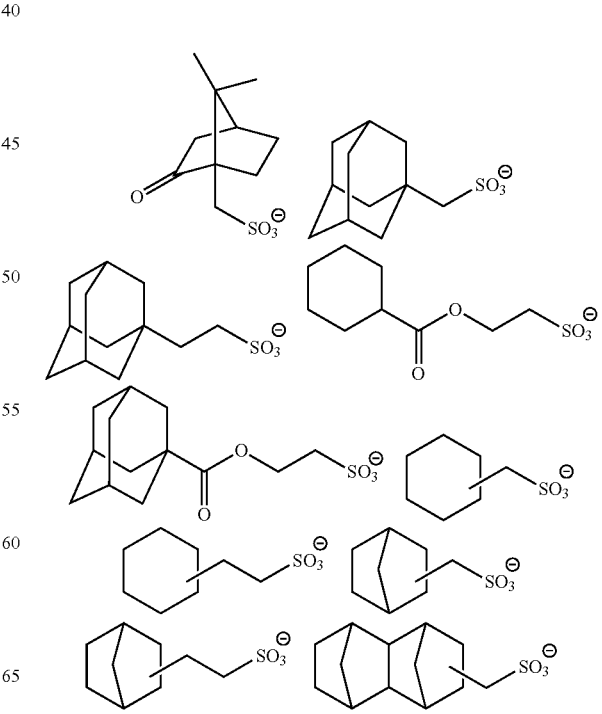

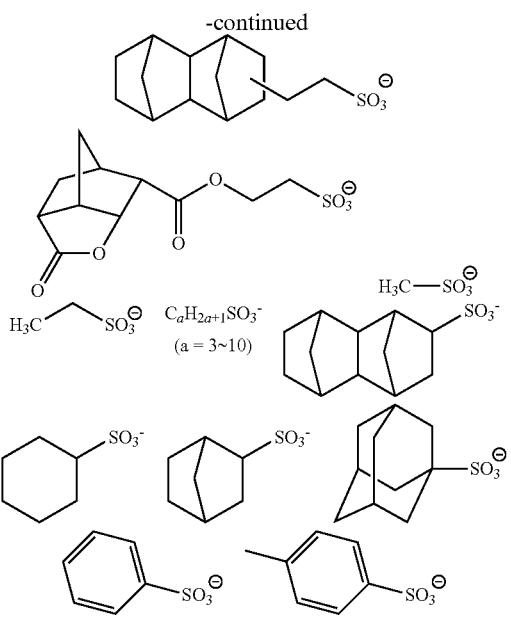

Cation Moiety

In Formula (d1-2), $M^{m+}$ represents an m-valent organic cation, and has the same definition as that for $M^{m+}$ in the above-described Formula (d1-1).

The component (d1-2) may be used alone or in combination of two or more kinds thereof.

{Component (d1-3)}

Anion Moiety

In Formula (d1-3), $Rd^3$ represents a cyclic group which may have a substituent, a chain-like alkyl group which may have a substituent, or a chain-like alkenyl group which may have a substituent, and the same groups as those described above as $R'^{201}$ are exemplary examples, and a cyclic group containing a fluorine atom, a chain-like alkyl group, or a chain-like alkenyl group is preferable. Among these, a fluorinated alkyl group is preferable, and the same fluorinated alkyl groups as those described above as $Rd^1$ are more preferable.

In Formula (d1-3), $Rd^4$ represents a cyclic group which may have a substituent, a chain-like alkyl group which may have a substituent, or a chain-like alkenyl group which may have a substituent, and the same groups as those described above as $R'^{201}$ are exemplary examples.

Among these, an alkyl group which may have substituent, an alkoxy group which may have substituent, an alkenyl group which may have substituent, or a cyclic group which may have substituent is preferable.

The alkyl group as $Rd^4$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. Some hydrogen atoms in the alkyl group as $Rd^4$ may be substituted with a hydroxyl group, a cyano group, or the like.

The alkoxy group as $Rd^4$ is preferably an alkoxy group having 1 to 5 carbon atoms, and specific examples thereof include a methoxy group, an ethoxy group, an n-propoxy group, an iso-propoxy group, an n-butoxy group, and a tert-butoxy group. Among these, a methoxy group and an ethoxy group are preferable.

Examples of the alkenyl group as $Rd^4$ are the same groups as those provided as exemplary examples of the alkenyl group represented by $R'^{201}$, and a vinyl group, a propenyl group (an allyl group), a 1-methylpropenyl group, and a 2-methylpropenyl group are preferable. These groups may have an alkyl group having 1 to 5 carbon atoms or a halogenated alkyl group having 1 to 5 carbon atoms as a substituent.

As the cyclic group as $Rd^4$, the same groups as those described above as $R'^{201}$ are exemplary examples. Among these, as the cyclic group, an alicyclic group in which one or more hydrogen atoms have been removed from a cycloalkane such as cyclopentane, cyclohexane, adamantane, norbornane, isobornane, tricyclodecane or tetracyclododecane or an aromatic group such as a phenyl group or a naphthyl group is preferable. In a case where $Rd^4$ represents an alicyclic group, the resist composition can be satisfactorily dissolved in an organic solvent, thereby improving the lithography characteristics. Further, in a case where $Rd^4$ represents an aromatic group, the resist composition exhibits an excellent photoabsorption efficiency in a lithography process using EUV or the like as the exposure light source, thereby resulting in the improvement of the sensitivity and the lithography characteristics.

In Formula (d1-3), $Yd^1$ represents a single bond or a divalent linking group. The divalent linking group as $Yd^1$ is not particularly limited, and examples thereof include a divalent hydrocarbon group (an aliphatic hydrocarbon group or an aromatic hydrocarbon group) which may have a substituent and a divalent linking group containing a hetero atom. The divalent linking groups are the same as described above as the divalent hydrocarbon group which may have a substituent and the divalent linking group containing a hetero atom explained above as the divalent linking group as $Ya^{21}$ in Formula (a2-1).

As $Yd^1$, a carbonyl group, an ester bond, an amide bond, an alkylene group, or a combination of these is preferable. As the alkylene group, a linear or branched alkylene group is more preferable, and a methylene group or an ethylene group is still more preferable.

Specific examples of preferable anion moieties for the component (d1-3) are shown below.

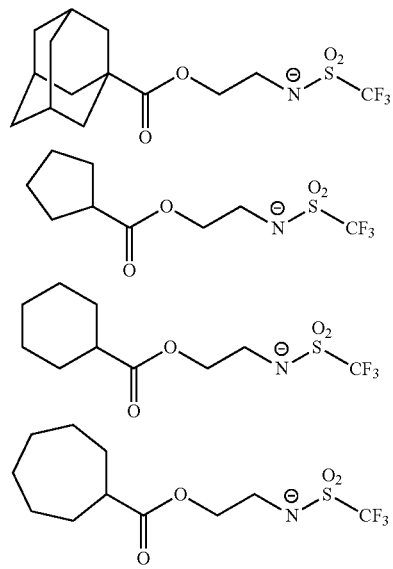

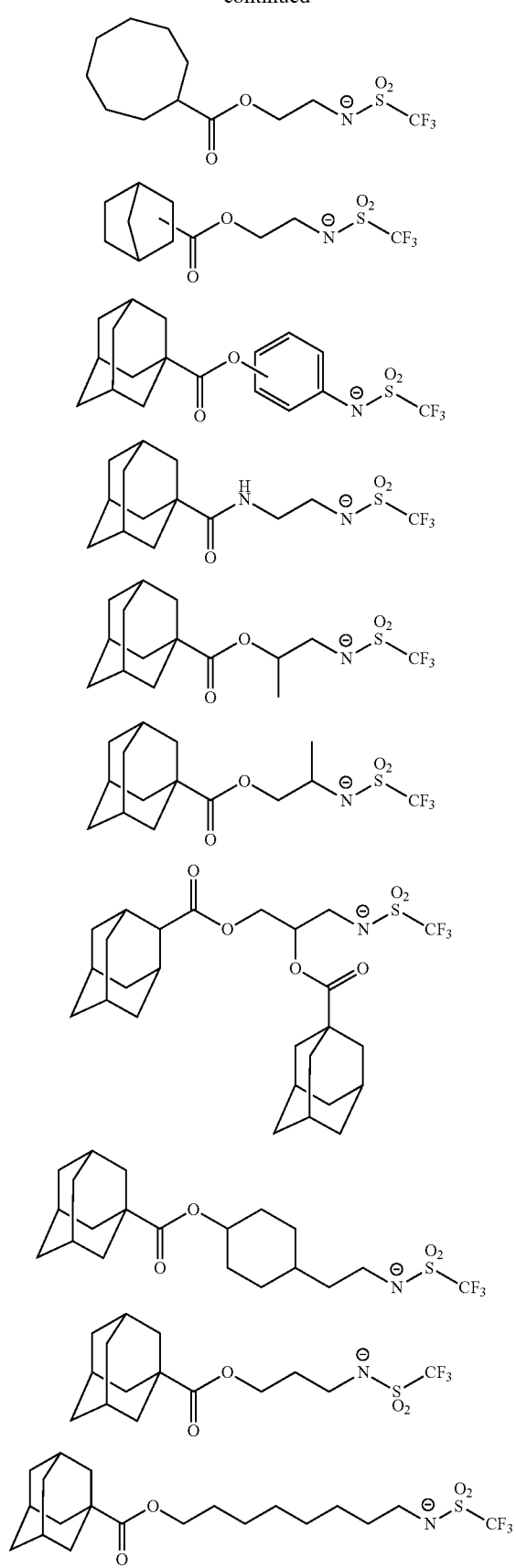
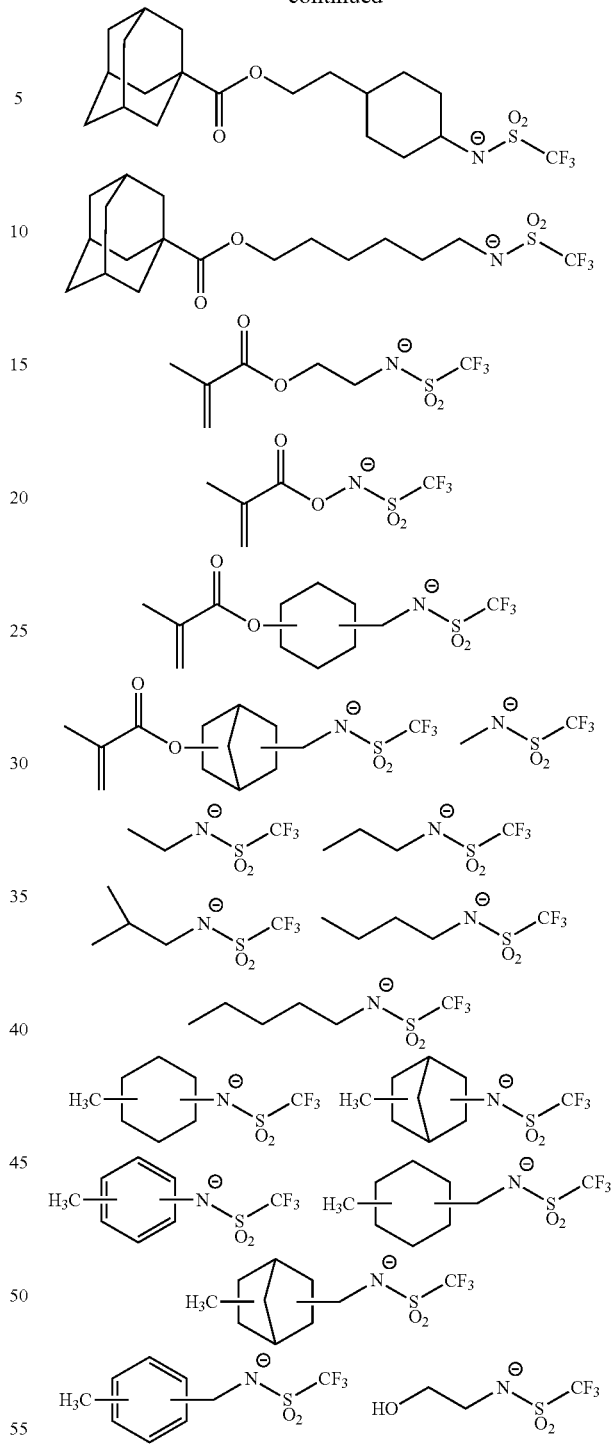
Cation Moiety
In Formula (d1-3), $M^{m+}$ represents an m-valent organic cation, and has the same definition as that for $M^{m+}$ in the above-described Formula (d1-1).
The component (d1-3) may be used alone or in combination of two or more kinds thereof.
As the component (D1), only one of the above-described components (d1-1) to (d1-3) or a combination of two or more kinds thereof may be used.

In a case where the resist composition contains the component (D1), the amount of the component (D1) in the resist composition is preferably in a range of 0.5 to 20 parts by mass, more preferably in a range of 1 to 15 parts by mass, and still more preferably in a range of 2 to 10 parts by mass with respect to 100 parts by mass of the component (A).

In a case where the amount of the component (D1) is greater than or equal to the preferable lower limit, excellent lithography characteristics and an excellent resist pattern shape can be more reliably obtained. Further, in a case where the content thereof is less than or equal to the upper limit thereof, the sensitivity can be maintained satisfactorily, and through-put also becomes excellent.

Method of Producing Component (D1):

The production methods of the components (d1-1) and (d1-2) are not particularly limited, and the components (d1-1) and (d1-2) can be produced by known methods.

Further, the method of producing the component (d1-3) is not particularly limited, and the component (d1-3) can be produced in the same manner as disclosed in United States Patent Application, Publication No. 2012-0149916.

Component (D2)

The resist composition may contain, as the component (D), a nitrogen-containing organic compound component (hereinafter, referred to as a "component (D2)") that does not correspond to the component (D1).

The component (D2) is not particularly limited as long as it functions as an acid diffusion agent and does not correspond to the component (D1), and any known component may be used. Among these, an aliphatic amine is preferable, and a secondary aliphatic amine or a tertiary aliphatic amine is particularly preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group having 12 or less carbon atoms (alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris {2-(2-methoxyethoxy)ethyl}amine, tris {2-(2-methoxyethoxymethoxy)ethyl}amine, tris {2-(1-methoxyethoxy)ethyl}amine, tris {2-(1-ethoxyethoxy)ethyl}amine, tris {2-(1-ethoxypropoxy)ethyl}amine, tris [2-{2-(2-hydroxyethoxy)ethoxy}ethyl]amine and triethanolamine triacetate, and triethanolamine triacetate is preferable.

Further, as the component (D2), an aromatic amine may be used.

Examples of aromatic amines include 4-dimethylaminopyridine, pyrrole, indole, pyrazole, imidazole and derivatives thereof as well as tribenzylamine, 2,6-diisopropylaniline and N-tert-butoxycarbonylpyrrolidine.

The component (D2) may be used alone, or two or more kinds thereof may be used in combination.

In a case where the resist composition contains the component (D2), the amount of the component (D2) in the resist composition is typically in a range of 0.01 to 5 parts by mass with respect to 100 parts by mass of the component (A). In a case where the content thereof is in the above-described range, the shape of the resist pattern and the post exposure temporal stability are improved.

<<At Least One Compound (E) Selected from Group Consisting of Phosphorus Oxo Acid and Derivatives Thereof>>

For the purpose of preventing any deterioration in sensitivity, and improving the resist pattern shape and the post exposure temporal stability, the resist composition of the present embodiment may contain at least one compound (E) (hereinafter referred to as the component (E)) selected from the group consisting of a phosphorus oxo acid and a derivative thereof.

Examples of phosphorus oxo acids include phosphoric acid, phosphonic acid, and phosphinic acid. Among these, phosphonic acid is particularly preferable.

Examples of phosphorus oxo acid derivatives include esters in which a hydrogen atom in the above-described oxo acids is substituted with a hydrocarbon group.

Examples of the hydrocarbon group include an alkyl group having 1 to 5 carbon atoms and an aryl group having 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate, and dibenzyl phosphonate.

Examples of phosphinic acid derivatives include phosphinic acid esters and phenylphosphinic acid.

In the resist composition of the present embodiment, the component (E) may be used alone, or two or more kinds thereof may be used in combination.

In a case where the resist composition contains the component (E), the amount of the component (E) is typically in a range of 0.01 to 5 parts by mass, with respect to 100 parts by mass of the component (A).

<<Fluorine Additive Component (F)>>

In the present embodiment, the resist composition may further contain a fluorine additive component (hereinafter, referred to as a "component (F)") for improving the lithography characteristics.

As the component (F), a fluorine-containing polymer compound described in Japanese Unexamined Patent Application, First Publication No. 2010-002870, Japanese Unexamined Patent Application, First Publication No. 2010-

032994, Japanese Unexamined Patent Application, First Publication No. 2010-277043, Japanese Unexamined Patent Application, First Publication No. 2011-13569, and Japanese Unexamined Patent Application, First Publication No. 2011-128226 is an exemplary example.

Specific examples of the component (F) include polymers having a constitutional unit (f1) represented by Formula (f1-1) shown below. As the polymer, a polymer (homopolymer) formed of only a constitutional unit (f1) represented by Formula (f1-1) shown below; a copolymer of the constitutional unit (f1) and the constitutional unit (a1); and a copolymer of the constitutional unit (f1), a constitutional unit derived from acrylic acid or methacrylic acid and the above-described constitutional unit (a1) are preferable. Here, preferred examples of the constitutional unit (a1) to be copolymerized with the constitutional unit (f1) include a constitutional unit derived from 1-ethyl-1-cyclooctyl (meth) acrylate and a constitutional unit derived from 1-methyl-1-adamantyl (meth)acrylate.

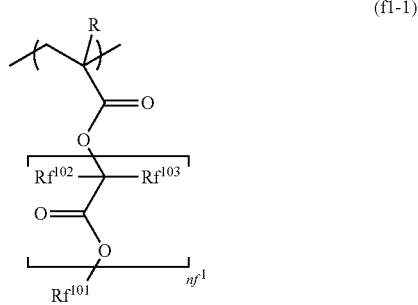

(f1-1)

[In the formula, R is the same as above, $Rf^{102}$ and $Rf^{103}$ each independently represent a hydrogen atom, a halogen atom, an alkyl group having 1 to 5 carbon atoms, or a halogenated alkyl group having 1 to 5 carbon atoms, and $Rf^{102}$ and $Rf^{103}$ may be the same as or different from each other. $nf^1$ represents an integer of 1 to 5, and $Rf^{101}$ represents an organic group containing a fluorine atom.]

In Formula (f1-1), R bonded to the carbon atom at the α-position has the same definition as described above. As R, a hydrogen atom or a methyl group is preferable.

In Formula (f1-1), examples of the halogen atom as $Rf^{102}$ and $Rf^{103}$ include a fluorine atom, a chlorine atom, a bromine atom, and an iodine atom, and a fluorine atom is particularly preferable. Examples of the alkyl group having 1 to 5 carbon atoms as $Rf^{102}$ and $Rf^{103}$ include those described above as the alkyl group having 1 to 5 carbon atoms as R, and a methyl group or an ethyl group is preferable. Specific examples of the halogenated alkyl group having 1 to 5 carbon atoms as $Rf^{102}$ and $Rf^{103}$ include groups in which some or all hydrogen atoms of the above-described alkyl groups of 1 to 5 carbon atoms have been substituted with halogen atoms.

Examples of the halogen atom include a fluorine atom, a chlorine atom, a bromine atom and an iodine atom, and a fluorine atom is particularly preferable. Among these examples, as $Rf^{102}$ and $Rf^{103}$, a hydrogen atom, a fluorine atom, or an alkyl group having 1 to 5 carbon atoms is preferable, and a hydrogen atom, a fluorine atom, a methyl group, or an ethyl group is more preferable.

In Formula (f1-1), $nf^1$ represents an integer of 1 to 5, preferably an integer of 1 to 3, and more preferably an integer of 1 or 2.

In Formula (f1-1), $Rf^{101}$ represents an organic group containing a fluorine atom, and is preferably a hydrocarbon group containing a fluorine atom.

The hydrocarbon group containing a fluorine atom may be linear, branched, or cyclic, and has preferably 1 to 20 carbon atoms, more preferably 1 to 15 carbon atoms, and particularly preferably 1 to 10 carbon atoms.

Further, in the hydrocarbon group having a fluorine atom, it is preferable that 25% or greater of the hydrogen atoms in the hydrocarbon group are fluorinated, more preferable that 50% or greater thereof are fluorinated, and particularly preferable that 60% or greater thereof are fluorinated from the viewpoint of effectively improving the lithography characteristics.

Among these, as $Rf^{101}$, a fluorinated hydrocarbon group having 1 to 6 carbon atoms is preferable, and a trifluoromethyl group, $-CH_2-CF_3$, $-CH_2-CF_2-CF_3$, $-CH(CF_3)_2$, $-CH_2-CH_2-CF_3$, and $-CH_2-CH_2-CF_2-CF_2-CF_2-CF_3$ are most preferable.

The mass average molecular weight (Mw) (in terms of polystyrene determined by gel permeation chromatography) of the component (F) is preferably in a range of 1,000 to 50,000, more preferably in a range of 5,000 to 40,000, and most preferably in a range of 10,000 to 30,000. In a case where the mass average molecular weight thereof is less than or equal to the upper limit of the above-described range, the resist composition exhibits a satisfactory solubility in a solvent for a resist enough to be used as a resist. Further, in a case where the mass average molecular weight thereof is greater than or equal to the lower limit of the above-described range, this is effective for improving the lithography characteristics.

Further, the dispersity (Mw/Mn) of the component (F) is preferably in a range of 1.0 to 5.0, more preferably in a range of 1.0 to 3.0, and most preferably in a range of 1.0 to 2.5.

In the resist composition of the present embodiment, the component (F) may be used alone, or two or more kinds thereof may be used in combination.

In a case where the resist composition contains the component (F), the amount of the component (F) is typically in a range of 0.5 to 10 parts by mass, with respect to 100 parts by mass of the component (A).

<<Organic Solvent Component (S)>>

The resist composition of the present embodiment may be produced by dissolving the resist materials in an organic solvent (hereinafter, referred to as a "component (S)").

The component (S) may be any organic solvent which can dissolve the respective components to be used to obtain a uniform solution, and optional organic solvent can be appropriately selected from those which have been conventionally known as solvents for a chemically amplified resist composition and then used.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (such as monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

In the resist composition of the present embodiment, the component (S) may be used alone, or two or more kinds thereof may be used in the form of a mixed solvent. Among these, PGMEA, PGME, γ-butyrolactone, EL and cyclohexanone are preferable.

Further, a mixed solvent obtained by mixing PGMEA with a polar solvent is preferable as the component (S).

The mixing ratio (mass ratio) of the mixed solvent can be appropriately determined, taking into consideration the compatibility of the PGMEA with the polar solvent, but is preferably in the range of 1:9 to 9:1 and more preferably in a range of 2:8 to 8:2.

More specifically, in a case where EL or cyclohexanone is mixed as the polar solvent, the PGMEA:EL or cyclohexanone mass ratio is preferably in a range of 1:9 to 9:1 and more preferably in a range of 2:8 to 8:2. Alternatively, in a case where PGME is mixed as the polar solvent, the PGMEA:PGME mass ratio is preferably in a range of 1:9 to 9:1, more preferably in a range of 2:8 to 8:2, and still more preferably in a range of 3:7 to 7:3. Furthermore, a mixed solvent of PGMEA, PGME and cyclohexanone is also preferable.

Further, as the component (S), a mixed solvent of at least one of PGMEA and EL with γ-butyrolactone is also preferable. The mass ratio (former:latter) of such a mixed solvent is preferably in a range of 70:30 to 95:5.

The amount of the component (S) is not particularly limited, and is appropriately adjusted to a concentration which enables coating of a coating solution to a substrate. In general, the component (S) is used in an amount such that the solid content of the resist composition becomes in the range of 0.1% to 20% by mass and preferably in a range of 0.2% to 15% by mass.

Impurities or the like may be removed from the resist composition of the present embodiment using a polyimide porous film, a polyamideimide porous film, or the like after the resist material is dissolved in the component (S). For example, the resist composition may be filtered using a filter formed of a polyimide porous film, a filter formed of a polyamideimide porous film, or a filter formed of a polyimide porous film and a polyamideimide porous film. Examples of the polyimide porous film and the polyamideimide porous film include those described in Japanese Unexamined Patent Application, First Publication No. 2016-155121.

As desired, other miscible additives can also be added to the resist composition of the present invention. The resist composition may contain miscible additives such as additive resins, dissolution inhibitors, plasticizers, stabilizers, colorants, halation prevention agents, and dyes for improving the performance of the resist film, as appropriate.

In the resist composition of the present embodiment described above, the acid generator component (B1) having a specific structure and the organic acid (C) containing at least one carboxy group are used in combination. Since such a configuration is employed, improvement for the lithography characteristics such as reduction in roughness and the like is attempted and a resist pattern having an excellent shape can be formed at the time of miniaturizing the resist pattern.

The resist composition of the present embodiment is particularly useful for a resist composition which contains a polymer compound having a hydroxystyrene unit as the component (A1).

(Method of Forming a Resist Pattern)

The method of forming a resist pattern according to a second embodiment of the present invention includes a step (i) of forming a resist film on a support using the resist composition according to the above-described embodiment; a step (ii) of exposing the resist film; and a step (iii) of developing the exposed resist film to form a resist pattern. According to the embodiment of the method of forming a resist pattern, a method for forming a resist pattern by performing processes as described below is an exemplary example.

Step (i):

First, a resist composition of the according to the embodiment is applied to a support using a spinner or the like, and a baking treatment (post applied bake (PAB)) is conducted at a temperature of 80 to 150° C. for 40 to 120 seconds and preferably 60 to 90 seconds, to form a resist film.

Step (ii):

Following selective exposure of the thus formed resist film, by exposure through a mask having a predetermined pattern formed thereon (mask pattern) using an exposure apparatus such as an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Step (iii):

Next, the resist film is subjected to a developing treatment. The developing treatment is conducted using an alkali developing solution in a case of an alkali developing process, and a developing solution containing an organic solvent (organic developing solution) in a case of a solvent developing process.

After the developing treatment, it is preferable to conduct a rinse treatment. The rinse treatment is preferably conducted using pure water in a case of an alkali developing process, and a rinse solution containing an organic solvent in a case of a solvent developing process.

In a case of a solvent developing process, after the developing treatment or the rinsing, the developing solution or the rinse liquid remaining on the pattern can be removed by a treatment using a supercritical fluid.

After the developing treatment or the rinse treatment, drying is conducted. As desired, bake treatment (post bake) can be conducted following the developing.

In this manner, a resist pattern can be formed.

The support is not specifically limited and a conventionally known support can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the support, any one of the above-described supports provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. That is, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as an ArF excimer laser, a KrF excimer laser, an $F_2$ excimer laser, extreme ultraviolet rays (EUV), vacuum ultraviolet rays (VUV), electron beams (EB), X-rays, and soft X-rays. The resist composition is useful for a KrF excimer laser, an ArF excimer laser, EB, and EUV, more useful for an ArF excimer laser, EB, and EUV, and particularly useful for EB and EUV. In other words, the method of forming a resist pattern of the present embodiment is a method particularly useful in a case where the step of exposing the resist film includes an operation of exposing the resist film to EUV (extreme ultraviolet) or EB (electron beam).

The exposure of the resist film can be a general exposure (dry exposure) conducted in air or an inert gas such as nitrogen, or immersion exposure (Liquid Immersion Lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-described requirements.

Examples of this immersion medium which exhibits a refractive index that is larger than the refractive index of air but smaller than the refractive index of the resist film include water, fluorine-based inert liquids, silicon-based solvents, and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, and the boiling point is preferably in a range of 70° to 180° C. and more preferably in a range of 80° to 160° C. A fluorine-based inert liquid having a boiling point in the above-described range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly preferable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point of 102° C.), and an example of a suitable perfluoroalkylamine compound is perfluorotributylamine (boiling point of 174° C.).

As the immersion medium, water is preferable in terms of cost, safety, environment and versatility.

As an example of the alkali developing solution used in an alkali developing process, a 0.1 to 10 mass % aqueous solution of tetramethylammonium hydroxide (TMAH) is an exemplary example.

As the organic solvent contained in the organic developing solution used in a solvent developing process, any of the conventional organic solvents can be used which are capable of dissolving the component (A) (prior to exposure). Specific examples of the organic solvent include polar solvents such as ketone solvents, ester solvents, alcohol solvents, nitrile solvents, amide solvents and ether solvents, and hydrocarbon solvents. A ketone solvent is an organic solvent containing C—C(=O)—C in the structure thereof. An ester solvent is an organic solvent containing C—C(=O)—O—C in the structure thereof. An alcohol solvent is an organic solvent containing an alcoholic hydroxyl group in the structure thereof. An "alcoholic hydroxyl group" indicates a hydroxyl group bonded to a carbon atom of an aliphatic hydrocarbon group. A nitrile solvent is an organic solvent containing a nitrile group in the structure thereof. An amide solvent is an organic solvent containing an amide group in the structure thereof. An ether solvent is an organic solvent containing C—O—C in the structure thereof.

Some organic solvents have a plurality of the functional groups which characterizes the above-described solvents in the structure thereof. In such a case, the organic solvent can be classified as any type of the solvent having the characteristic functional group. For example, diethylene glycol monomethylether can be classified as an alcohol solvent or an ether solvent.

A hydrocarbon solvent consists of a hydrocarbon which may be halogenated, and does not have any substituent other than a halogen atom. Examples of the halogen atom include a fluorine atom, a chlorine atom, a bromine atom and an iodine atom, and a fluorine atom is preferable.

As the organic solvent contained in the organic developing solution, among these, a polar solvent is preferable, and ketone solvents, ester solvents, and nitrile solvents are preferable.

Examples of ketone solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone). Among these examples, as a ketone solvent, methyl amyl ketone (2-heptanone) is preferable.

Examples of ester solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these examples, as an ester solvent, butyl acetate is preferable.

Examples of nitrile solvents include acetonitrile, propionitrile, valeronitrile, butyronitrile and the like.

As desired, the organic developing solution may have a conventional additive blended. Examples of the additive include surfactants. The surfactant is not particularly limited, and for example, an ionic or non-ionic fluorine and/or silicon surfactant can be used.

As the surfactant, a non-ionic surfactant is preferable, and a non-ionic fluorine surfactant or a non-ionic silicon surfactant is more preferable.

In a case where a surfactant is added, the amount thereof based on the total amount of the organic developing solution is generally 0.001% to 5% by mass, preferably 0.005% to 2% by mass, and more preferably 0.01% to 0.5% by mass.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

As the organic solvent contained in the rinse liquid used in the rinse treatment after the developing treatment in a case of a solvent developing process, any of the above-described organic solvents contained in the organic developing solution can be used which hardly dissolves the resist pattern. In general, at least one solvent selected from the group consisting of hydrocarbon solvents, ketone solvents, ester solvents, alcohol solvents, amide solvents and ether solvents is used. Among these, at least one solvent selected from the group consisting of hydrocarbon solvents, ketone solvents, ester solvents, alcohol solvents and amide solvents is preferable, more preferably at least one solvent selected from the group consisting of alcohol solvents and ester solvents, and an alcohol solvent is particularly preferable.

The alcohol solvent used for the rinse liquid is preferably a monohydric alcohol of 6 to 8 carbon atoms, and the monohydric alcohol may be linear, branched or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Among these, 1-hexanol, 2-heptanol and 2-hexanol are preferable, and 1-hexanol and 2-hexanol are more preferable.

As the organic solvent, one kind of solvent may be used alone, or two or more kinds of solvents may be used in combination. Further, an organic solvent other than the above-described examples or water may be mixed together. However, in consideration of the development characteristics, the amount of water in the rinse liquid, based on the total amount of the rinse liquid is preferably 30% by mass or less, more preferably 10% by mass or less, still more preferably 5% by mass or less, and most preferably 3% by mass or less.

As desired, the rinse solution may have a conventional additive blended. Examples of the additive include surfactants. As the surfactant, the same surfactants as those described above are exemplary examples, a non-ionic surfactant is preferable, and a non-ionic fluorine surfactant or a non-ionic silicon surfactant is more preferable.

In a case where a surfactant is added, the amount thereof based on the total amount of the rinse liquid is generally 0.001% to 5% by mass, preferably 0.005% to 2% by mass, and more preferably 0.01% to 0.5% by mass.

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

According to the method of forming a resist pattern of the present embodiment described above, since the resist composition according to the first embodiment has been used, during the formation of a resist pattern, the lithography characteristics such as reduction in roughness are improved, and a resist pattern having an excellent shape with high rectangularity can be formed.

The method of forming a resist pattern of the present embodiment is a method suitable for lithography using electron beams or EUV.

EXAMPLES

Hereinafter, the present invention will be described in detail based on the following examples, but the present invention is not limited to these examples.

In the present examples, a compound represented by Chemical Formula (1) is noted as a "compound (1)", and the same applies to compounds represented by other chemical formulae.

<Preparation of Resist Composition>

Examples 1 and Comparative Example 1 to 9

Respective components listed in Table 1 were mixed and dissolved to prepare each resist composition (solid content concentration of 0.9% by mass) in each example.

TABLE 1

| | Component (B) | | | | | |
|---|---|---|---|---|---|---|
| | Component (A) | Component (B1) | Component (B2) | Component (D) | Component (C) | Component (S) |
| Example 1 | (A)-1 [100] | (B1)-1 [17.8] | | (D)-1 [4.0] | (C)-1 [5.0] | (S)-1 [14000] |
| Comparative Example 1 | (A)-1 [100] | | (B2)-1 [17.8] | (D)-1 [4.0] | (C)-1 [5.0] | (S)-1 [14000] |
| Comparative Example 2 | (A)-1 [100] | | (B2)-2 [17.8] | (D)-1 [4.0] | (C)-1 [5.0] | (S)-1 [14000] |
| Comparative Example 3 | (A)-1 [100] | | (B2)-3 [17.8] | (D)-1 [4.0] | (C)-1 [5.0] | (S)-1 [14000] |
| Comparative Example 4 | (A)-1 [100] | | (B2)-4 [17.8] | (D)-1 [4.0] | (C)-1 [5.0] | (S)-1 [14000] |
| Comparative Example 5 | (A)-1 [100] | | (B2)-1 [17.8] | (D)-1 [4.0] | — | (S)-1 [14000] |
| Comparative Example 6 | (A)-1 [100] | | (B2)-2 [17.8] | (D)-1 [4.0] | — | (S)-1 [14000] |
| Comparative Example 7 | (A)-1 [100] | | (B2)-3 [17.8] | (D)-1 [4.0] | — | (S)-1 [14000] |
| Comparative Example 8 | (A)-1 [100] | | (B2)-4 [17.8] | (D)-1 [4.0] | — | (S)-1 [14000] |
| Comparative Example 9 | (A)-1 [100] | (B1)-1 [17.8] | | (D)-1 [4.0] | — | (S)-1 [14000] |

In Table 1, each abbreviation has the following meaning. The numerical values in the parentheses are blending amounts (parts by mass).

(A)-1: polymer compound represented by Chemical Formula (A-1) The weight average molecular weight (Mw) in terms of standard polystyrene acquired by performing GPC measurement was 7,000, and the molecular weight dispersity (Mw/Mn) was 1.70. The copolymerization compositional ratio (the ratio (molar ratio) of each constitutional unit in the structural formula) (1/m) acquired by $^{13}$C-NMR was 50/50.

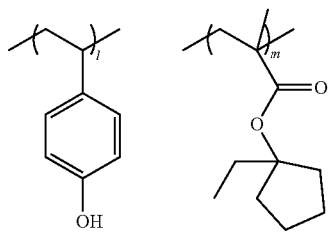

(A-1)

(B1)-1: acid generator formed of compound represented by Chemical Formula (B1-1)

(B2)-1: acid generator formed of compound represented by Chemical Formula (B2-1)

(B2)-2: acid generator formed of compound represented by Chemical Formula (B2-2)

(B2)-3: acid generator formed of compound represented by Chemical Formula (B2-3)

(B2)-4: acid generator formed of compound represented by Chemical Formula (B2-4)

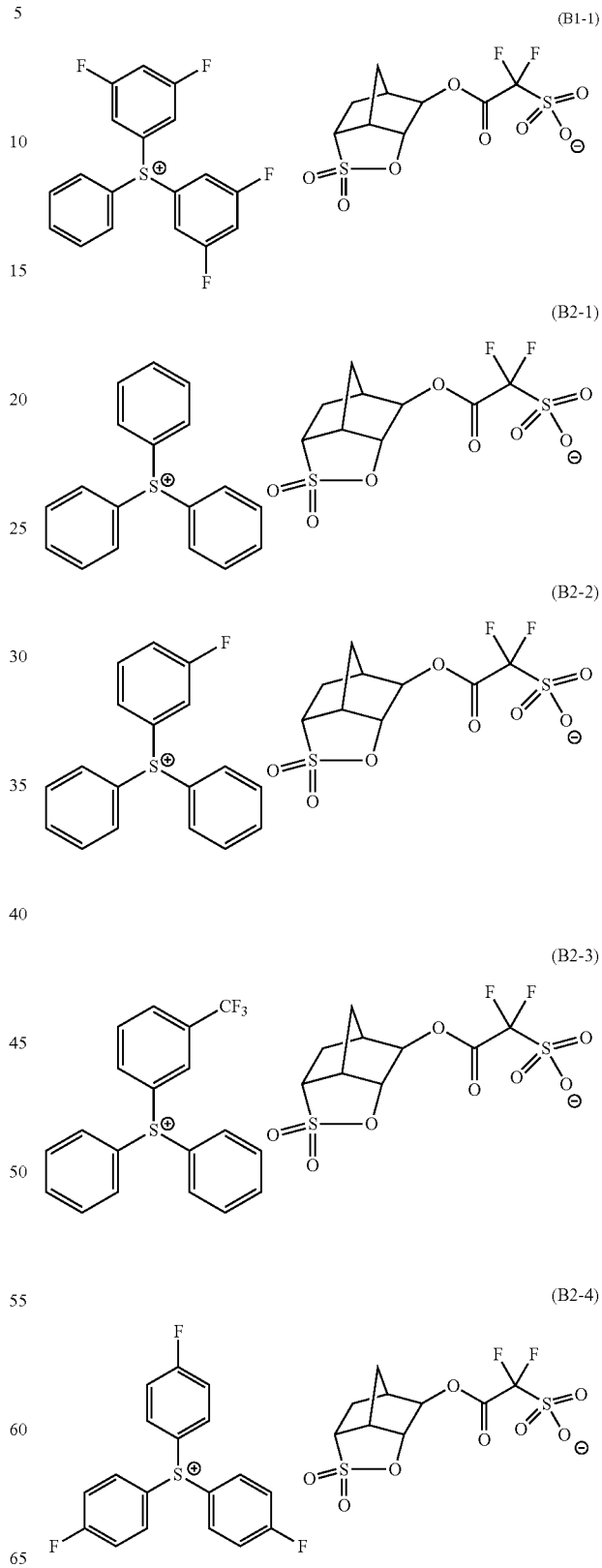

(D)-1: acid diffusion control agent formed of compound represented by Chemical Formula (D-1)

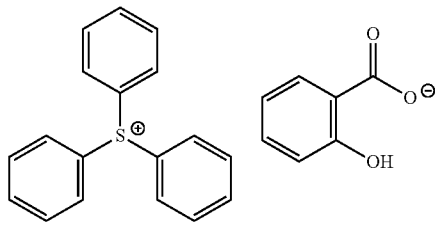

(D-1)

(C)-1: additive formed of compound represented by Chemical Formula (C-1)

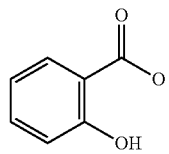

(C-1)

(S)-1: mixed solution of propylene glycol monomethyl ether and propylene glycol monomethyl ether acetate at mass ratio of 50/50

<Formation of Resist Pattern>

Step (i):

An 8-inch silicon substrate to which a hexamethyldisilazane (HMDS) treatment had been applied was coated with the resist composition of each example using a spinner, and a prebake (PAB) treatment was performed thereon on a hot plate at a temperature of 110° C. for 60 seconds so that the composition was dried to form a resist film having a film thickness of 30 nm.

Step (ii):

Next, drawing (exposing) was performed on the resist film at an accelerating voltage of 100 kV such that the target size was set to a line width of 50 nm and 1:1 line and space pattern (hereinafter, referred to as an "LS pattern") using an electron beam lithography device JEOL JBX-9300FS (manufactured by JEOL Ltd.).

Step (iii):

Subsequently, alkali development was performed at 23° C. for 60 seconds using a 2.38 mass % tetramethylammonium hydroxide (TMAH) aqueous solution "NMD-3" (trade name, manufactured by TOKYO OHKA KOGYO CO., LTD.).

Next, water rinsing was performed for 15 seconds using pure water, and a post-exposure bake (PEB) treatment was performed at 90° C. for 60 seconds.

As the result, a 1:1 LS pattern with a line width of 50 nm was formed.

[Evaluation of Optimum Exposure Amount (Eop)]

An optimum exposure amount Eop ($\mu C/cm^2$) at which the LS pattern with a target size was formed according to the method of forming a resist pattern was acquired. The results are listed in the columns of "Eop ($\mu C/cm^2$)" in Table 2.

[Evaluation of Line Width Roughness (LWR)]

Using the LS pattern formed in the section of the "formation of resist pattern", the 3σ which is the scale that indicates the LWR was acquired. The results are listed in the columns of "LWR (nm)" in Table 2.

The "3σ" indicates three times (3σ) (unit: nm) the standard deviation (σ) acquired based on the result of measurement performed by measuring 400 sites of line positions in the longitudinal direction of the line using a scanning electron microscope (trade name: S-9380, manufactured by Hitachi High-Technologies Corporation, accelerating voltage of 800 V).

In a case where the value of the 3σ decreases, this indicates that the roughness of a line side wall is small and an LS pattern with a uniform width is obtained.

[Evaluation of LS Pattern Shape]

The cross-sectional shape of the LS pattern was evaluated by observing the cross-sectional shape of the LS pattern formed in <Formation of resist pattern> described above using a length measurement SEM (scanning electron microscope, acceleration voltage of 800 V, trade name: SU-8000, manufactured by Hitachi High-Technologies Corporation).

The evaluation of the cross-sectional shape of the LS pattern was performed based on the following evaluation criteria. The results are listed in the columns of "shape" in Table 2.

Evaluation Criteria of LS Pattern Shape
A: The pattern was a rectangular shape
B: The pattern was a T-top shape

TABLE 2

| | PAB (° C.) | PEB (° C.) | Eop ($\mu C/cm^2$) | LWR (nm) | Shape |
|---|---|---|---|---|---|
| Example 1 | 110 | 90 | 110 | 4.6 | A |
| Comparative Example 1 | 110 | 90 | 105 | 5.2 | B |
| Comparative Example 2 | 110 | 90 | 100 | 5.2 | B |
| Comparative Example 3 | 110 | 90 | 105 | 5.0 | B |
| Comparative Example 4 | 110 | 90 | 100 | 5.0 | B |
| Comparative Example 5 | 110 | 90 | 105 | 5.3 | B |
| Comparative Example 6 | 110 | 90 | 100 | 5.2 | B |
| Comparative Example 7 | 110 | 90 | 100 | 5.5 | B |
| Comparative Example 8 | 110 | 90 | 105 | 5.3 | B |
| Comparative Example 9 | 110 | 90 | 105 | 5.2 | B |

Based on the results listed in Table 2, it was found that the roughness was further reduced and the pattern shape was excellent in a case of the resist composition of Example 1 compared to each resist composition of Comparative Example 1 to 9.

As shown in the results described above, it was found that the lithography characteristics were improved, and a resist pattern having an excellent shape with high rectangularity was formed in the case of the resist composition of Example 1 to which the present invention had been applied.

What is claimed is:

1. A resist composition which generates an acid upon exposure and whose solubility in a developing solution is changed due to an action of the acid, the resist composition comprising:
   a base material component (A) whose solubility in a developing solution is changed due to an action of an acid;
   an acid generator component (B) which generates an acid upon exposure; and
   an organic acid which contains at least one carboxy group, wherein the solid content concentration of the resist composition is in the range of 0.1% to 0.9% by mass,
wherein the amount of the organic acid is in a range of 0.01 to 10 parts by mass with respect to 100 parts by mass of the base material component (A),
wherein the acid generator component (B) contains a compound (B1) represented by Formula (b1),

(b1)

wherein $R^{2011}$ to $R^{2031}$ each independently represent an aryl group which may have a substituent, an alkyl group which may have a substituent, or an alkenyl group which may have a substituent, two or more of $R^{2011}$ to $R^{2031}$ may be mutually bonded to form a ring together with a sulfur atom in the formula, where $R^{2011}$ to $R^{2031}$ have a total of four or more substituents containing fluorine atoms, $X^{n-}$ represent an n-valent anion, and n represents an integer of 1 or greater,
wherein the base material component (A) contains a resin component (A1) having a constitutional unit (a1) containing an acid decomposable group represented by Formula (a1-r2-1) and a constitutional unit (a10) represented by Formula (a10-1):

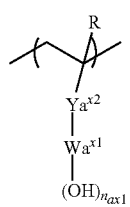

(a1-r2-1)

wherein $Ra'^{10}$ represents a linear alkyl group having 1 to 10 carbon atoms and $Ra'^{11}$ represents a group that forms an aliphatic cyclic group together with the carbon atom to which $Ra'^{11}$ is bonded,

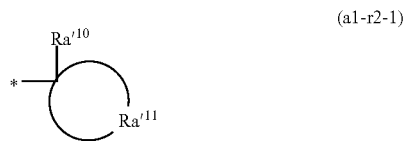

(a10-1)

wherein R represents a hydrogen atom, an alkyl group having 1 to 5 carbon atoms, or a halogenated alkyl group having 1 to 5 carbon atoms; $Ya^{x1}$ represents a single bond or a divalent linking group; $Wa^{x1}$ represents a $(n_{ax1}+1)$-valent aromatic hydrocarbon group; and $n_{ax1}$ represents an integer of 1 to 3.

2. The resist composition according to claim 1, wherein the compound (B1) is a compound represented by Formula (b1-1),

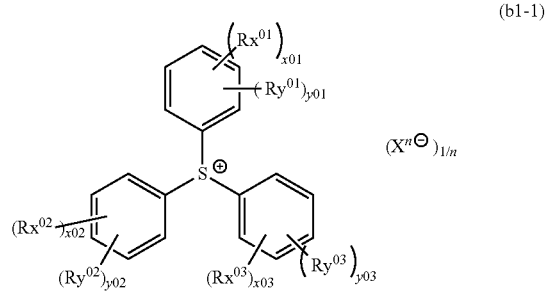

(b1-1)

wherein $Rx^{01}$ to $Rx^{03}$ each independently represent a substituent having a fluorine atom, $Ry^{01}$ to $Ry^{03}$ each independently represent a substituent which does not have a fluorine atom, x01 to x03 each independently represent an integer of 0 to 5, x01+x02+x03 is greater than or equal to 4, y01 to y03 each independently represent an integer of 0 to 5, x01+y01 is less than or equal to 5, x02+y02 is less than or equal to 5, and x03+y03 is less than or equal to 5, $X^{n-}$ represents an n-valent anion, and n represents an integer of 1 or greater.

3. The resist composition according to claim 1, wherein the organic acid is an aromatic carboxylic acid.

4. The resist composition according to claim 3, wherein the aromatic carboxylic acid is salicylic acid.

5. A method of forming a resist pattern, comprising:
forming a resist film on a support using the resist composition according to claim 1;
exposing the resist film; and
developing the exposed resist film to form a resist pattern.

* * * * *